United States Patent
Ji et al.

(10) Patent No.: US 9,054,805 B2
(45) Date of Patent: Jun. 9, 2015

(54) OPTICAL MEMORY SYSTEM INCLUDING AN OPTICALLY CONNECTED MEMORY MODULE AND COMPUTING SYSTEM INCLUDING THE SAME

(71) Applicants: Ho-Chul Ji, Yongin-si (KR); Kyoung-Ho Ha, Seoul (KR)

(72) Inventors: Ho-Chul Ji, Yongin-si (KR); Kyoung-Ho Ha, Seoul (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 280 days.

(21) Appl. No.: 13/682,756

(22) Filed: Nov. 21, 2012

(65) Prior Publication Data

US 2013/0308942 A1 Nov. 21, 2013

(30) Foreign Application Priority Data

May 21, 2012 (KR) .................. 10-2012-0053556

(51) Int. Cl.

| | |
|---|---|
| G11C 5/06 | (2006.01) |
| H04B 10/25 | (2013.01) |
| H04B 10/80 | (2013.01) |
| G11C 7/10 | (2006.01) |
| G11C 13/04 | (2006.01) |
| G11C 7/00 | (2006.01) |

(52) U.S. Cl.
CPC .............. H04B 10/25 (2013.01); H04B 10/801 (2013.01); *G11C 13/04* (2013.01); *G11C 7/005* (2013.01); *G11C 7/1054* (2013.01); *G11C 7/1081* (2013.01)

(58) Field of Classification Search
CPC ...... H04B 10/25; H04B 10/801; G11C 13/04; G11C 7/005

USPC .................................................. 365/63, 64, 51
See application file for complete search history.

(56) References Cited

U.S. PATENT DOCUMENTS

| | | | | |
|---|---|---|---|---|
| 6,793,408 | B2 * | 9/2004 | Levy et al. ....................... | 385/88 |
| 7,099,585 | B2 * | 8/2006 | Cordes et al. ................... | 398/60 |
| 7,139,481 | B2 * | 11/2006 | Furuyama ....................... | 398/43 |
| 7,200,024 | B2 * | 4/2007 | Taylor ............................. | 365/64 |
| 7,254,331 | B2 * | 8/2007 | Murphy .......................... | 398/70 |
| 7,280,381 | B2 * | 10/2007 | Lee et al. ........................ | 365/63 |
| 7,343,059 | B2 * | 3/2008 | Beausoleil et al. ............ | 385/14 |
| 7,366,368 | B2 * | 4/2008 | Morrow et al. ................. | 385/15 |
| 7,366,423 | B2 * | 4/2008 | Levy et al. ..................... | 398/164 |
| 7,411,807 | B2 * | 8/2008 | Taylor ............................. | 365/64 |
| 7,417,884 | B2 * | 8/2008 | Ogawa et al. .................. | 365/64 |

(Continued)

FOREIGN PATENT DOCUMENTS

| | | |
|---|---|---|
| JP | 2005-064950 | 3/2005 |
| JP | 2010-128940 | 6/2010 |
| KR | 10-2011-0053535 A | 5/2011 |

*Primary Examiner* — Viet Q Nguyen
(74) *Attorney, Agent, or Firm* — Muir Patent Law, PLLC

(57) ABSTRACT

An optical memory system according to example embodiments includes a plurality of memory modules, each memory module including a plurality of memory devices; a light source; a light distribution unit connected to the light source through a first optical transmission line; a plurality of second optical transmission lines connected between the light distribution unit and the plurality of memory modules; a plurality of electrical to optical converters, each connected to at least one of the second optical transmission lines; and a plurality of output optical transmission lines connected to the plurality of electrical to optical converters, each output optical transmission line for outputting an electrical to optical converted signal.

33 Claims, 32 Drawing Sheets

(56) References Cited

U.S. PATENT DOCUMENTS

| | | |
|---|---|---|
| 7,613,026 B2 | 11/2009 | Lee et al. |
| 7,925,168 B2 * | 4/2011 | Tan et al. .................... 398/164 |
| 8,023,349 B2 | 9/2011 | Cho et al. |
| 2004/0257890 A1 | 12/2004 | Lee et al. |
| 2007/0189052 A1 | 8/2007 | Ogawa et al. |
| 2009/0304389 A1 * | 12/2009 | Joe et al. .................... 398/115 |
| 2011/0116795 A1 | 5/2011 | Park et al. |
| 2011/0119408 A1 | 5/2011 | Munetoh |

* cited by examiner

OPTICAL MEMORY SYSTEM INCLUDING AN OPTICALLY CONNECTED MEMORY MODULE AND COMPUTING SYSTEM INCLUDING THE SAME

CROSS-REFERENCE TO RELATED APPLICATIONS

This U.S. non-provisional application claims the benefit of priority under 35 U.S.C. §119 to Korean Patent Application No. 10-2012-0053556 filed on May 21, 2012 in the Korean Intellectual Property Office (KIPO), the entire content of which is incorporated by reference herein in its entirety.

BACKGROUND

1. Technical Field

Example embodiments relate to optically connected memory modules. More particularly, example embodiments relate to optical memory systems including the optically connected memory modules and computing systems including the optical memory systems.

2. Description of the Related Art

In a conventional computing system where an electrical signal is transferred between a memory controller and a memory module, signal integrity of the electrical signal may deteriorate due to an impedance mismatch. The signal integrity of the electrical signal may further deteriorate as the transfer speed of the electrical signal increases. The number of memory modules coupled to the memory controller may be limited due to such deterioration of the signal integrity.

To prevent the deterioration of the signal integrity caused by the impedance mismatch, an optically connected memory module (e.g., an optically connected dual inline memory module (OCDIMM)) that transmits and/or receives an optical signal to/from the memory controller has been developed. However, in a computing system including such an optically connected memory module, as the number of optically connected memory modules increases, the number of required light sources may increase, which results in the increase of a cost and power consumption. Accordingly, the number of optically connected memory modules coupled to the memory controller may be limited.

SUMMARY

Some example embodiments provide an optical memory system capable of efficiently increasing a system memory capacity.

Some example embodiments provide a computing system capable of efficiently increasing a system memory capacity.

In one embodiment, an optical memory system is disclosed. The optical memory system includes a plurality of memory modules, each memory module including a plurality of memory devices; a light source; a light distribution unit connected to the light source through a first optical transmission line; a plurality of second optical transmission lines connected between the light distribution unit and the plurality of memory modules; a plurality of electrical to optical converters, each connected to at least one of the second optical transmission lines; and a plurality of output optical transmission lines connected to the plurality of electrical to optical converters, each output optical transmission line for outputting an electrical to optical converted signal.

In another embodiment, an optical memory system includes a plurality of memory modules, each memory module including a first memory device group and a second memory device, each of the first memory device group and the second memory device group including at least one memory device; at least two light sources including a first light source and a second light source; at least two light distribution units including a first light distribution unit and a second light distribution unit, the first light distribution unit connected to the first light source through a first optical transmission line, and the second light distribution unit connected to the second light source through a second optical transmission line; a plurality of third optical transmission lines, each line connected between the first light distribution unit and the first memory device group included in one of the memory modules; and a plurality of fourth optical transmission lines, each line connected between the second light distribution unit and the second memory device group included in one of the memory modules; and a plurality of electrical to optical converters, each connected to at least one of the plurality of third optical transmission lines and at least one of the plurality of fourth optical transmission lines.

In another embodiment, an optical memory system includes a plurality of memory modules, each memory module including a plurality of memory devices; at least two light sources including a first light source and a second light source; at least two light distribution units including a first light distribution unit and a second light distribution unit, the first light distribution unit connected to the first light source through a first optical transmission line, and the second light distribution unit connected to the second light source through a second optical transmission line; a plurality of third optical transmission lines connected between the first light distribution unit and the plurality of memory modules; a plurality of fourth optical transmission lines connected between the second light distribution unit and the plurality of memory modules; a plurality of electrical to optical converters, each connected to at least one of the third optical transmission lines and at least one of the fourth optical transmission lines; and a plurality of output optical transmission lines connected to the plurality of electrical to optical converters, each output optical transmission line for outputting an electrical to optical converted signal.

In another embodiment, an optical memory system includes a first light distribution unit. The first distribution unit includes a first input terminal for receiving a first continuous light signal; and a plurality of first output terminals, each for outputting a second continuous light signal. The second continuous light signal for each of the first output terminals is derived from the first continuous light signal, and each of the first output terminals is connected to one of a plurality of memory modules.

In a further embodiment, a method of distributing light between a light source and a plurality of memory modules is disclosed. The method includes receiving a first light signal; outputting a plurality of second lights signals, each derived from the first light signal; receiving a plurality of electrical data signals; generating a plurality of modulated light signals using the first plurality of second lights signal and the plurality of electrical data signals; and outputting the plurality of modulated light signals from the plurality of memory modules.

In another embodiment, an optical memory system is disclosed. The optical memory system includes a controller; a plurality of memory modules, each memory module including a plurality of memory devices; a light source; a light distribution unit connected to the light source through a first optical transmission line; a plurality of second optical transmission lines connected between the light distribution unit and the plurality of memory modules; a plurality of electrical to optical converters, each connected to at least one of the second optical transmission lines; and a plurality of output optical transmission lines connected to the plurality of electrical to optical converters, each output optical transmission line for outputting an electrical to optical converted signal to the controller.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
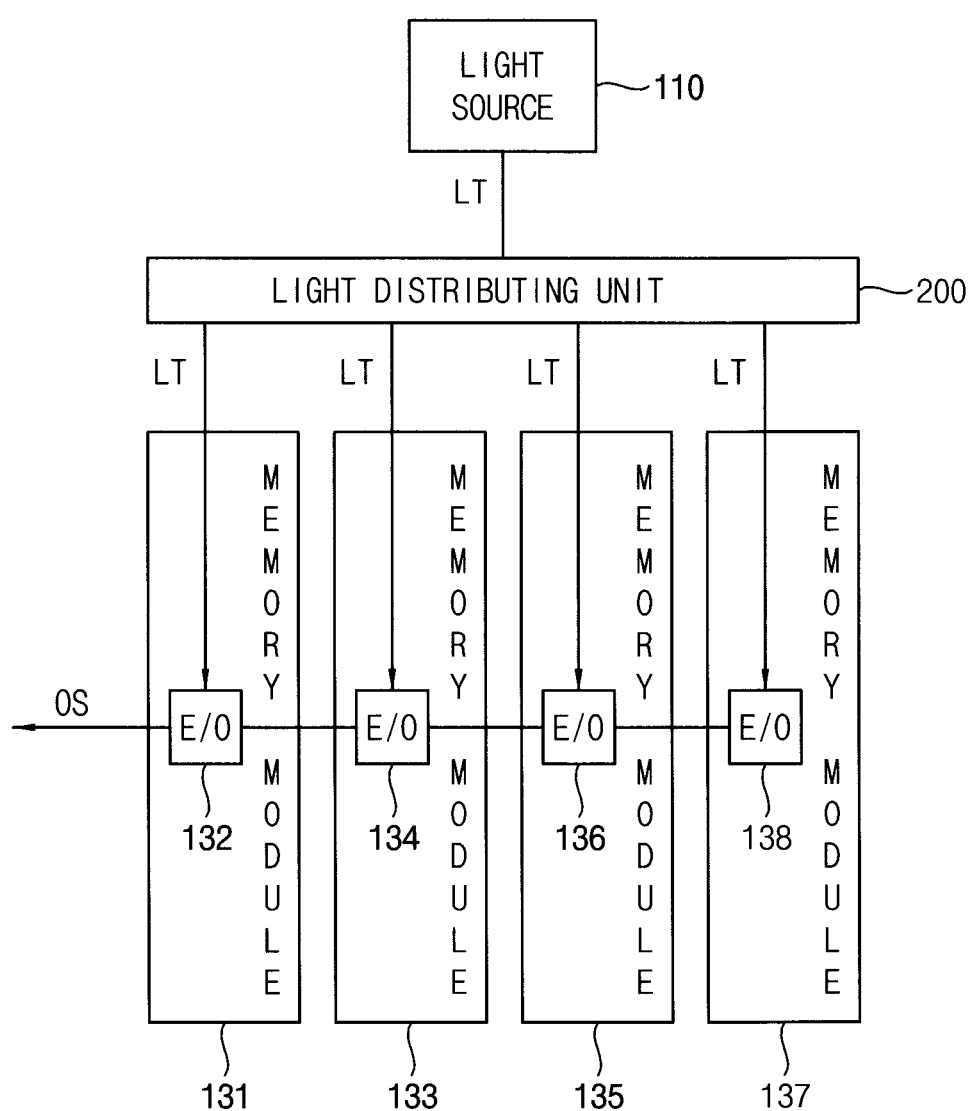
FIG. 1 is a block diagram illustrating an optical memory system according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "between," "connected to" or "coupled to" another element or layer, it can be directly on, connected or coupled to or between the other element or layer or intervening elements or layers may be present. In contrast, when an element is referred to as being "directly on," "directly connected to" or "directly coupled to" another element or layer, there are no intervening elements or layers present.

Like numerals refer to like elements throughout. As used herein, the term "and/or" includes any and all combinations of one or more of the associated listed items.

It will be understood that, although the terms first, second, third etc. may be used herein to describe various elements, components, regions, layers, steps, and/or sections, these elements, components, regions, layers and/or sections should not be limited by these terms. These terms are only used to distinguish one element, component, region, layer, step, or section from another region, layer, step, or section. Thus, a first element, component, region, layer, step, or section discussed below could be termed a second element, component, region, layer, step, or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional, perspective, or plan view illustrations that are schematic illustrations of idealized example embodiments (and intermediate structures). As such, variations from the shapes, locations, and orientations of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an optical memory system according to example embodiments.

Referring to FIG. 1, an optical memory system 100 includes a light source 110, a plurality of memory modules 131, 133, 135 and 137 and a light distributing unit 200.

The light source 110 may generate a light LT that is used to generate an optical signal OS by the plurality of memory modules 131, 133, 135 and 137. For example, the light source 110 may include a laser diode (LD), a light emitting diode (LED), an amplified spontaneous emission of an optical amplifier, etc. In one exemplary embodiment, the light source is a single light-producing element that generates and emits a light LT. The light LT may be a light signal that is constant, continuous, and/or unmodulated, for example having a constant amplitude, frequency, and phase. As such, the light LT may form an unmodulated light signal, a continuous light signal, and/or a constant light signal.

The plurality of memory modules 131, 133, 135 and 137 may transmit the optical signal OS to a memory controller, or may receive an optical signal from the memory controller. Accordingly, each memory module 131, 133, 135 and 137 may be referred to as an optically connected memory module, for example an optically connected dual inline memory module (OCDIMM).

Each memory module 131, 133, 135 and 137 may include a plurality of memory devices arranged, for example, on a board or substrate (e.g., printed circuit board, PCB). For example, the plurality of memory devices may be implemented as a dynamic random access memory (DRAM), a static random access memory (SRAM), a phase random access memory (PRAM), a ferroelectric random access memory (FRAM), a resistive random access memory (RRAM), a magnetic random access memory (MRAM), etc. According to example embodiments, each memory module 131, 133, 135 and 137 may be a dual inline memory module (DIMM), a single inline memory module (SIMM), or the like. Each of the memory devices may be, for example, a semiconductor memory chip or stack of chips, a semiconductor memory package including a package substrate and one or more semiconductor memory chips (e.g., in a stacked structure), a package-on-package semiconductor memory device including a plurality of stacked semiconductor memory packages, etc.

Each memory module 131, 133, 135 and 137 may convert an electrical signal output from the plurality of memory devices into the optical signal OS by using the light LT generated by the light source 110, and may output the optical signal OS to the memory controller. In some example embodiments, each memory module 131, 133, 135 and 137 may include an electrical-to-optical converting unit 132, 134, 136 and 138 that converts the electrical signal output from the plurality of memory devices into the optical signal OS by using the light LT generated by the light source 110. Each electrical-to-optical converting unit may comprise an optical buffer. Each electrical-to-optical converting unit 132, 134, 136 and 138 may receive the light LT from the light source 110 via the light distributing unit 200, and may generate the optical signal OS by modulating the received light LT in response to the electrical signal output from the plurality of memory devices. As such, the light LT prior to passing through an electrical-to-optical converting unit may be referred to as a pre-modulated light signal, and the light signal output from an electrical-to-optical converting unit 200 may be referred to as a modulated light signal or optical signal. The optical signal OS output from each electrical-to-optical converting unit 132, 134, 136 and 138 may be provided to the memory controller through an optical transmission line, such as, for example, an optical fiber. Other transmission media can be used, however, as an optical transmission line. For example, a plurality of optical fibers can be used to form an optical transmission line.

In some example embodiments, the electrical signal output from the plurality of memory devices may be a data signal output from the plurality of memory devices, for example, including data to be read from the memory devices. The plurality of memory modules 131, 133, 135 and 137 may convert the data signal into the optical signal OS (e.g., an optical data signal), and may output the optical signal OS to the memory controller. As such, data stored in the plurality of memory modules 131, 133, 135 and 137 may be provided in a form of the optical signal OS to the memory controller.

The memory controller may transmit a data signal, a command signal and an address signal to the plurality of memory modules 131, 133, 135 and 137 to control operations of the plurality of memory modules 131, 133, 135 and 137. In some example embodiments, the memory controller may convert at least one of the data signal, the command signal and the address signal into an optical signal, and may transmit the optical signal to the plurality of memory modules 131, 133, 135 and 137. That is, write data, a command, and an address provided from the memory controller to the plurality of memory modules 131, 133, 135 and 137 may be transferred in a form of the optical signal. For example, the memory controller may transmit the data signal in a form of the optical signal to the plurality of memory modules 131, 133, 135 and 137 through an optical transmission line, and may transmit the command signal and the address signal in a form of an electrical signal to the plurality of memory modules 131, 133, 135 and 137. In other examples, the memory controller may transmit all of the data signal, the command signal, and the address signal in a form of the optical signal to the plurality of memory modules 131, 133, 135 and 137 through the optical transmission line.

The light distributing unit 200 may be coupled between the light source 110 and the plurality of memory modules 131, 133, 135 and 137, and may distribute the light LT generated by the light source 110 to the plurality of memory modules 131, 133, 135 and 137. The light distributing unit 200 may be an active element, for example that uses a change in physical state to control light output, or can be a passive element, for example that outputs light without changing its physical state.

In some example embodiments, the light distributing unit 200 may include at least one optical splitter as a passive element. The light distributing unit 200 may split the light LT generated by the light source 110 into a plurality of lights, and may provide the plurality of lights to the plurality of memory modules 131, 133, 135 and 137, respectively.

In other example embodiments, the light distributing unit 200 may include at least one optical switch as an active element. The optical switch may selectively provide the light LT generated by the light source 110 to an active one of the plurality of memory modules 131, 133, 135 and 137 in response to a control signal provided from the memory controller. For example, the optical switch may couple the light source 110 only to a memory module currently performing a read operation among the plurality of memory modules 131, 133, 135 and 137, so that the light LT generated by the light source 110 may be provided only to the memory module currently performing the read operation.

In still other example embodiments, the light source 110 may adjust a wavelength of the light LT in response to a control signal provided from the memory controller, and the light distributing unit 200 may include a wavelength division multiplexing (WDM) demultiplexer as a passive element. The WDM demultiplexer may generate a plurality of lights having different wavelengths from each other by dividing the light LT generated by the light source 110 according to the wavelengths, and may provide the plurality of lights having the different wavelengths to the plurality of memory modules 131, 133, 135 and 137, respectively. For example, the WDM demultiplexer may divide the light LT generated by the light source 110 according to the wavelengths to generate a plurality of divided lights having the different wavelengths respectively corresponding to the plurality of memory modules 131, 133, 135 and 137, and may provide the plurality of divided lights to the plurality of memory modules 131, 133, 135 and 137, respectively. The light source 110 may adjust the wavelength of the light LT to a wavelength corresponding to an active memory module performing the read operation in response to the control signal. Thus, the light LT generated by the light source 110 may be provided only to the active memory module performing the read operation.

As described above, in the optical memory system 100 according to example embodiments, the light LT generated by the light source 110 may be distributed to the plurality of memory modules 131, 133, 135 and 137 by the light distributing unit 200, and thus the plurality of memory modules 131, 133, 135 and 137 may share the light source 110. Accordingly, compared to a conventional optical memory system including one light source per memory module, the optical memory system 100 according to example embodiments may have the reduced number (e.g., 1) of light sources, thereby reducing a cost and power consumption of the optical memory system 100.

Figure 2:
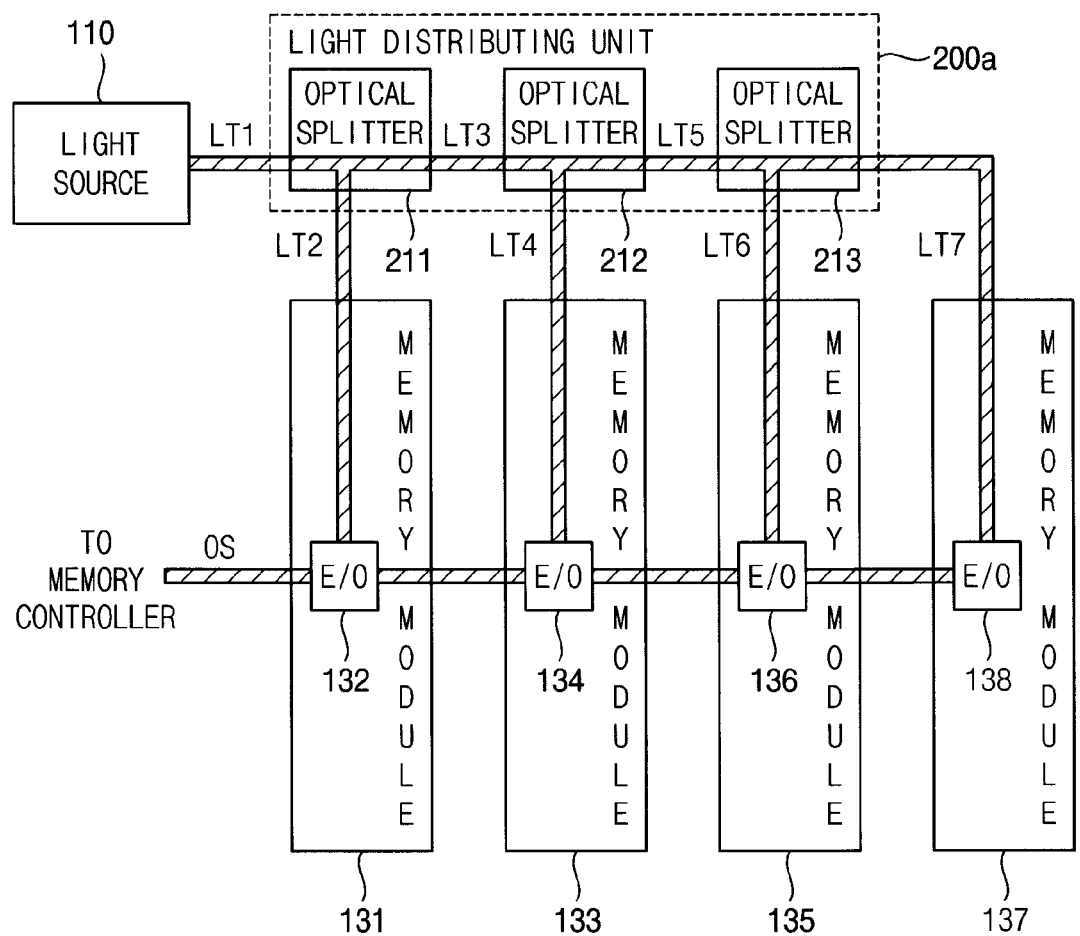
FIG. 2 is a block diagram illustrating an optical memory system according to example embodiments.

FIG. 2 is a block diagram illustrating an optical memory system according to example embodiments.

Referring to FIG. 2, an optical memory system 100*a* includes a light source 110, first through fourth memory modules 131, 133, 135 and 137 and a light distributing unit 200*a*. The first through fourth memory modules 131, 133, 135 and 137 may include first through fourth electrical-to-optical converting units 132, 134, 136 and 138, respectively.

The light distributing unit 200*a* may distribute a light LT1 generated by the light source 110 to the first through fourth electrical-to-optical converting units 132, 134, 136 and 138 included in the first through fourth memory modules 131, 133, 135 and 137. The light distributing unit 200*a* may include at least one 1:n (e.g., 1:2) optical splitter 211, 212 and 213 for splitting the light LT1 generated by the light source 110.

For example, the light distributing unit 200*a* may include a first optical splitter 211, a second optical splitter 212 and a third optical splitter 213. The first optical splitter 211 may split the light LT1 generated by the light source 110 into a first split light LT2 and a second split light LT3. The first split light LT2 may be provided to the first electrical-to-optical converting unit 132 included in the first memory module 131, and the second split light LT3 may be provided to the second optical splitter 212. The second optical splitter 212 may split the second split light LT3 into a third split light LT4 and a fourth split light LT5. The third split light LT4 may be provided to the second electrical-to-optical converting unit 134 included in the second memory module 133, and the fourth split light LT5 may be provided to the third optical splitter 213. The third optical splitter 213 may split the fourth split light LT5 into a fifth split light LT6 and a sixth split light LT7. The fifth split light LT6 may be provided to the third electrical-to-optical converting unit 136 included in the third memory module 135, and the sixth split light LT7 may be provided to the fourth electrical-to-optical converting unit 138 included in the fourth memory module 137. Accordingly, the first through fourth electrical-to-optical converting units 132, 134, 136 and 138 included in the first through fourth memory modules 131, 133, 135 and 137 may receive the split lights LT2, LT4, LT6 and LT7 that are split from the light LT1 generated by the light source 110, respectively, and may convert an electrical signal output from a plurality of memory devices into an optical signal by using the split lights LT2, LT4, LT6 and LT7.

As described above, in the optical memory system 100*a* according to example embodiments, the light LT1 generated by the light source 110 may be distributed to the plurality of memory modules 131, 133, 135 and 137 by the plurality of 1:2 optical splitters 211, 212 and 213, and thus the plurality of memory modules 131, 133, 135 and 137 may share the light source 110. Accordingly, the optical memory system 100*a* according to example embodiments may have the reduced number (e.g., 1) of light sources.

Figure 3:
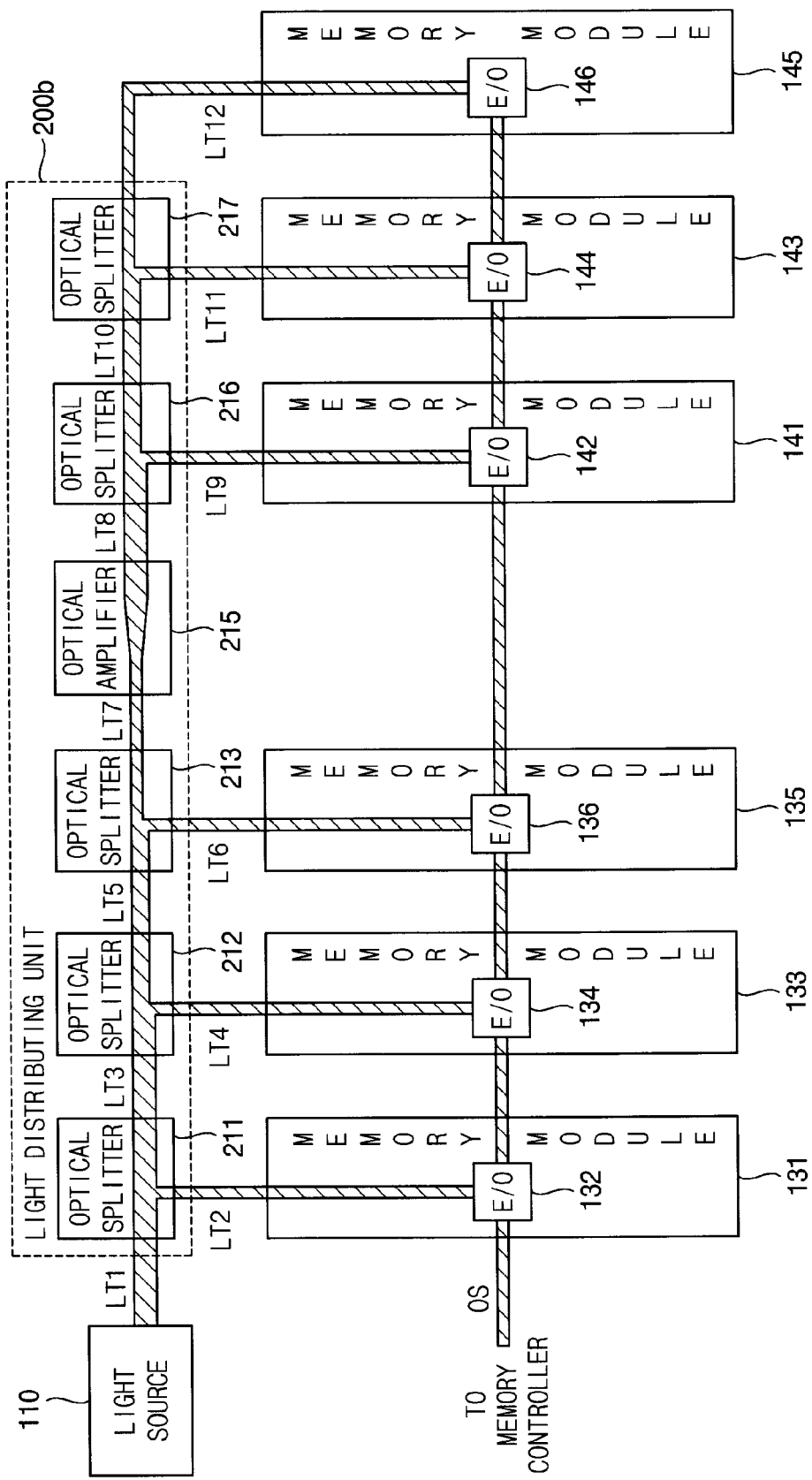
FIG. 3 is a block diagram illustrating an optical memory system according to example embodiments.

FIG. 3 is a block diagram illustrating an optical memory system according to example embodiments.

Referring to FIG. 3, an optical memory system 100*b* includes a light source 110, first through sixth memory modules 131, 133, 135, 141, 143 and 145 and a light distributing unit 200b. The first through sixth memory modules 131, 133, 135, 141, 143 and 145 may include first through sixth electrical-to-optical converting units 132, 134, 136, 142, 144 and 146, respectively.

The light distributing unit 200b may distribute a light LT1 generated by the light source 110 to first through sixth electrical-to-optical converting units 132, 134, 136, 142, 144 and 146 included in the first through sixth memory modules 131, 133, 135, 141, 143 and 145. The light distributing unit 200b may include at least one 1:2 optical splitter 211, 212, 213, 216, 217 for splitting the light LT1 generated by the light source 110 and at least one optical amplifier 215 for amplifying the split light such that the split light has an optical power higher than a threshold optical power that is required to perform an electrical-to-optical conversion by each electrical-to-optical converting unit 132, 134, 136, 142, 144 and 146.

For example, the light distributing unit 200b may include first through fifth optical splitters 211, 212, 213, 216 and 217 and an optical amplifier 215. The first optical splitter 211 may split the light LT1 generated by the light source 110 into a first split light LT2 and a second split light LT3, and may provide the first split light LT2 to the first electrical-to-optical converting unit 132 included in the first memory module 131. The second optical splitter 212 may split the second split light LT3 into a third split light LT4 and a fourth split light LT5, and may provide the third split light LT4 to the second electrical-to-optical converting unit 134 included in the second memory module 133. The third optical splitter 213 may split the fourth split light LT5 into a fifth split light LT6 and a sixth split light LT7, and may provide the fifth split light LT6 to the third electrical-to-optical converting unit 136 included in the third memory module 135.

Since the sixth split light LT7 may be split from the light LT1 generated by the light source 110 by the first through third optical splitters 211, 212 and 213, the sixth split light LT7 may have an optical power lower than that of the light LT1 generated by the light source 110. Further, the optical power of the sixth split light LT7 may be lower than the threshold optical power that is required to perform the electrical-to-optical conversion by each electrical-to-optical converting unit 132, 134, 136, 142, 144 and 146. In this case, to have an optical power higher than the threshold optical power, the sixth split light LT7 may be amplified by the optical amplifier 215. The optical amplifier 215 may generate an amplified light LT8 by amplifying the sixth split light LT7.

The fourth optical splitter 216 may split the amplified light LT8 into a seventh split light LT9 and an eighth split light LT10, and may provide the seventh split light LT9 to the fourth electrical-to-optical converting unit 142 included in the fourth memory module 141. The fifth optical splitter 217 may split the eighth split light LT10 into a ninth split light LT11 and a tenth split light LT12, may provide the ninth split light LT11 to the fifth electrical-to-optical converting unit 144 included in the fifth memory module 143, and may provide the tenth split light LT12 to the sixth electrical-to-optical converting unit 146 included in the sixth memory module 145.

As an example, each time light is split, the light output from the splitter may have a percentage of the optical power as the light input to the splitter. For example, in a 1:2 splitter, each output light can have 50% of the optical power of the input light to form a symmetrical light power splitter. Alternatively, one of the output lights can have, e.g., 75% of the optical power of the input light, and the other of the output lights can have, e.g., 25% of the optical power of the input light, to form an asymmetrical light power splitter. Other combinations of percentages, for example that add up to 100% or about 100% when small optical power losses are accounted for, may be used as well. In one embodiment, the minimum optical power needed to properly convert an electrical signal to an optical signal is 0.1% of the optical power of the light output from the initial light source.

As described above, in the optical memory system 100b according to example embodiments, the plurality of memory modules 131, 133, 135, 141, 143 and 145 may share the light source 110, and thus the optical memory system 100b may have the reduced number of light sources. Further, since the light distributing unit 200b includes at least one optical amplifier 215, a light having an optical power higher than the threshold optical power may be provided to each memory module 131, 133, 135, 141, 143 and 145 although the number of memory modules 131, 133, 135, 141, 143 and 145 included in the optical memory system 100b increases. Accordingly, the optical memory system 100b according to example embodiments may readily increase the number of memory modules, and may readily increase a system memory capacity.

Figure 4:
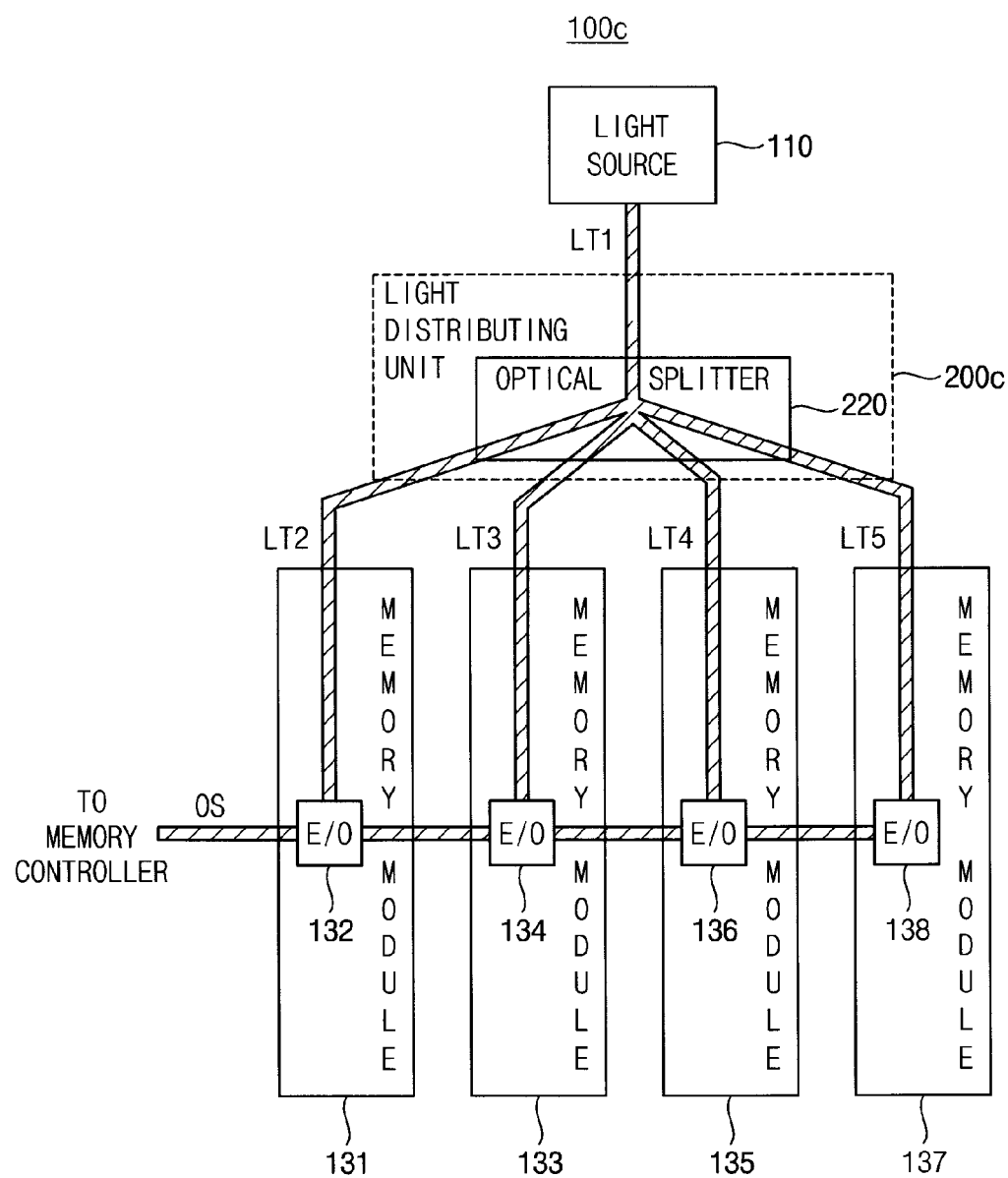
FIG. 4 is a block diagram illustrating an optical memory system according to example embodiments.

FIG. 4 is a block diagram illustrating an optical memory system according to example embodiments.

Referring to FIG. 4, an optical memory system 100c includes a light source 110, first through fourth memory modules 131, 133, 135 and 137 and a light distributing unit 200c. The first through fourth memory modules 131, 133, 135 and 137 may include first through fourth electrical-to-optical converting units 132, 134, 136 and 138, respectively.

The light distributing unit 200c may distribute a light LT1 generated by the light source 110 to the first through fourth electrical-to-optical converting units 132, 134, 136 and 138 included in the first through fourth memory modules 131, 133, 135 and 137. The light distributing unit 200c may include one 1:N optical splitter 220 for splitting the light LT1 generated by the light source 110.

The optical splitter 220 may split the light LT1 generated by the light source 110 into a first split light LT2, a second split light LT3, a third split light LT4 and a fourth split light LT5. In one embodiment, each of the first split light LT2, second split light LT3, third split light LT4, and fourth split light LT5 has substantially 25% of the optical power as the light LT1 (e.g., 25% of the optical power, minus small optical power losses inherent in the splitting process). However, other percentages may apply. The first split light LT2 may be provided to the first electrical-to-optical converting unit 132 included in the first memory module 131, the second split light LT3 may be provided to the second electrical-to-optical converting unit 134 included in the second memory module 133, the third split light LT4 may be provided to the third electrical-to-optical converting unit 136 included in the third memory module 135, and the fourth split light LT5 may be provided to the fourth electrical-to-optical converting unit 138 included in the fourth memory module 137. Accordingly, the first through fourth electrical-to-optical converting units 132, 134, 136 and 138 included in the first through fourth memory modules 131, 133, 135 and 137 may receive the split lights LT2, LT3, LT4 and LT5 that are split from the light LT1 generated by the light source 110, respectively, and may convert an electrical signal output from a plurality of memory devices into an optical signal by using the split lights LT2, LT3, LT4 and LT5.

As described above, in the optical memory system 100c according to example embodiments, the light LT1 generated by the light source 110 may be distributed to the plurality of memory modules 131, 133, 135 and 137 by the one 1:N optical splitter 220, and thus the plurality of memory modules 131, 133, 135 and 137 may share the light source 110. Accordingly, the optical memory system 100c according to example embodiments may have the reduced number of light sources.

Figure 5:
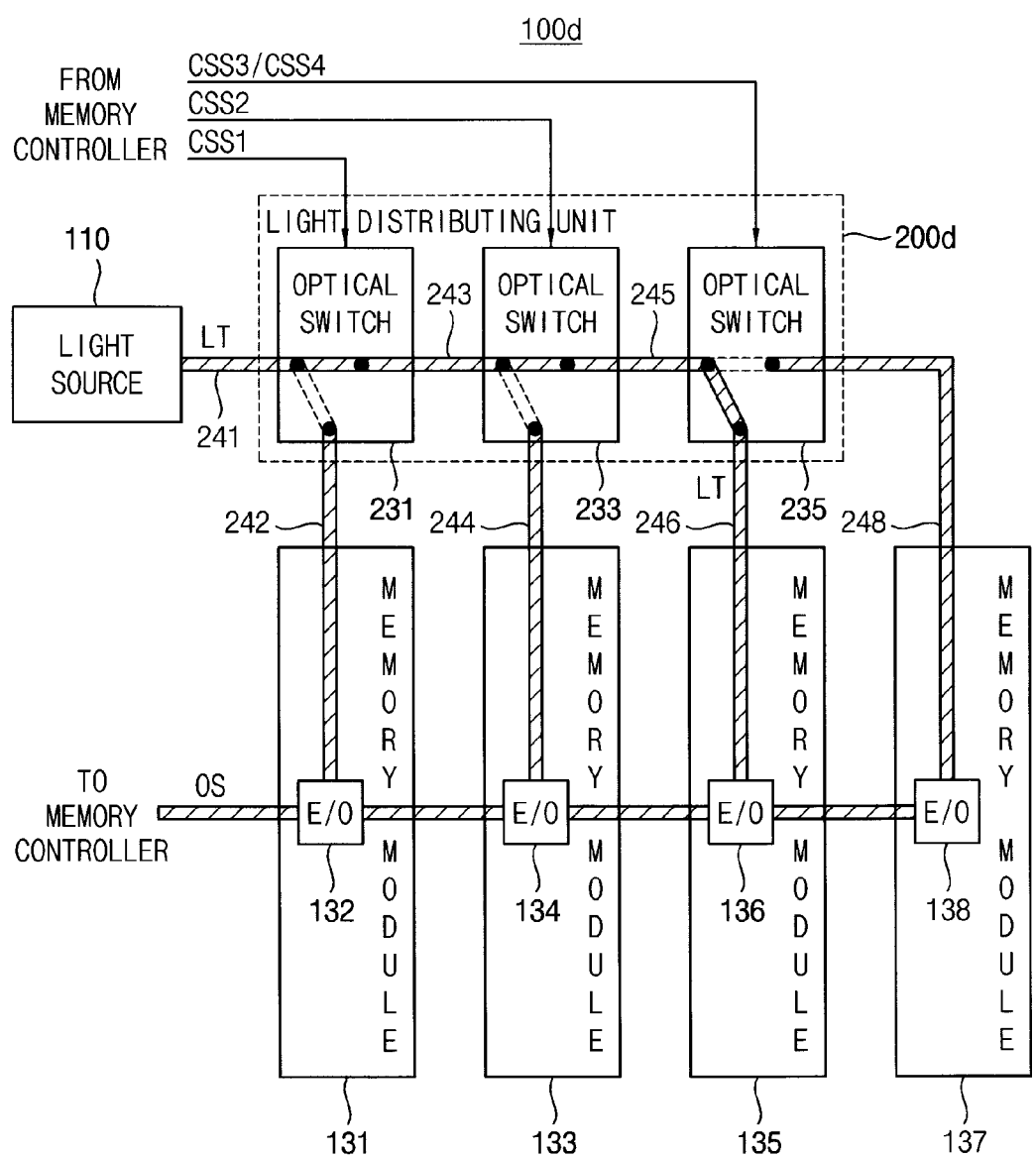
FIG. 5 is a block diagram illustrating an optical memory system according to example embodiments.

FIG. 5 is a block diagram illustrating an optical memory system according to example embodiments.

Referring to FIG. 5, an optical memory system 100d includes a light source 110, first through fourth memory modules 131, 133, 135 and 137 and a light distributing unit 200d. The first through fourth memory modules 131, 133, 135 and 137 may include first through fourth electrical-to-optical converting units 132, 134, 136 and 138, respectively.

The light distributing unit 200d may distribute a light LT generated by the light source 110 to the first through fourth electrical-to-optical converting units 132, 134, 136 and 138 included in the first through fourth memory modules 131, 133, 135 and 137. The light distributing unit 200d may be an active light distributing unit that includes at least one 1:2 optical switch 231, 233 and 235 for selectively providing the light LT generated by the light source 110 to an electrical-to-optical converting unit included in an active one of the first through fourth memory modules 131, 133, 135 and 137 in response to a control signal provided from a memory controller.

For example, the light distributing unit 200d may include a first optical switch 231, a second optical switch 233 and a third optical switch 235. The first optical switch 231 may selectively couple a first optical transmission line 241 between the light source 110 and the first optical switch 231 to a second optical transmission line 242 between the first optical switch 231 and the first electrical-to-optical converting unit 132 or to a third optical transmission line 243 between the first optical switch 231 and the second optical switch 233 in response to the control signal. The second optical switch 233 may selectively couple the third optical transmission line 243 to a fourth optical transmission line 244 between the second optical switch 233 and the second electrical-to-optical converting unit 134 or to a fifth optical transmission line 245 between the second optical switch 233 and the third optical switch 235 in response to the control signal. The third optical switch 235 may selectively couple the fifth optical transmission line 245 to a sixth optical transmission line 246 between the third optical switch 235 and the third electrical-to-optical converting unit 136 or to a seventh optical transmission line 247 between the third optical switch 235 and the fourth electrical-to-optical converting unit 138 in response to the control signal. Optical switches may be advantageous over certain other light distributing means at least because they do not split or reduce the optical power of the light being output compared to the light being input to the light distributing unit. As such, the light input to the light distributing unit 200d will have substantially the same optical power as the light output from a selected output optical transmission line of the light distribution unit 200d (e.g., the optical power of the light input minus small optical power losses inherent in the switching process).

In some example embodiments, the light distributing unit 200d may receive as a control signal from the memory controller chip select signals CSS1, CSS2, CSS3 and CSS4, of which each indicates whether a corresponding memory module or a corresponding rank is in an active state. For example, the first optical switch 231 may receive as the control signal from the memory controller a first chip select signal CSS1 that indicates whether the first memory module 131 or a rank included in the first memory module 131 is in an active state, the second optical switch 233 may receive as the control signal from the memory controller a second chip select signal CSS2 that indicates whether the second memory module 133 or a rank included in the second memory module 133 is in an active state, and the third optical switch 235 may receive as the control signal from the memory controller a third chip select signal CSS3 that indicates whether the third memory module 135 or a rank included in the third memory module 135 is in an active state, and/or a fourth chip select signal CSS4 that indicates whether the fourth memory module 137 or a rank included in the fourth memory module 137 is in an active state. The light distributing unit 200d may provide the light LT generated by the light source 110 to an active memory module or a memory module including an active rank among the first through fourth memory modules 131, 133, 135 and 137 in response to the first chip select signal CSS1, the second chip select signal CSS2, the third chip select signal CSS3 and/or the fourth chip select signal CSS4. Optical switches are generally known, and so the details of the optical switches discussed herein are omitted for the sake of brevity, but can include any known optical switching elements.

For example, if the first chip select signal CSS1 has a first logic level indicating that the first memory module 131 is in an active state (or that the first memory module 131 performs a read operation), and the second and third chip select signals CSS2 and CSS3 have a second logic level, the first optical switch 231 may coupled the first optical transmission line 241 to the second optical transmission line 242 in response to the first chip select signal CSS1 having the first logic level. Accordingly, the light LT generated by the light source 110 may be provided to the first electrical-to-optical converting unit 132 included in the first memory module 131 that is in an active state (or that performs the read operation) through the first optical transmission line 241 and the optical transmission line 242.

If the second chip select signal CSS2 has the first logic level indicating that the second memory module 133 is in an active state, and the first and third chip select signals CSS1 and CSS3 have the second logic level, the first optical switch 231 may coupled the first optical transmission line 241 to the third optical transmission line 243 in response to the first chip select signal CSS1 having the second logic level, and the second optical switch 233 may coupled the third optical transmission line 243 to the fourth optical transmission line 244 in response to the second chip select signal CSS2 having the first logic level. Accordingly, the light LT generated by the light source 110 may be provided to the second electrical-to-optical converting unit 134 included in the second memory module 133 that is in an active state through the first optical transmission line 241, the third optical transmission line 243 and the fourth optical transmission line 244.

If the third chip select signal CSS3 has the first logic level indicating that the third memory module 135 is in an active state, and the first and second chip select signals CSS1 and CSS2 have the second logic level, the first optical switch 231 may coupled the first optical transmission line 241 to the third optical transmission line 243 in response to the first chip select signal CSS1 having the second logic level, the second optical switch 233 may coupled the third optical transmission line 243 to the fifth optical transmission line 245 in response to the second chip select signal CSS2 having the second logic level, and the third optical switch 235 may coupled the fifth optical transmission line 245 to the sixth optical transmission line 246 in response to the third chip select signal CSS3 having the first logic level. Accordingly, the light LT generated by the light source 110 may be provided to the third electrical-to-optical converting unit 136 included in the third memory module 135 that is in an active state through the first optical transmission line 241, the third optical transmission line 243, the fifth optical transmission line 245 and the sixth optical transmission line 246.

If the fourth memory module 137 is in an active state, the first through third chip select signals CSS1, CSS2 and CSS3 may have the second logic level. The first optical switch 231 may be coupled the first optical transmission line 241 to the third optical transmission line 243 in response to the first chip select signal CSS1 having the second logic level, the second optical switch 233 may coupled the third optical transmission line 243 to the fifth optical transmission line 245 in response to the second chip select signal CSS2 having the second logic level, and the third optical switch 235 may coupled the fifth optical transmission line 245 to the seventh optical transmission line 247 in response to the third chip select signal CSS3 having the second logic level. Accordingly, the light LT generated by the light source 110 may be provided to the fourth electrical-to-optical converting unit 138 included in the fourth memory module 137 that is in an active state through the first optical transmission line 241, the third optical transmission line 243, the fifth optical transmission line 245 and the seventh optical transmission line 247.

The term "chip select signal" is used above to generally refer to a signal that selects a chip or rank of a memory module, and is therefore also referred to herein as a module select signal. Signals for selecting either a chip or a module are generally referred to herein as memory select signals.

As described above, in the optical memory system 100d according to example embodiments, the light LT generated by the light source 110 may be distributed to the plurality of memory modules 131, 133, 135 and 137 by the plurality of 1:2 optical switches 231, 233 and 235, and thus the plurality of memory modules 131, 133, 135 and 137 may share the light source 110. Accordingly, the optical memory system 100d according to example embodiments may have the reduced number of light sources. Further, the plurality of 1:2 optical switches 231, 233 and 235 may couple the light source 110 to a memory module that is in an active state or that performs the read operation among a plurality of memory modules 131, 133, 135 and 137, and thus the light LT generated by the light source 110 may be provided only to the active memory module. Accordingly, compared to a conventional optical memory system where a light is provided to an inactive memory module (e.g., a memory module that is in a ready state or an idle state) as well as an active memory module, the optical memory system 100d according to example embodiments may provide the light LT only to the active memory module, thereby reducing power consumption. Further, although the number of memory modules 131, 133, 135 and 137 increases, the number of light sources may not increase and the power consumption may not increase. Accordingly, the optical memory system 100d according to example embodiments may readily increase the number of memory modules 131, 133, 135 and 137, and may readily increase a system memory capacity.

Figure 6:
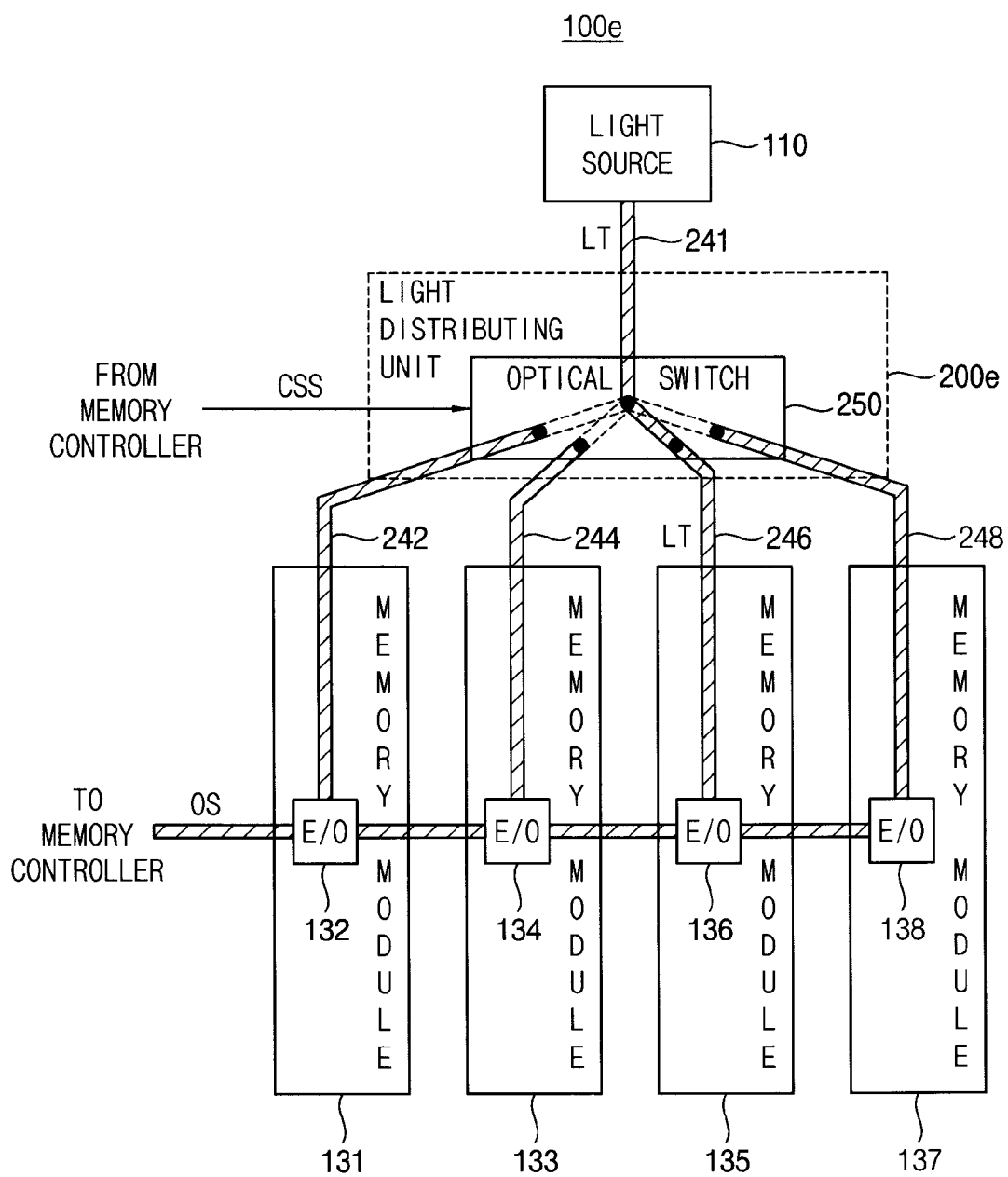
FIG. 6 is a block diagram illustrating an optical memory system according to example embodiments.

FIG. 6 is a block diagram illustrating an optical memory system according to example embodiments.

Referring to FIG. 6, an optical memory system 100e includes a light source 110, first through fourth memory modules 131, 133, 135 and 137 and a light distributing unit 200e. The first through fourth memory modules 131, 133, 135 and 137 may include first through fourth electrical-to-optical converting units 132, 134, 136 and 138, respectively.

The light distributing unit 200e may distribute a light LT generated by the light source 110 to the first through fourth electrical-to-optical converting units 132, 134, 136 and 138 included in the first through fourth memory modules 131, 133, 135 and 137. The light distributing unit 200e may include one 1:N optical switch 250 for selectively providing the light LT generated by the light source 110 to an electrical-to-optical converting unit included in an active one of the first through fourth memory modules 131, 133, 135 and 137 in response to a control signal provided from a memory controller.

The optical switch 250 may selectively couple a first optical transmission line 241 between the light source 110 and the optical switch 250 to a second optical transmission line 242 between the optical switch 250 and the first electrical-to-optical converting unit 132, to a third optical transmission line 244 between the optical switch 250 and the second electrical-to-optical converting unit 134, to a fourth optical transmission line 246 between the optical switch 250 and the third electrical-to-optical converting unit 136 or to a fifth optical transmission line 248 between the optical switch 250 and the fourth electrical-to-optical converting unit 138.

In some example embodiments, the optical switch 250 may receive a memory select signal, such as a chip select signal CSS as the control signal from the memory controller. For example, the optical switch 250 may receive a first chip select signal that indicates whether the first memory module 131 is in an active state, a second chip select signal that indicates whether the second memory module 133 or a rank is in an active state, a third chip select signal that indicates whether the third memory module 135 is in an active state and a fourth chip select signal that indicates whether the fourth memory module 137 is in an active state from the memory controller. The optical switch 250 may provide the light LT generated by the light source 110 to an active memory module among the first through fourth memory modules 131, 133, 135 and 137 in response to the first through fourth chip select signals.

For example, if the first chip select signal CSS1 has a first logic level, the optical switch 250 may couple the first optical transmission line 241 to the second optical transmission line 242 to provide the light LT to the first electrical-to-optical converting unit 132 included in the first memory module 131 that is in an active state (or that performs a read operation). If the second chip select signal CSS2 has the first logic level, the optical switch 250 may couple the first optical transmission line 241 to the third optical transmission line 244 to provide the light LT to the second electrical-to-optical converting unit 134 included in the second memory module 133 that is in an active state. If the third chip select signal CSS3 has the first logic level, the optical switch 250 may couple the first optical transmission line 241 to the fourth optical transmission line 246 to provide the light LT to the third electrical-to-optical converting unit 136 included in the third memory module 135 that is in an active state. If the fourth chip select signal CSS4 has the first logic level, the optical switch 250 may couple the first optical transmission line 241 to the fifth optical transmission line 248 to provide the light LT to the fourth electrical-to-optical converting unit 138 included in the fourth memory module 137 that is in an active state.

As described above, in the optical memory system 100e according to example embodiments, the light LT generated by the light source 110 may be distributed to the plurality of memory modules 131, 133, 135 and 137 by one 1:N optical switch 250, and thus the plurality of memory modules 131, 133, 135 and 137 may share the light source 110. Accordingly, the optical memory system 100e according to example embodiments may have the reduced number of light sources. Further, the optical switch 250 may couple the light source 110 to a memory module that is in an active state or that performs the read operation among a plurality of memory modules 131, 133, 135 and 137, and thus the light LT generated by the light source 110 may be provided only to the active memory module. Accordingly, the optical memory system 100e according to example embodiments may reduce power consumption. Further, although the number of memory modules 131, 133, 135 and 137 increases, the number of light sources may not increase and the power consumption may not increase. Accordingly, the optical memory system 100e according to example embodiments may readily increase the number of memory modules 131, 133, 135 and 137, and may readily increase a system memory capacity.

Figure 7:
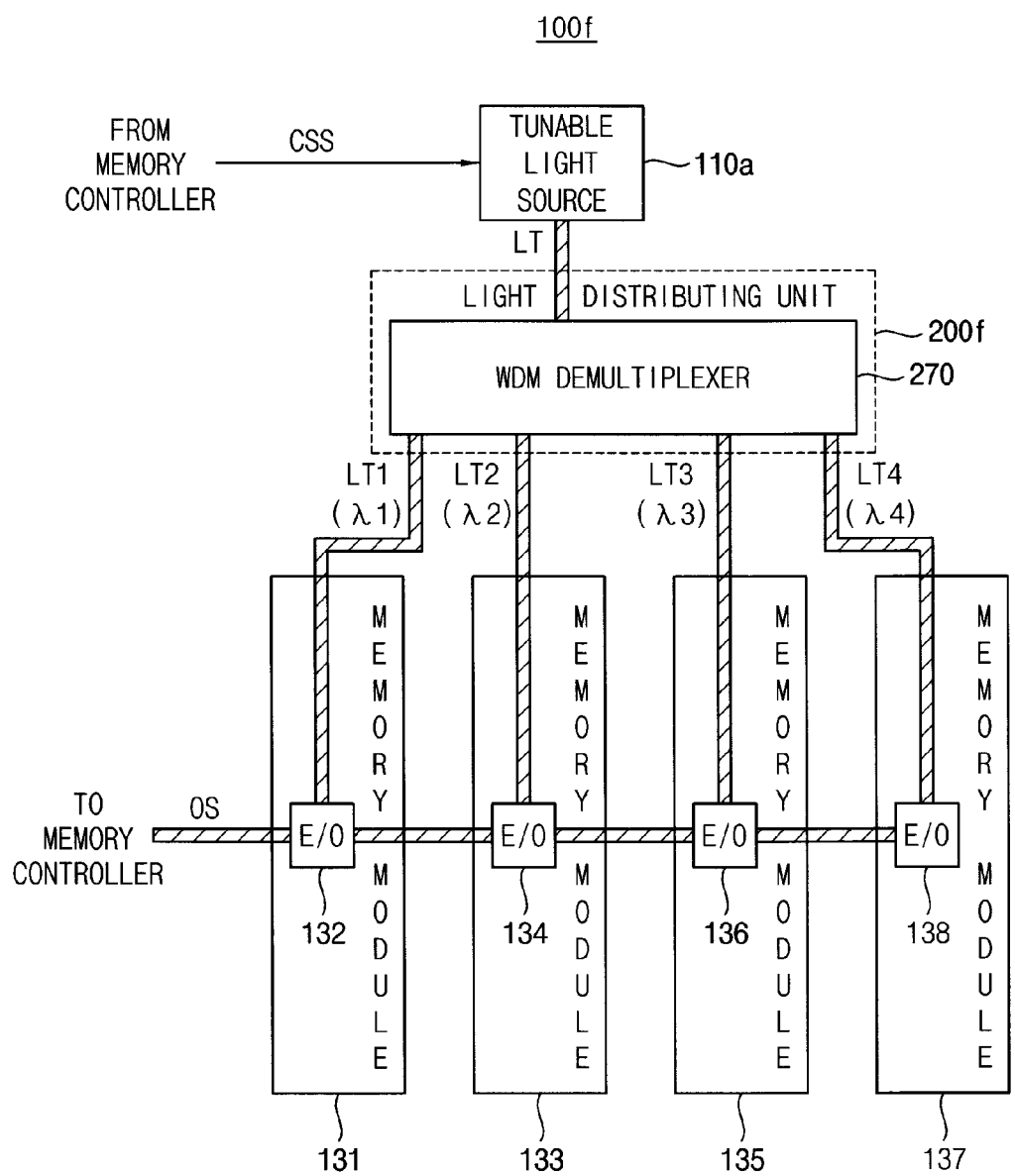
FIG. 7 is a block diagram illustrating an optical memory system according to example embodiments.

FIG. 7 is a block diagram illustrating an optical memory system according to example embodiments.

Referring to FIG. 7, an optical memory system 100f includes a light source 110a, first through fourth memory modules 131, 133, 135 and 137 and a passive light distributing unit 200f. The first through fourth memory modules 131, 133, 135 and 137 may include first through fourth electrical-to-optical converting units 132, 134, 136 and 138, respectively.

The light source 110a may generate a light LT. The light source 110a may be a tunable light source that is able to adjust a wavelength of the light LT in response to a control signal. In some example embodiments, the light source 110a may receive a memory select signal such as a chip select signal CSS indicating an active memory module among the first through fourth memory modules 131, 133, 135 and 137 as the control signal from a memory controller, and may adjust the wavelength of the light LT in response to the chip select signal CSS. For example, the light source 110a may adjust the wavelength of the light LT to a first wavelength $\lambda 1$ if the chip select signal CSS indicates that the first memory module 131 is in an active state, may adjust the wavelength of the light LT to a second wavelength $\lambda 2$ if the chip select signal CSS indicates that the second memory module 133 is in an active state, may adjust the wavelength of the light LT to a third wavelength $\lambda 3$ if the chip select signal CSS indicates that the third memory module 135 is in an active state, and may adjust the wavelength of the light LT to a fourth wavelength $\lambda 4$ if the chip select signal CSS indicates that the fourth memory module 137 is in an active state.

The light distributing unit 200f may distribute the light LT generated by the light source 110 to the first through fourth electrical-to-optical converting units 132, 134, 136 and 138 included in the first through fourth memory modules 131, 133, 135 and 137. The light distributing unit 200f may include a wavelength division multiplexing (WDM) demultiplexer 270. The WDM demultiplexer 270 may generate a plurality of lights LT1, LT2, LT3 and LT4 having different wavelengths $\lambda 1$, $\lambda 2$, $\lambda 3$ and $\lambda 4$ by dividing the light LT generated by the light source 110 according to wavelengths, and may provide the plurality of lights LT1, LT2, LT3 and LT4 to a plurality of memory modules 131, 133, 135 and 137, respectively.

For example, the WDM demultiplexer 270 may divide the light LT generated by the light source 110 into a first light LT1 having the first wavelength $\lambda 1$, a second light LT2 having the second wavelength $\lambda 2$, a third light LT3 having the third wavelength $\lambda 3$ and a fourth light LT4 having the fourth wavelength $\lambda 4$. The WDM demultiplexer 270 may provide the first light LT1 having the first wavelength $\lambda 1$ to the first electrical-to-optical converting unit 132 included in the first memory module 131, may provide the second light LT2 having the second wavelength $\lambda 2$ to the second electrical-to-optical converting unit 134 included in the second memory module 133, may provide the third light LT3 having the third wavelength $\lambda 3$ to the third electrical-to-optical converting unit 136 included in the third memory module 135, and may provide the fourth light LT4 having the fourth wavelength $\lambda 4$ to the fourth electrical-to-optical converting unit 138 included in the fourth memory module 137.

Accordingly, since the light source 110a generates the light LT having a wavelength corresponding to an active memory module in response to the chip select signal CSS indicating the active memory module, and the WDM demultiplexer 270 divides the light LT according to the wavelengths to provide each memory module 131, 133, 135 and 137 with the divided light having a wavelength corresponding to the each memory module 131, 133, 135 and 137, the light LT generated by the light source 110a may be provided only to the active memory module. For example, if the chip select signal CSS indicates that the third memory module 135 is in an active state or that the third memory module 135 performs a read operation, the light source 110a may adjust the wavelength of the light LT to the third wavelength $\lambda 3$, and the WDM demultiplexer 270 may provide a portion of the light LT having the third wavelength $\lambda 3$, or the light LT to the third memory module 135. In this case, the light LT generated by the light source 110a may have an optical power of about 0 in the first, second and fourth wavelengths $\lambda 1$, $\lambda 2$ and $\lambda 4$, and thus the first, second and fourth lights LT1, LT2 and LT4 respectively provided to the first, second and fourth memory modules 131, 133 and 137 may have the optical power of about 0. That is, the light LT may be provided only to the third memory module 135, and may not be provided to the first second and fourth memory modules 131, 133 and 137 that are in an inactive state.

As described above, in the optical memory system 100f according to example embodiments, the plurality of memory modules 131, 133, 135 and 137 may share the light source 110, and thus the optical memory system 100f according to example embodiments may have the reduced number of light sources. Further, in the optical memory system 100f according to example embodiments, the light LT generated by the light source 110a may be provided only to the active memory module, and thus power consumption may be reduced. Further, although the number of memory modules 131, 133, 135 and 137 increases, the number of light sources may not increase and the power consumption may not increase. Accordingly, the optical memory system 100f according to example embodiments may readily increase the number of memory modules 131, 133, 135 and 137, and may readily increase a system memory capacity.

Figure 8:
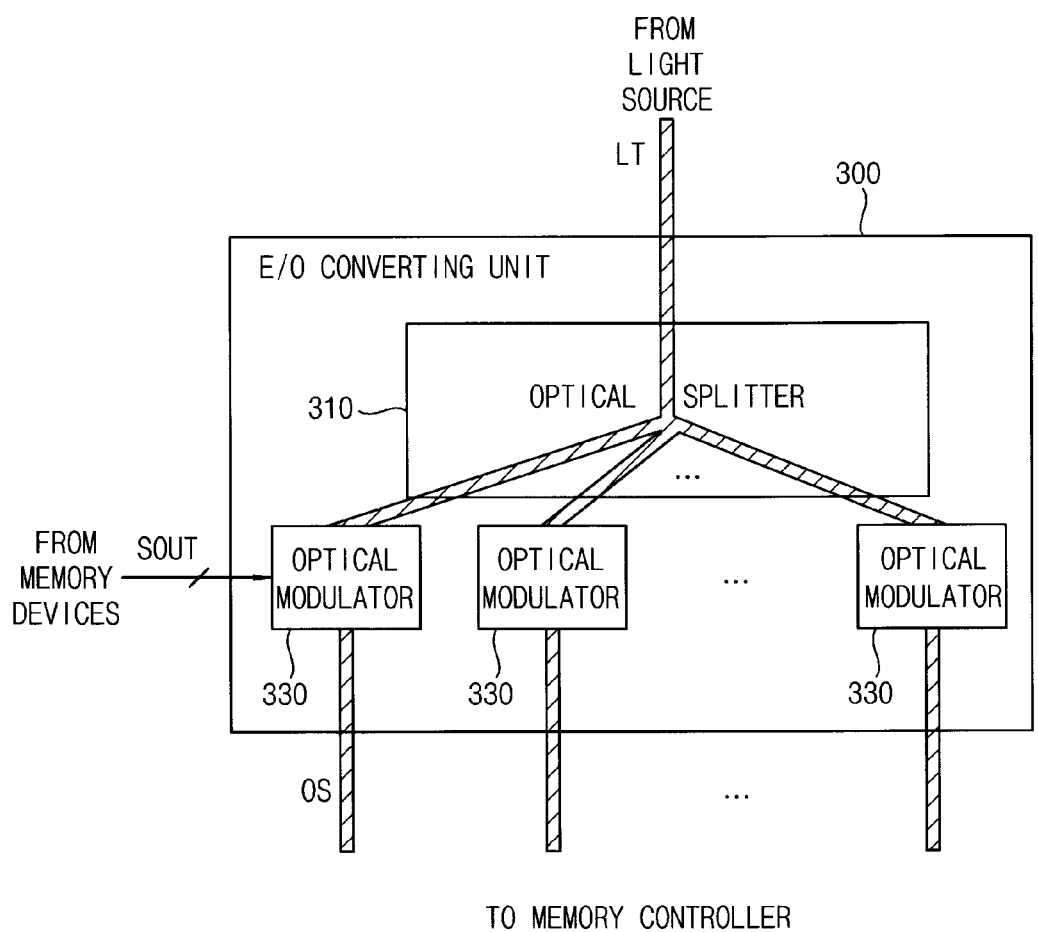
FIG. 8 is a block diagram illustrating an example of an electrical-to-optical converting unit included in a memory module according to example embodiments.

FIG. 8 is a block diagram illustrating an example of an electrical-to-optical converting unit included in a memory module according to example embodiments.

Referring to FIG. 8, an electrical-to-optical converting unit 300 may include an optical splitter 310 and a plurality of optical modulators 330. In some example embodiments, an electrical-to-optical converting unit 132, 134, 136, 138, 142, 144 and 146 included in each memory module 131, 133, 135, 137, 141, 143 and 145 illustrated in FIGS. 1 through 7 may be implemented as the electrical-to-optical converting unit 300 of FIG. 8.

The optical splitter 310 may divide a light LT received from a light source via a light distributing unit into a plurality of lights, and may provide the plurality of lights to the plurality of optical modulators 330, respectively.

The plurality of optical modulators 330 may receive electrical signals SOUT output from a plurality of memory devices included in a memory module where the electrical-to-optical converting unit 300 is located, and may generate a plurality of respective optical signals OS by modulating the plurality of lights based on the electrical signals SOUT. For example, each optical modulator 330 may selectively output a light that is a continuous wave (CW) modulated in time according to a logic level of a corresponding electrical signal SOUT such that optical pulses corresponding to the logic level of the corresponding electrical signal SOUT are generated as the optical signal OS. Modulations such as amplitude modulation, frequency modulation, or phase change modulation may be used. The plurality of optical modulators 330 may provide the plurality of optical signals OS to a memory controller.

In some example embodiments, a silicon photonics technique may be employed, and the light source may be implemented as a III-V group semiconductor laser, a hybrid silicon laser, an all-silicon laser, etc. The electrical-to-optical converting unit 300 may be implemented using a typical semiconductor manufacturing process, and optical modules, such as the light source, the light distributing unit and the electrical-to-optical converting unit 300, may be coupled to each other through a silicon waveguide. Further, the light source may be located outside an integrated circuit where the electrical-to-optical converting unit 300 is formed, and the electrical-to-optical converting unit 300 may generate the optical signals OS by modulating the light LT received from the external light source. However, example embodiments are not limited to the silicon photonics technique, and may employ various photonics techniques.

Figure 9:
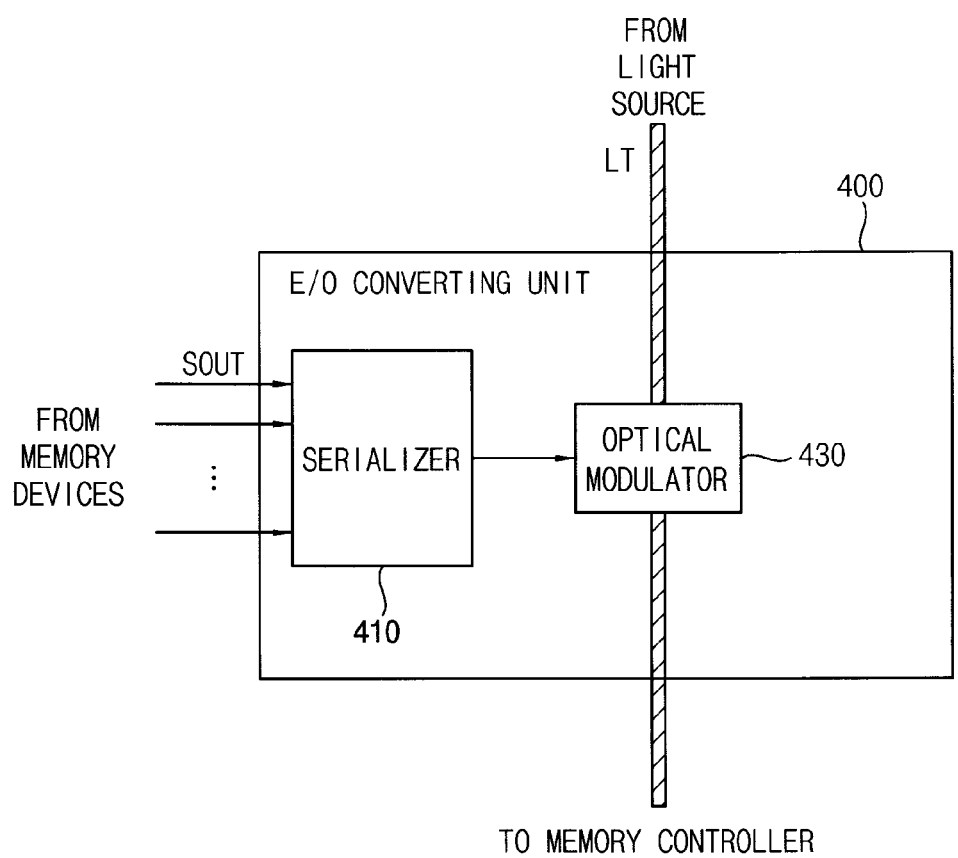
FIG. 9 is a block diagram illustrating another example of an electrical-to-optical converting unit included in a memory module according to example embodiments.

FIG. 9 is a block diagram illustrating another example of an electrical-to-optical converting unit included in a memory module according to example embodiments.

Referring to FIG. 9, an electrical-to-optical converting unit 400 includes a serializer 410 and an optical modulator 430. In some example embodiments, an electrical-to-optical converting unit 132, 134, 136, 138, 142, 144 and 146 included in each memory module 131, 133, 135, 137, 141, 143 and 145 illustrated in FIGS. 1 through 7 may be implemented as the electrical-to-optical converting unit 400 of FIG. 9.

The serializer 410 may generate a serial signal by serializing electrical signals SOUT output from a plurality of memory devices included in a memory module where the electrical-to-optical converting unit 400 is located.

The optical modulator 430 may receive the serial signal from the serializer 410, and may receive a light LT from a light source via a light distributing unit. The optical modulator 430 may generate an optical signal OS by modulating the received light LT based on the serial signal. For example, the optical modulator 430 may selectively output the light LT that is a continuous wave (CW) modulated in time according to a logic level of the serial signal such that optical pulses corresponding to the logic level of the serial signal are generated as the optical signal OS. The optical modulator 430 may provide the optical signal OS to a memory controller.

Figure 10:
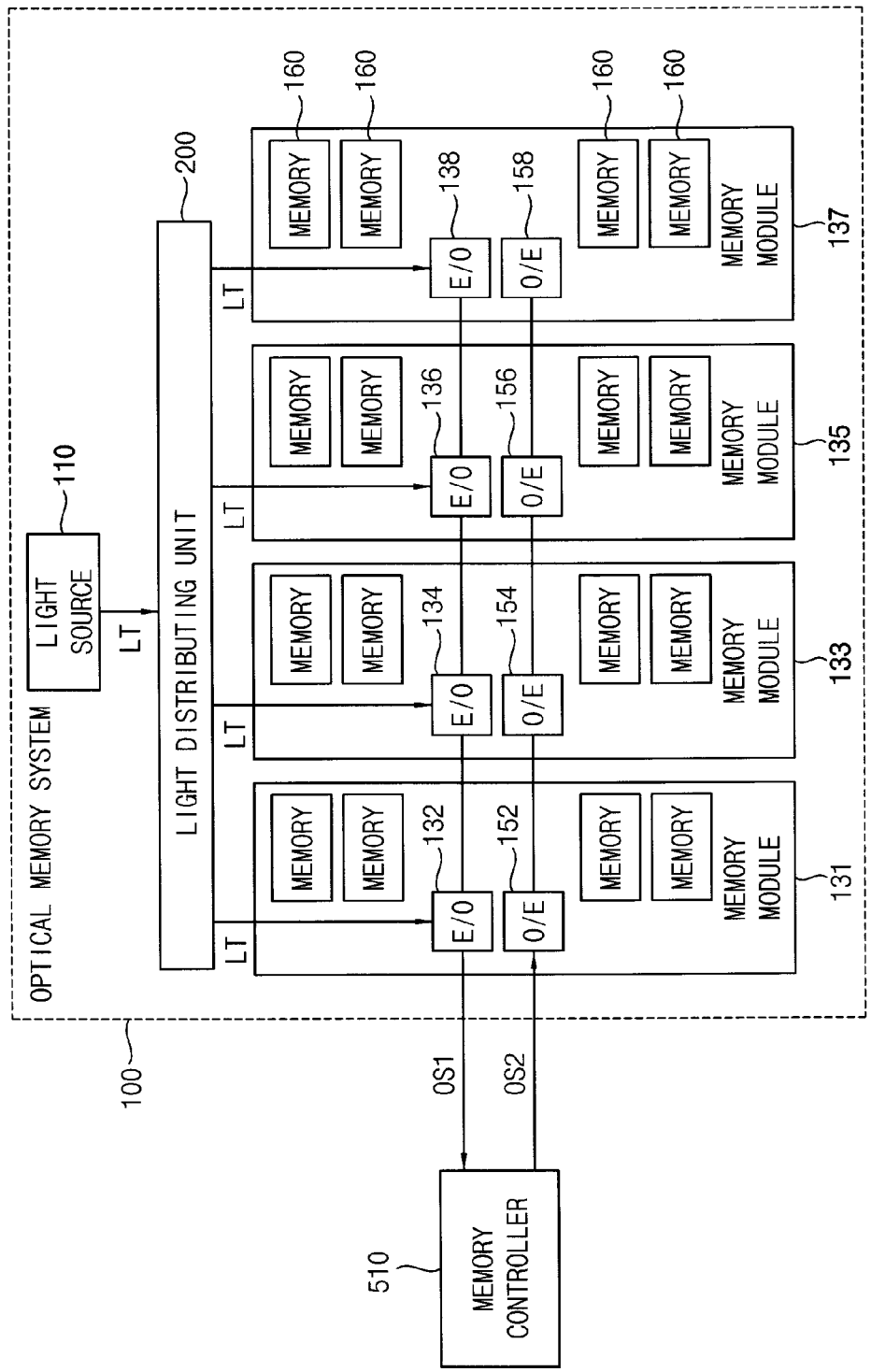
FIG. 10 is a block diagram illustrating a memory controller and an optical memory system according to example embodiments.

FIG. 10 is a block diagram illustrating a memory controller and an optical memory system according to example embodiments.

Referring to FIG. 10, an optical memory system 100 is coupled to a memory controller 510. The optical memory system 100 may include a light source 110, a plurality of memory modules 131, 133, 135 and 137 and a light distributing unit 200.

The memory controller 510 may control the optical memory system 100. For example, the memory controller 510 may transmit a data signal, a command signal and an address signal to the plurality of memory modules 131, 133, 135 and 137 to control operations of the plurality of memory modules 131, 133, 135 and 137. In some example embodiments, the memory controller 510 may convert at least one of the data signal, the command signal and the address signal into an optical signal OS2, and may transmit the optical signal OS2 to a plurality of optical-to-electrical converting units 152, 154, 156 and 158 included in the plurality of memory modules 131, 133, 135 and 137. Further, in some example embodiments, a data signal output from a plurality of memory devices 160 included in each memory module 131, 133, 135 and 137 may be converted into an optical signal OS1 by an electrical-to-optical converting unit 132, 134, 136 and 138, and the memory controller 510 may receive the optical signal OS1 as the data signal from the optical memory system 100. According to example embodiments, the plurality of memory modules 131, 133, 135 and 137 may be coupled to the memory controller 510 in a multi-drop manner or in a daisy chain manner.

Each memory module 131, 133, 135 and 137 may include the plurality of memory devices 160 and the electrical-to-optical converting unit 132, 134, 136 and 138. For example, the plurality of memory devices 160 may be implemented as a DRAM, a SRAM, a PRAM, a FRAM, a RRAM, a MRAM, etc. The electrical-to-optical converting unit 132, 134, 136 and 138 may convert an electrical signal (e.g., the data signal) output from the plurality of memory devices 160 into the optical signal OS1 by using a light LT received from the light source 110 via the light distributing unit 200, and may provide the optical signal OS1 to the memory controller 510. The memory controller 510 may recover the data signal by converting the optical signal OS1 into the electrical signal.

Each memory module 131, 133, 135 and 137 may further include the optical-to-electrical converting unit 152, 154, 156 and 158. Each optical-to-electrical converting unit 152, 154, 156 and 158 may include a photo detector that detects the optical signal OS2 provided from the memory controller 510. For example, each optical-to-electrical converting unit 152, 154, 156 and 158 may generate an electrical signal having a logic level corresponding to pulses of the optical signal OS2 by detecting the pulses of the optical signal OS2 provided from the memory controller 510 using the photo detector, and may provide the electrical signal to the plurality of memory device 160. Different types of photo detectors and optical-to-electrical converters are well known, and details about them are not discussed herein.

According to example embodiments, the electrical-to-optical converting unit 132, 134, 136 and 138 and the optical-to-electrical converting unit 152, 154, 156 and 158 may be implemented as one chip or separate chips. For example, units 132 and 152 may be on a single chip or may be on different chips, units 134 and 154 may be on a single chip or may be on different chips, etc.

As described above, since the data signal, the command signal and/or the address signal may be transferred in a form of the optical signal OS1 and OS2 between the memory controller 510 and the optical memory system 100 according to example embodiments, an impedance mismatch may not occur, and signal integrity may not deteriorate although the number of memory modules 131, 133, 135 and 137 coupled to the memory controller 510 increases. Further, in the optical memory system 100 according to example embodiments, the plurality of memory modules 131, 133, 135 and 137 may share the light source 110, thereby readily increasing the number of memory modules and readily increasing a system memory capacity.

Figure 11:
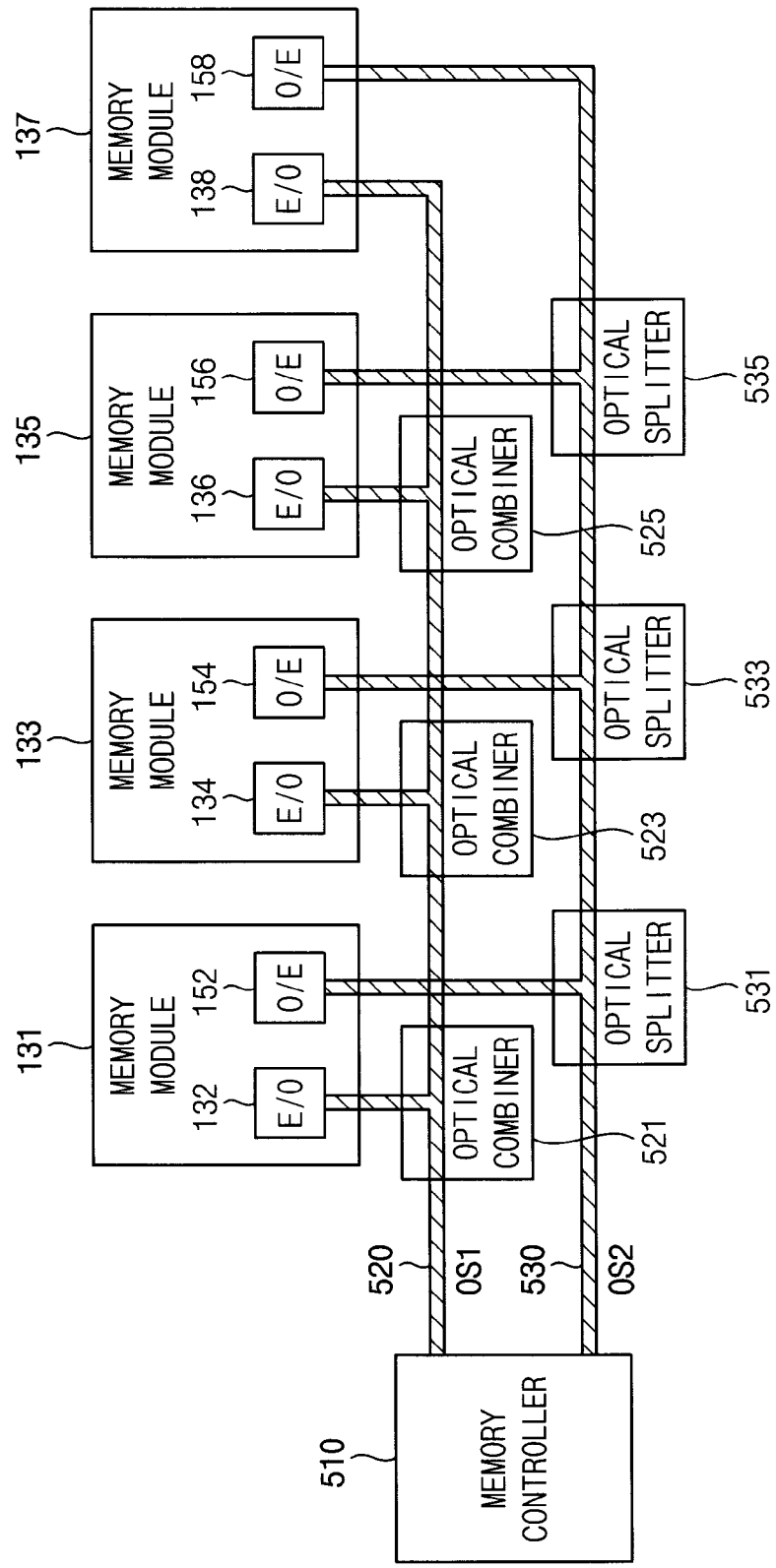
FIG. 11 is a block diagram for describing an optical connection between a memory controller and a plurality of memory modules.

FIG. 11 is a block diagram for describing an optical connection between a memory controller and a plurality of memory modules.

Referring to FIG. 11, a plurality of memory modules 131, 133, 135 and 137 may be coupled to a memory controller 510 in a multi-drop manner. In some example embodiments, the plurality of memory modules 131, 133, 135 and 137 may be coupled to the memory controller 510 through optical couples 521, 523, 525, 531, 533 and 535.

For example, a first optical signal OS1 output from a plurality of electrical-to-optical converting units 132, 134, 136 and 138 included in the plurality of memory modules 131, 133, 135 and 137 may be applied to a first optical transmission line 520 through at least one optical combiner 521, 523, and 525, and the memory controller 510 may receive the first optical signal OS1 through the first optical transmission line 520. The memory controller 510 may apply a second optical signal OS2 to a second optical transmission line 530, and a plurality of optical-to-electrical converting units 152, 154, 156 and 158 included in the plurality of memory modules 131, 133, 135 and 137 may receive the second optical signal OS2 through at least one optical splitter 531, 533 and 535. In some example embodiments, the first and second optical transmission lines 520 and 530 may be implemented by an optical fiber, an optical waveguide, a silicon waveguide, etc.

Although FIG. 11 illustrates an example where the plurality of memory modules 131, 133, 135 and 137 are coupled to the memory controller 510 in a multi-drop manner, according to example embodiments, the plurality of memory modules 131, 133, 135 and 137 are coupled to the memory controller 510 in various manners. In some example embodiments, the plurality of memory modules 131, 133, 135 and 137 are coupled to the memory controller 510 in a daisy chain manner. In this case, the plurality of memory modules 131, 133, 135 and 137 and the memory controller 510 may be coupled to each other by at least one optical switch instead of the optical couples 521, 523, 525, 531, 533 and 535. The optical switch may selectively couple the optical transmission lines 520 and 530 to the plurality of electrical-to-optical converting units 132, 134, 136 and 138 and the plurality of optical-to-electrical converting units 152, 154, 156 and 158. According to example embodiments, each optical switch may be located inside or outside a corresponding electrical-to-optical converting unit or a corresponding optical-to-electrical converting unit.

Figure 12:
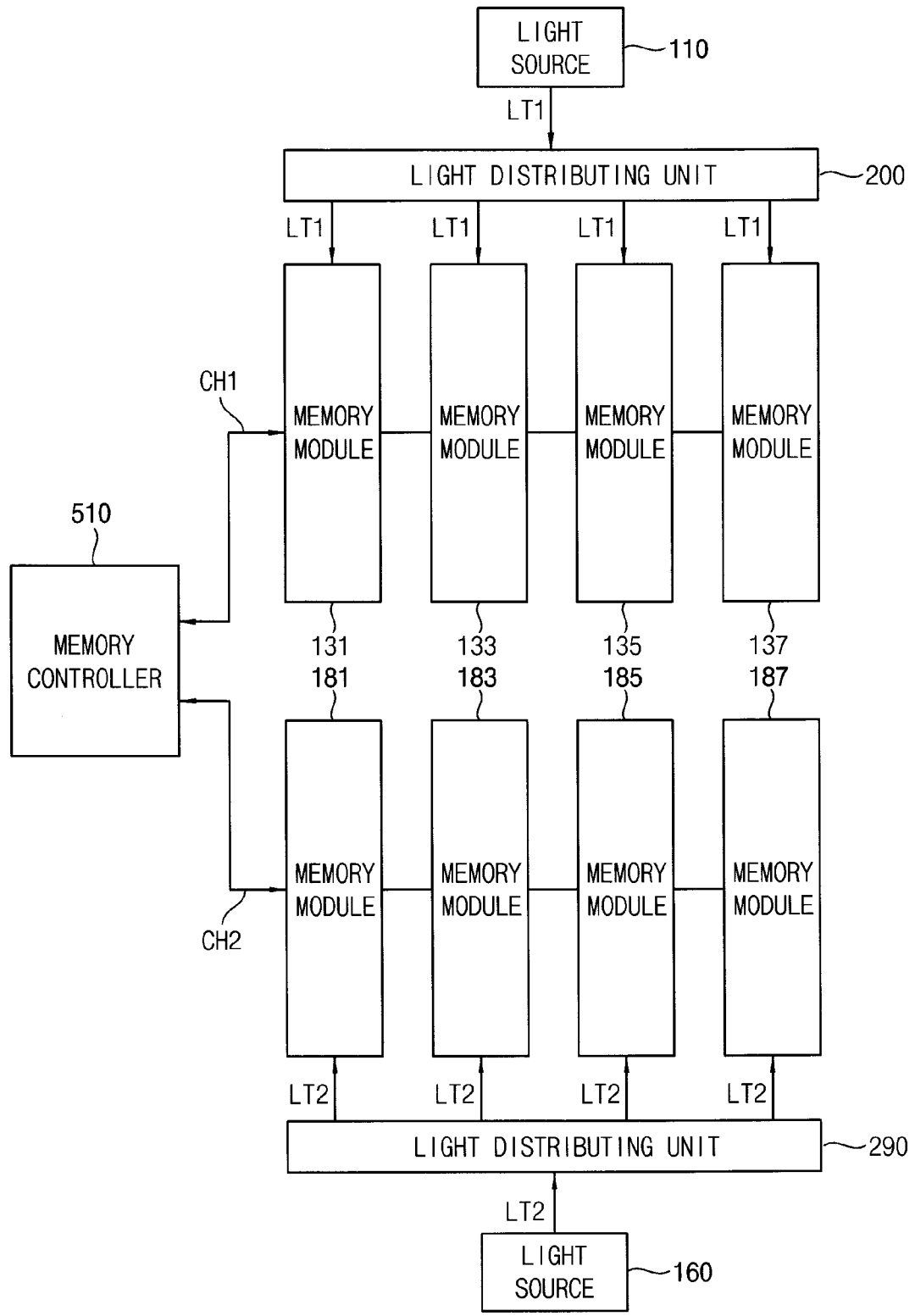
FIG. 12 is a block diagram illustrating an example of a memory controller having a plurality of channels and an optical memory system according to example embodiments.

FIG. 12 is a block diagram illustrating an example of a memory controller having a plurality of channels and an optical memory system according to example embodiments.

Referring to FIG. 12, a memory controller 510 may have a first channel CH1 and a second channel CH2. A plurality of first memory modules 131, 133, 135 and 137 comprising a first group may be coupled to the memory controller 510 through the first channel CH1, and a plurality of second memory modules 181, 183, 185 and 187 comprising a second group may be coupled to the memory controller 510 through the second channel CH2. A first light distributing unit 200 may be coupled between a first light source 110 and the plurality of first memory modules 131, 133, 135 and 137, and a second light distributing unit 290 may be coupled between a second light source 160 and the plurality of second memory modules 181, 183, 185 and 187.

A first light LT1 generated by the first light source 110 may be distributed to the plurality of first memory modules 131, 133, 135 and 137 coupled to the first channel CH1 by the first light distributing unit 200, and the plurality of first memory modules 131, 133, 135 and 137 may generate an optical signal by using the first light LT1 generated by the first light source 110. A second light LT2 generated by the second light source 160 may be distributed to the plurality of second memory modules 181, 183, 185 and 187 coupled to the second channel CH2 by the second light distributing unit 290, and the plurality of second memory modules 181, 183, 185 and 187 may generate an optical signal by using the second light LT2 generated by the second light source 160.

As illustrated in FIG. 12, the memory controller 510 may have a plurality of channels CH1 and CH2, one light source may be provided per channel, and a plurality of memory modules coupled to each channel may share the one light source.

Figure 13:
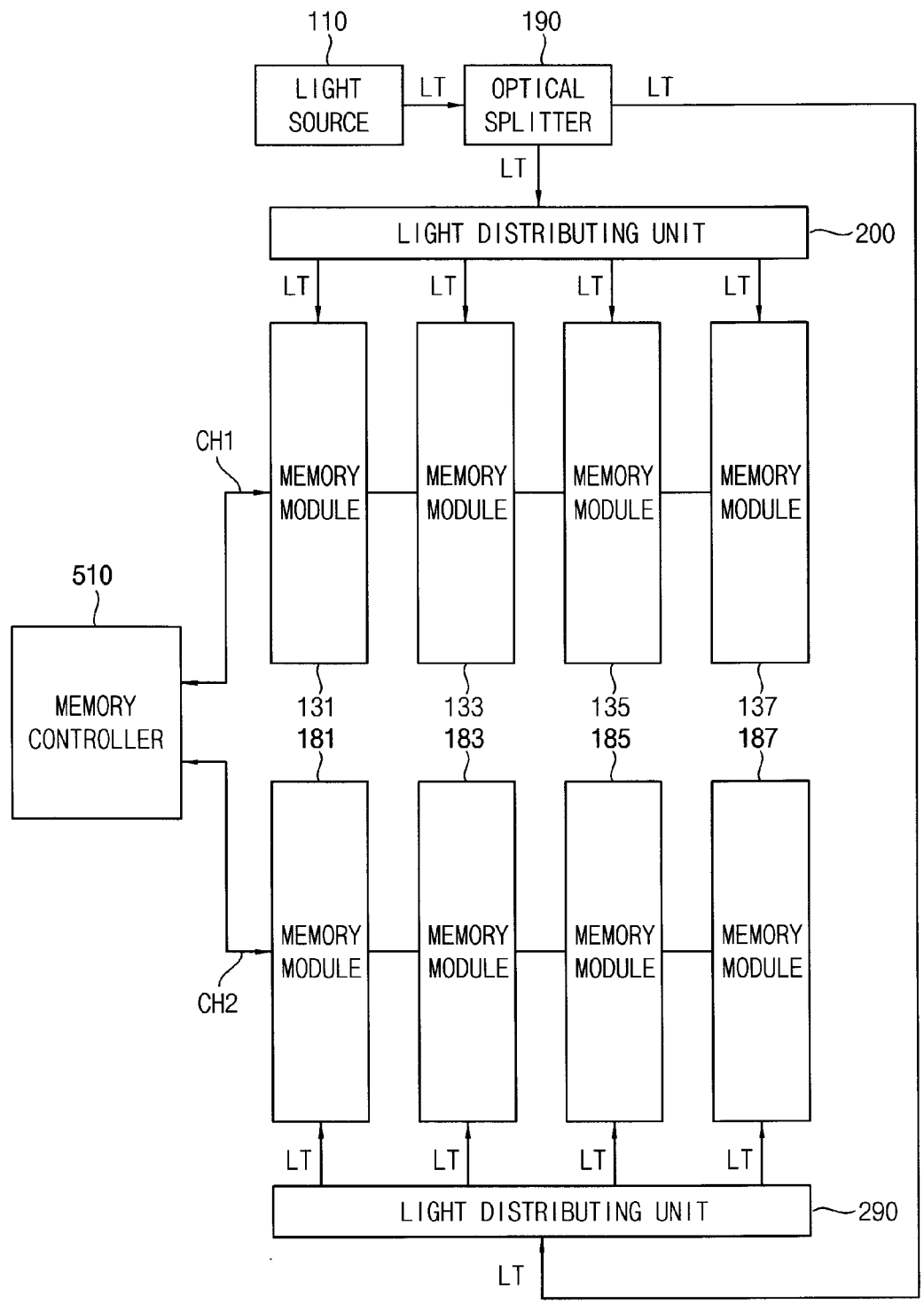
FIG. 13 is a block diagram illustrating another example of a memory controller having a plurality of channels and an optical memory system according to example embodiments.

FIG. 13 is a block diagram illustrating another example of a memory controller having a plurality of channels and an optical memory system according to example embodiments.

Referring to FIG. 13, a memory controller 510 may have a first channel CH1 and a second channel CH2. A plurality of first memory modules 131, 133, 135 and 137 may be coupled to the memory controller 510 through the first channel CH1, and a plurality of second memory modules 181, 183, 185 and 187 may be coupled to the memory controller 510 through the second channel CH2. A light source 110 may be coupled to an optical splitter 190. A first light distributing unit 200 may be coupled between the optical splitter 190 and the plurality of first memory modules 131, 133, 135 and 137, and a second light distributing unit 290 may be coupled between the optical splitter 190 and the plurality of second memory modules 181, 183, 185 and 187. Optical splitter 190 may also be referred to more generally as an additional light distribution unit, which may also include one or more elements (e.g., optical amplifiers).

The optical splitter 190 may split the light LT generated by the light source 110, and may provide the split lights to the first and second light distributing units 200 and 290, respectively. The first light distributing unit 200 may distribute the light LT received from the light source 110 through the optical splitter 190 to the plurality of first memory modules 131, 133, 135 and 137 coupled to the first channel CH1, and the second light distributing unit 290 may distribute the light LT received from the light source 110 through the optical splitter 190 to the plurality of second memory modules 181, 183, 185 and 187 coupled to the second channel CH2.

As illustrated in FIG. 13, one light source 110 may be provided, and all memory modules 131, 133, 135, 137, 181, 183, 185 and 187 may share the one light source 110.

Figure 14:
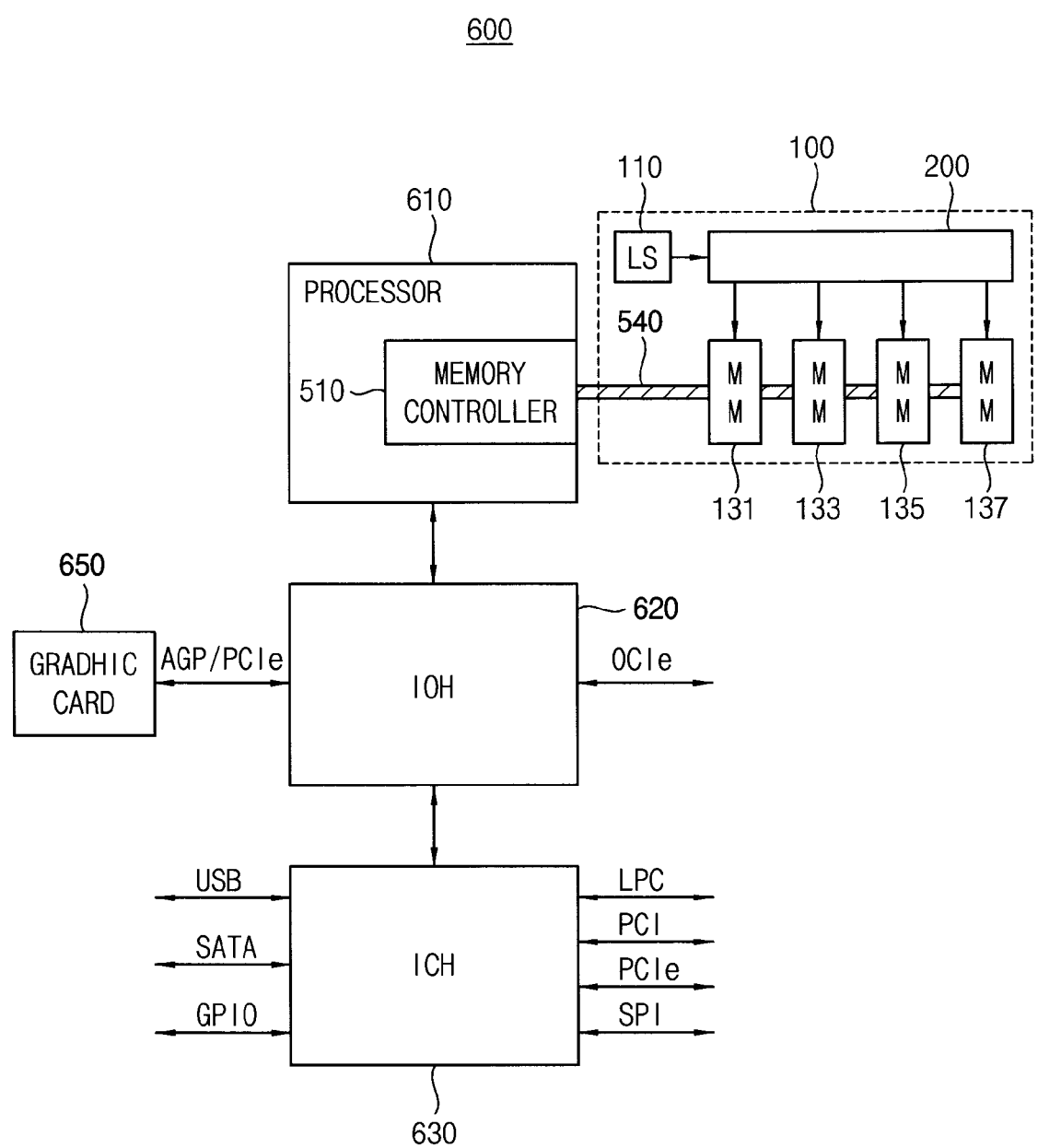
FIG. 14 is a block diagram illustrating a computing system including an optical memory system according to example embodiments.

FIG. 14 is a block diagram illustrating a computing system including an optical memory system according to example embodiments.

Referring to FIG. 14, a computing system 600 includes a processor 610, an input/output hub 620, an input/output controller hub 630, a graphic card 650 and an optical memory system 100. According to example embodiments, the computing system 600 may be any computing system, such as a personal computer (PC), a server computer, a workstation, a tablet computer, a laptop computer, etc.

Figure 15:
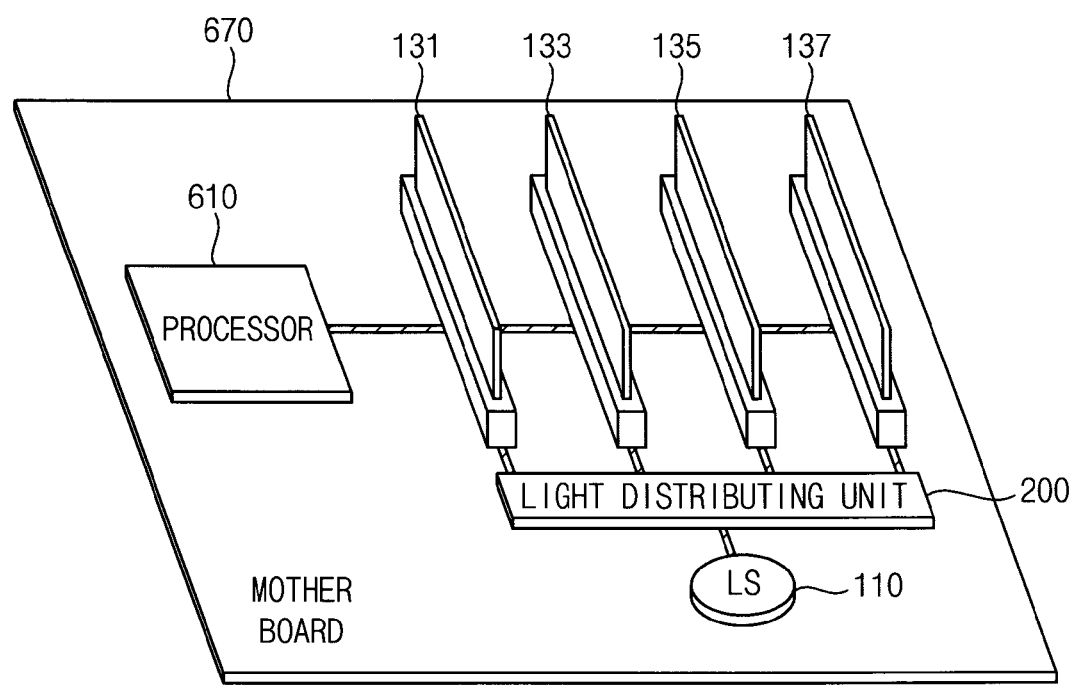
FIG. 15 is a block diagram of an example of a computing system for describing a location of a light source included in an optical memory system according to example embodiments.

The processor 610 may be mounted on a board 670, such as shown, for example, in FIG. 15, such as a motherboard, a main board, or the like. The processor 610 may perform specific calculations or tasks. For example, the processor 610 may be a microprocessor, a central process unit (CPU), a digital signal processor, or the like. The processor 610 may include any number of processor cores. For example, the processor 610 may be a single core processor or a multi-core processor, such as a dual-core processor, a quad-core processor, a hexa-core processor, etc. In an alternative embodiment, the computing system 600 may include a plurality of processors.

The processor 610 may include a memory controller 510 that controls an operation of the optical memory system 100. The memory controller 510 included in the processor 610 may be referred to as an integrated memory controller (IMC). A memory interface between the memory controller 510 and the optical memory system 100 may be implemented by at least one channel including at least one optical transmission line 540. In an alternative embodiment, the memory controller 510 may be included in the input/output hub 620. The input/output hub 620 including the memory controller 510 may be referred to as a memory controller hub (MCH).

The optical memory system 100 may include at least one light source 110, a light distributing unit 200 and a plurality of memory modules 131, 133, 135 and 137. The light distributing unit 200 may distribute a light generated by the light source 110 to the plurality of memory modules 131, 133, 135 and 137. The plurality of memory modules 131, 133, 135 and 137 may generate an optical signal by using the light received from the light source 110 via the light distributing unit 200, and may transmit the optical signal to the memory controller 510 through the optical transmission line 540. According to example embodiments, the light source 110 may be mounted on the board 670 illustrated in FIG. 15, or may be implemented as a rack-type light source located outside the board 670 illustrated in FIG. 15.

The input/output hub 620 may manage data transfer between the processor 610 and devices, such as the graphic card 650. The input/output hub 620 may be coupled to the processor 610 via one of various interfaces including a front side bus (FSB), a system bus, a HyperTransport, a lightning data transport (LDT), a QuickPath interconnect (QPI), and a common system interface (CSI). The input/output hub 620 may provide various interfaces with the devices including an accelerated graphics port (AGP) interface, a peripheral component interface-express (PCIe), and a communications streaming architecture (CSA) interface. In an alternative embodiment, the computing system 600 may include a plurality of input/output hubs. The graphic card 650 may be coupled to the input/output hub 620 via the AGP or the PCIe. The graphic card 650 may control a display device for displaying an image.

The input/output controller hub 630 may perform data buffering and interface arbitration to efficiently operate various system interfaces. The input/output controller hub 630 may be coupled to the input/output hub 620 via various interfaces including a direct media interface (DMI), a hub interface, an enterprise Southbridge interface (ESI), and PCIe. The input/output controller hub 630 may provide various interfaces with peripheral devices. For example, the input/output controller hub 630 may provide a universal serial bus (USB) port, a serial advanced technology attachment (SATA) port, a general purpose input/output (GPIO), a low pin count (LPC) bus, a PCI, and a PCIe.

As described above, in the computing system 600 according to example embodiments, the memory controller 510 and the optical memory system 100 may be coupled through the optical transmission line 540. Accordingly, in the computing system 600 according to example embodiments, an impedance mismatch may not occur, and signal integrity may not deteriorate although the number of memory modules 131, 133, 135 and 137 coupled to the memory controller 510 increases. Further, in the computing system 600 according to example embodiments, the plurality of memory modules 131, 133, 135 and 137 may share the light source 110, thereby readily increasing the number of memory modules and readily increasing a system memory capacity.

FIG. 15 is a block diagram of an example of a computing system for describing a location of a light source included in an optical memory system according to example embodiments.

Referring to FIG. 15, a computing system 600a includes a board 670, a processor 610 and an optical memory system.

The optical memory system may include a light source 110, a light distributing unit 200 and a plurality of memory modules 131, 133, 135 and 137.

For example, the board 670 may be a motherboard, a main board, or the like. The processor 610 may be mounted on the board 670, and may include a memory controller that controls the optical memory system. The light distributing unit 200 may distribute a light generated by the light source 110 to the plurality of memory modules 131, 133, 135 and 137. The plurality of memory modules 131, 133, 135 and 137 may generate an optical signal by using the light received from the light source 110 via the light distributing unit 200.

As illustrated in FIG. 15, the light source 110 may be located outside each memory module 131, 133, 135 and 137, and may be mounted on the board 670. The memory modules 131, 133, 135 and 137 may share the light source 110 mounted on the board 670.

Figure 16:
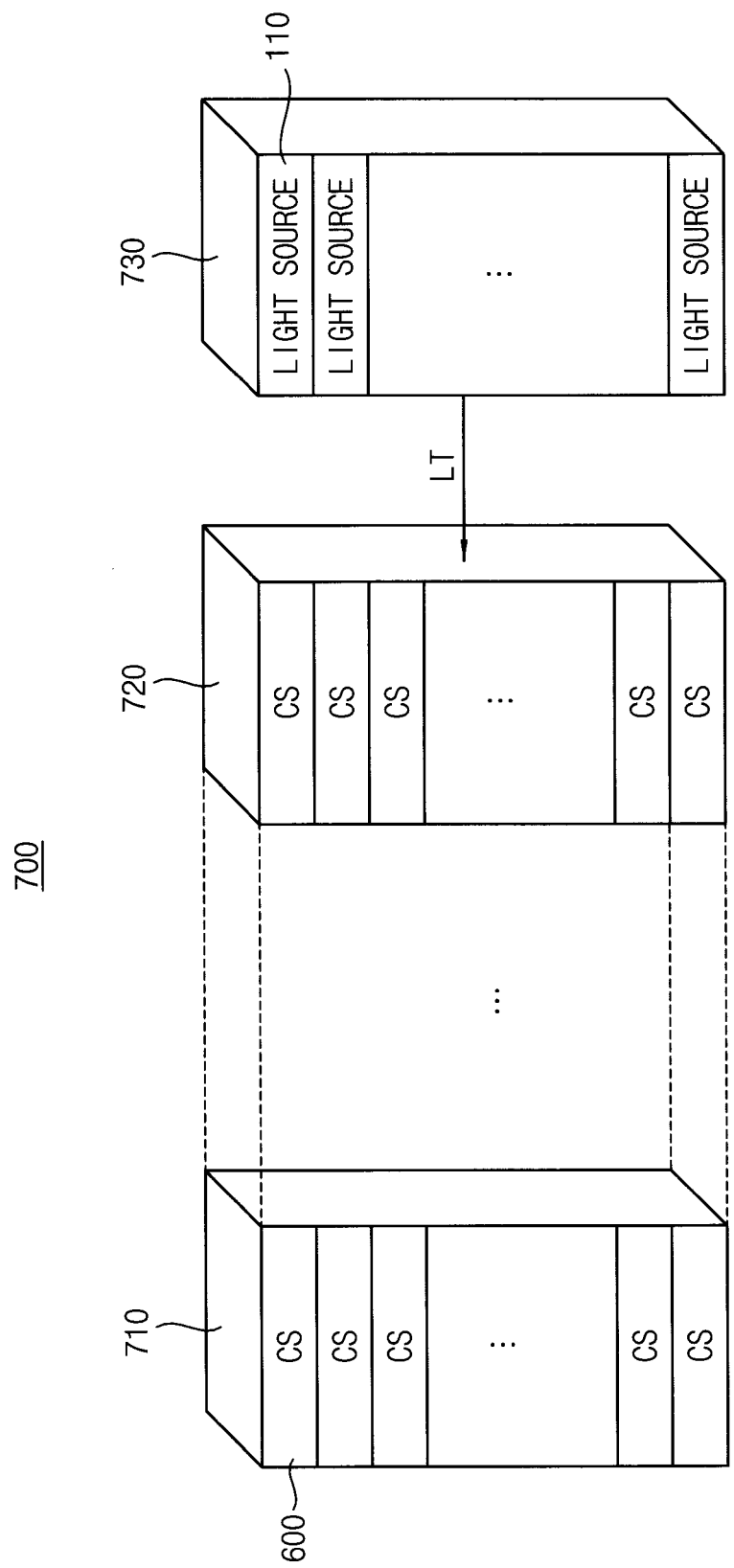
FIG. 16 is a block diagram of an example of a server system for describing a location of a light source included in an optical memory system according to example embodiments.

FIG. 16 is a block diagram of an example of a server system for describing a location of a light source included in an optical memory system according to example embodiments.

Referring to FIG. 16, a server system 700 may include a plurality of racks 710 and 720 where a plurality of computing systems 600 are mounted, and at least one rack 730 where a plurality of light sources 110 are mounted.

Each light source 110 may be implemented as a rack-type light source located outside a board of a computing system 600. Lights generated by the plurality of light sources 110 mounted into the rack 730 may be provided to the plurality of computing systems 600 mounted into the plurality of racks 710 and 720.

Figure 17:
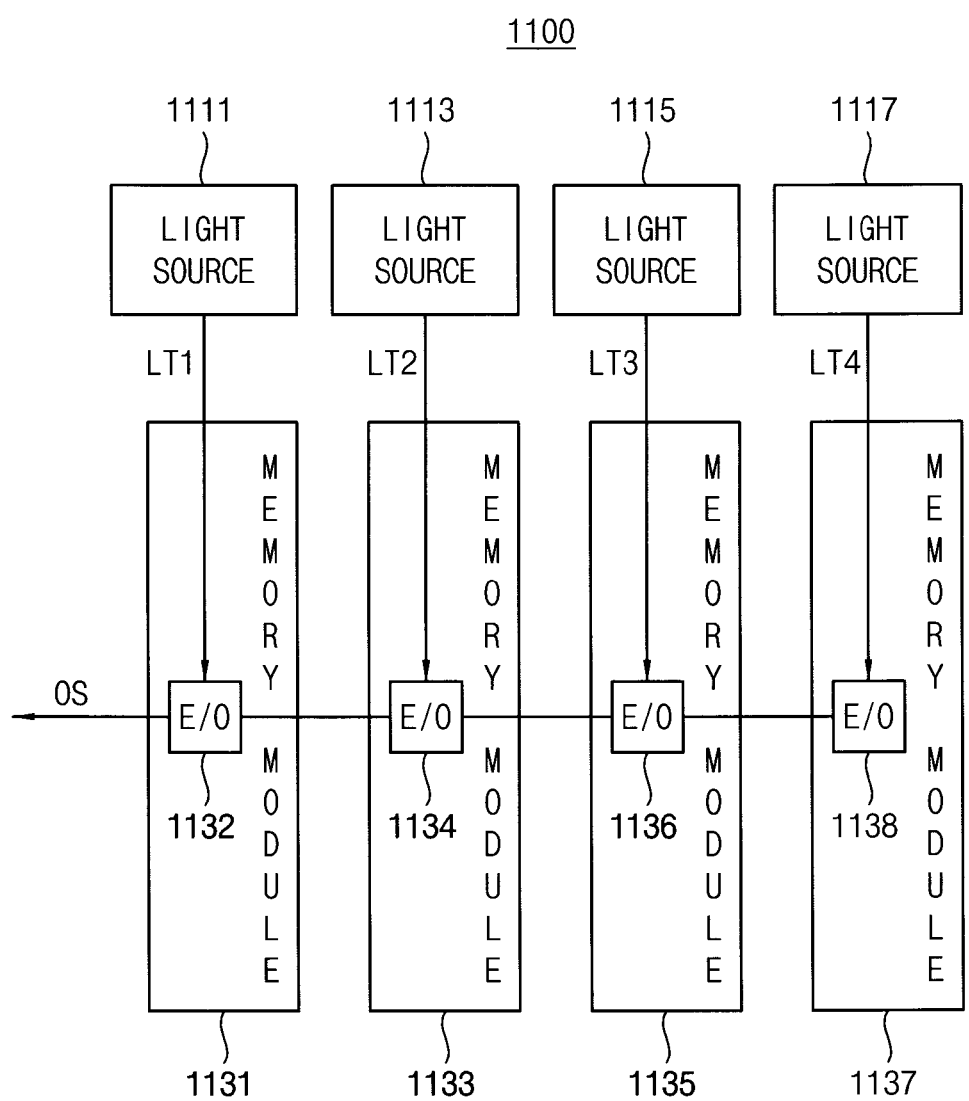
FIG. 17 is a block diagram illustrating an optical memory system according to example embodiments.

FIG. 17 is a block diagram illustrating an optical memory system according to example embodiments.

Referring to FIG. 17, an optical memory system 1100 may include a plurality of light sources 1111, 1113, 1115 and 1117 and a plurality of memory modules 1131, 1133, 1135 and 1137.

The plurality of light sources 1111, 1113, 1115 and 1117 may generate a plurality of lights LT1, LT2, LT3 and LT4, respectively. The plurality of light sources 1111, 1113, 1115 and 1117 may be coupled to the plurality of memory modules 1131, 1133, 1135 and 1137, respectively, and may provide the plurality of lights LT1, LT2, LT3 and LT4 to the plurality of memory modules 1131, 1133, 1135 and 1137, respectively. For example, a first light source 1111 may be coupled to a first memory module 1131, and may provide a first light LT1 to a first electrical-to-optical converting unit 1132 included in the first memory module 1131. A second light source 1113 may be coupled to a second memory module 1133, and may provide a second light LT2 to a second electrical-to-optical converting unit 1134 included in the second memory module 1132. A third light source 1115 may be coupled to a third memory module 1135, and may provide a third light LT3 to a third electrical-to-optical converting unit 1136 included in the third memory module 1135. A fourth light source 1117 may be coupled to a fourth memory module 1137, and may provide a fourth light LT4 to a fourth electrical-to-optical converting unit 1138 included in the fourth memory module 1137. As illustrated in FIG. 17, the optical memory system 1100 may include one light source per memory module.

According to example embodiments, each electrical-to-optical converting unit 1132, 1134, 1136 and 1138 may be implemented as an electrical-to-optical converting unit 300 of FIG. 8 or an electrical-to-optical converting unit 400 of FIG. 9. According to example embodiments, each light source 1111, 1113, 1115 and 1117 may be located inside a corresponding memory module, may be mounted on a board of a computing system, or may be located outside the board of the computing system. The light sources may provide light that is used by the electrical-to-optical converting units to convert an electrical signal into an optical signal.

Figure 18:
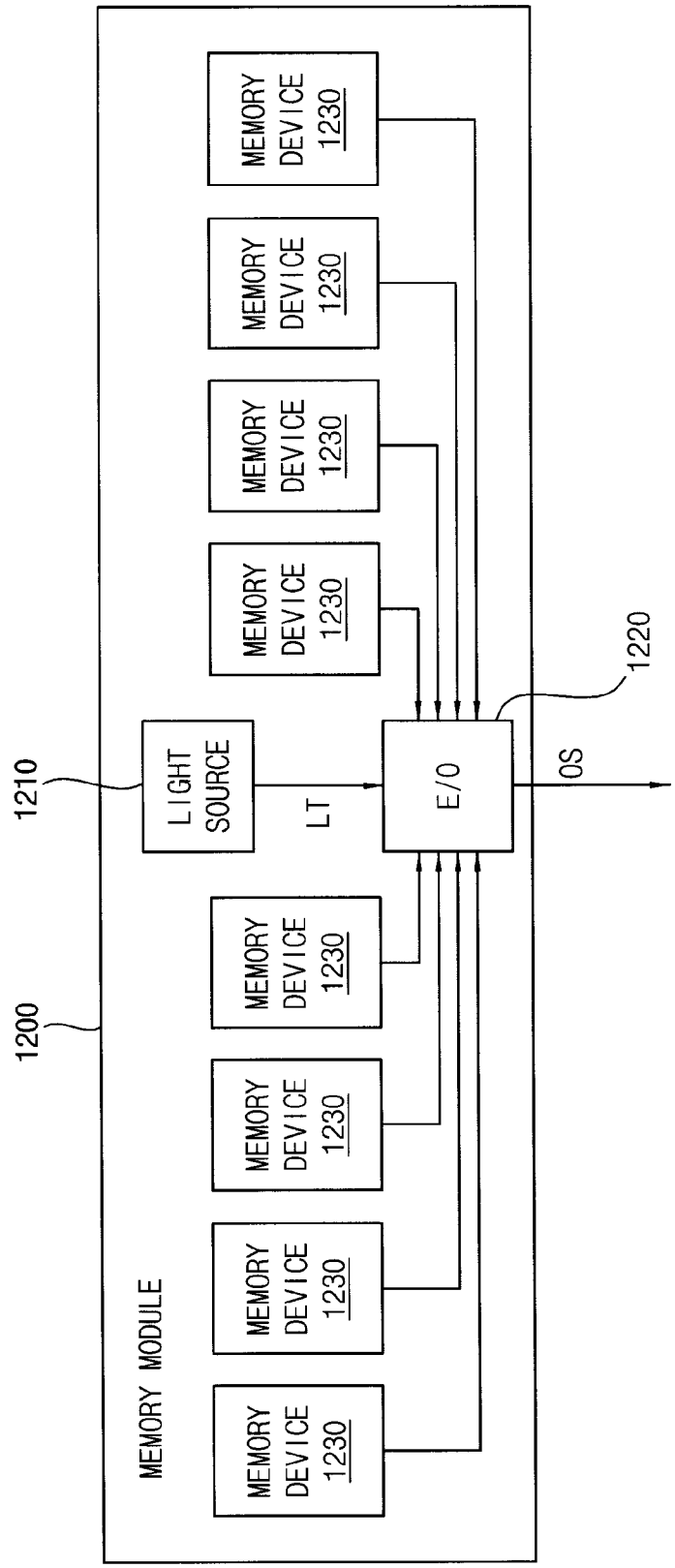
FIG. 18 is a block diagram of an example of a memory module for describing a location of a light source included in an optical memory system according to example embodiments.

FIG. 18 is a block diagram of an example of a memory module for describing a location of a light source included in an optical memory system according to example embodiments.

Referring to FIG. 18, a memory module 1200 may include a plurality of memory devices 1230 (e.g., memory chips, chip stack packages, package on package devices, etc.), an electrical-to-optical converting unit 1220 and a light source 1210. In some example embodiments, each memory module 1131, 1133, 1135 and 1137 may be implemented as the memory module 1200 of FIG. 18.

The light source 1210 may generate a light LT, and the electrical-to-optical converting unit 1220 may convert an electrical signal output from the plurality of memory devices 1230 into an optical signal OS by using the light LT generated by the light source 1210. As illustrated in FIG. 18, the light source 1210 may be located inside the memory module 1210, or may be mounted on the memory module 1210.

Figure 19:
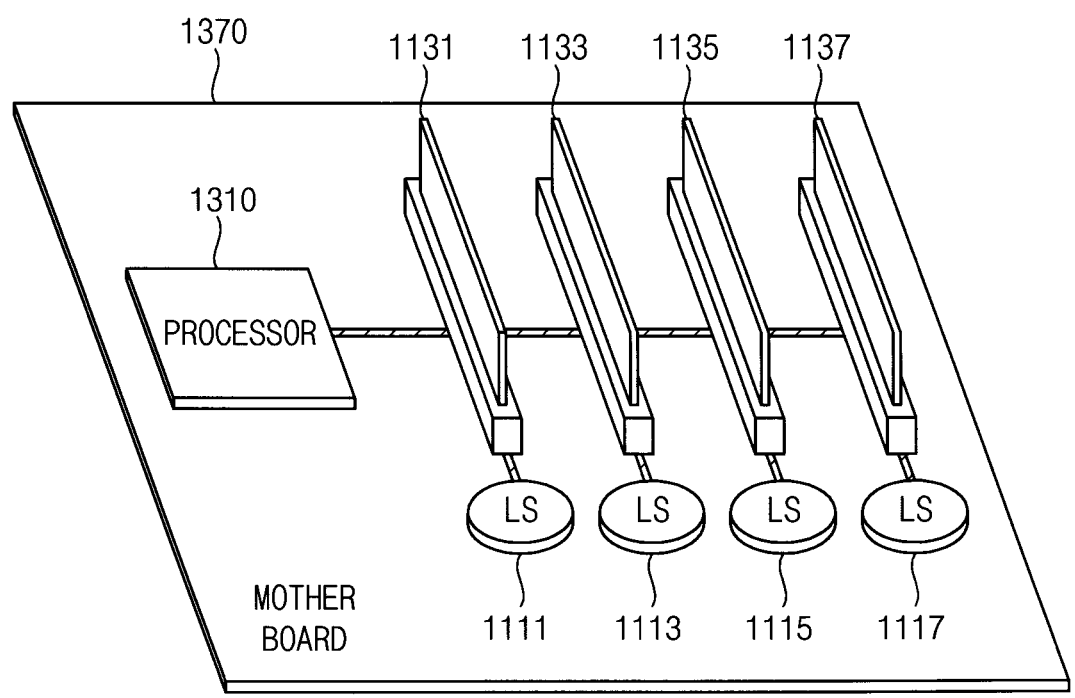
FIG. 19 is a block diagram of an example of a computing system for describing a location of a light source included in an optical memory system according to example embodiments.

FIG. 19 is a block diagram of an example of a computing system for describing a location of a light source included in an optical memory system according to example embodiments.

Referring to FIG. 19, a computing system 1300 includes a board 1370, a processor 1310 and an optical memory system. The optical memory system may include a plurality of light sources 1111, 1113, 1115 and 1117 and a plurality of memory modules 1131, 1133, 1135 and 1137.

The processor 1310 may be mounted on the board 1370, and may include a memory controller that controls the optical memory system. Each light source 1111, 1113, 1115 and 1117 may be coupled to a corresponding one of the plurality of memory modules 1131, 1133, 1135 and 1137, and may provide a light to the corresponding one of the plurality of memory modules 1131, 1133, 1135 and 1137.

In some example embodiments, as illustrated in FIG. 19, the plurality of light sources 1111, 1113, 1115 and 1117 may be located outside the plurality of memory modules 1131, 1133, 1135 and 1137, and may be mounted on the board 1370. In other example embodiments, as illustrated in FIG. 16, the plurality of light sources 1111, 1113, 1115 and 1117 may be implemented as rack-type light sources located outside the board 1370. Alternatively, as shown in FIG. 18, a light source may be included in one or more of the memory modules.

Figure 20:
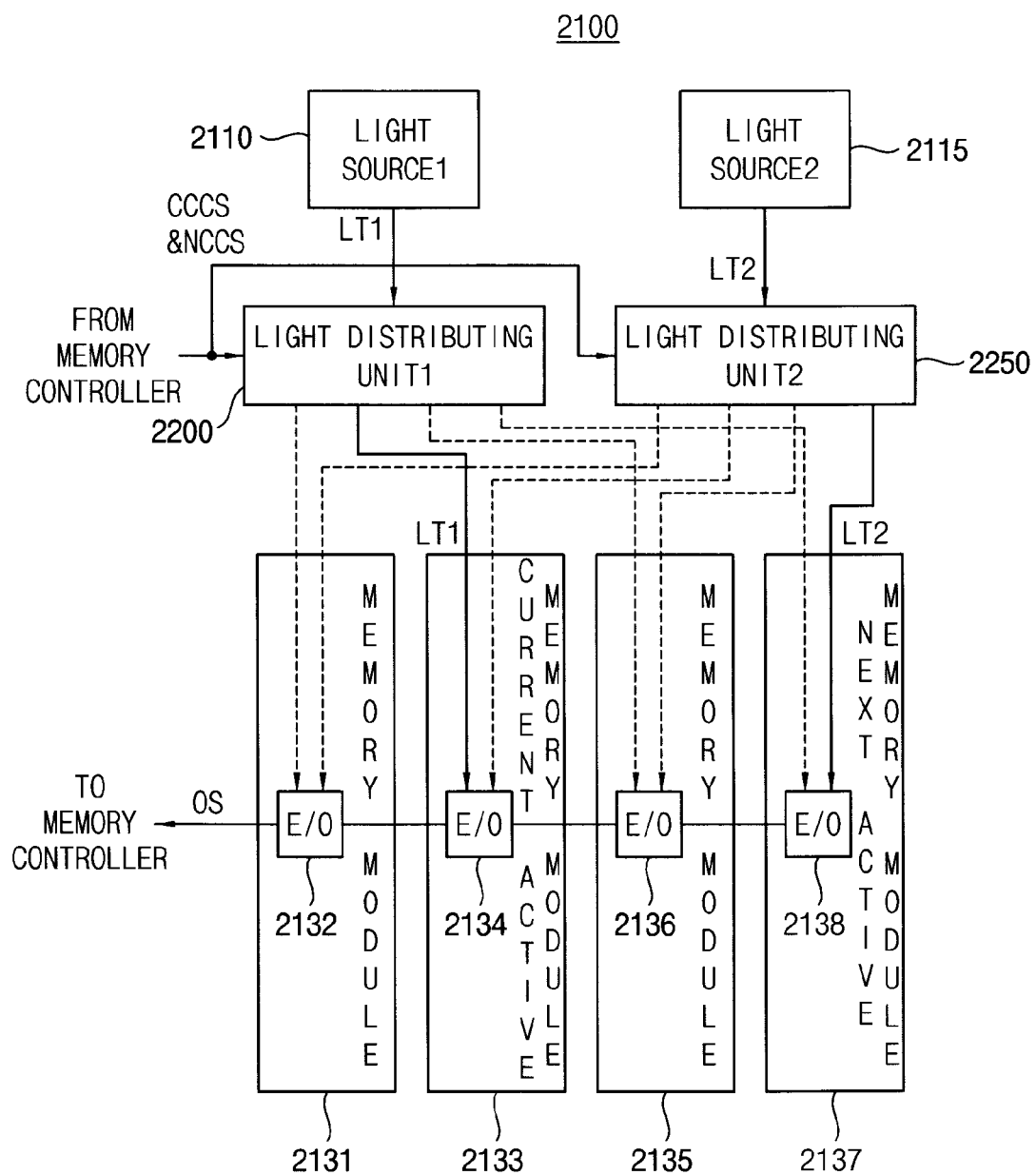
FIG. 20 is a block diagram illustrating an optical memory system according to example embodiments.

FIG. 20 is a block diagram illustrating an optical memory system according to example embodiments.

Referring to FIG. 20, an optical memory system 2100 may include a first light source 2110, a second light source 2115, a plurality of memory modules 2131, 2133, 2135 and 2137, a first light distributing unit 2200 and a second light distributing unit 2250.

The first light source 2110 may generate a first light LT1, and the second light source 2115 may generate a second light LT2. The first light distributing unit 2200 may be coupled between the first light source 2110 and the plurality of memory modules 2131, 2133, 2135 and 2137, and may distribute the first light LT1 generated by the first light source 2110 to the plurality of memory modules 2131, 2133, 2135 and 2137. The second light distributing unit 2250 may be coupled between the second light source 2115 and the plurality of memory modules 2131, 2133, 2135 and 2137, and may distribute the second light LT2 generated by the second light source 2115 to the plurality of memory modules 2131, 2133, 2135 and 2137. According to example embodiments, each of the first and second light distributing units 2200 and 2250 may be implemented as a light distributing unit 200d illustrated in FIG. 5, a light distributing unit 200e illustrated in FIG. 6 or a light distributing unit 200e illustrated in FIG. 7 that provides a light only to a selected one of the plurality of memory modules 2131, 2133, 2135 and 2137.

In response to a control signal from a memory controller, the first and second light distributing units 2200 and 2250 may provide one of the first light LT1 and the second light LT2 to a current active memory module among the plurality of memory modules 2131, 2133, 2135 and 2137, and may provide the other one of the first light LT1 and the second light LT2 to a next active memory module among the plurality of memory modules 2131, 2133, 2135 and 2137. For example, one of the first light LT1 and the second light LT2 may be provided to the current active memory module, and the other one of the first light LT1 and the second light LT2 may be provided to the next active memory module. Accordingly, even if a switching speed of a light distributing unit is slower than a selection speed of a memory module (or even if a switching latency of a light distributing unit is longer than a selection latency of a memory module), light may be provided to the active memory module in time.

For example, if a second memory module 2133 is currently in an active state (or the second memory module 2133 currently performs a read operation), and a fourth memory module 2137 will be in an active state in a subsequent step (or the fourth memory module 2137 will perform the read operation in a subsequent step), the first and second light distributing units 2200 and 2250 may receive a current chip select signal CCCS indicating that the second memory module 2133 is in an active state and a next chip select signal NCCS indicating that the fourth memory module 2137 will be in an active state in a subsequent step from the memory controller. The first light distributing unit 2200 may provide the first light LT1 to the second memory module 2133 in response to the current chip select signal CCCS indicating the second memory module 2133, and the second light distributing unit 2250 may start in advance to provide the second light LT2 to the fourth memory module 2137 in response to the next chip select signal NCCS indicating the fourth memory module 2137.

After the read operation of the second memory module 2133 is completed, if the fourth memory module 2137 is currently in an active state, and a first memory module 2131 will be in active state in a subsequent step, the first and second light distributing units 2200 and 2250 may receive the current chip select signal CCCS indicating that the fourth memory module 2137 is in an active state and the next chip select signal NCCS indicating that the first memory module 2131 will be in an active state next time from the memory controller. The second light distributing unit 2250 may continue to provide the second light LT2 to the fourth memory module 2137 in response to the current chip select signal CCCS indicating the fourth memory module 2137, and the first light distributing unit 2200 may start to provide the first light LT1 to the first memory module 2131 in response to the next chip select signal NCCS indicating the first memory module 2131.

Each memory module 2131, 2133, 2135 and 2137 may include a plurality of memory devices, may convert an electrical signal output from the plurality of memory devices into an optical signal OS by using either the first light LT1 or the second light LT2, and may output the optical signal OS to the memory controller. Each memory module 2131, 2133, 2135 and 2137 may include an electrical-to-optical converting unit 2132, 2134, 2136 and 2138. Each electrical-to-optical converting unit 2132, 2134, 2136 and 2138 may receive one of the first light LT1 and the second light LT2, and may generate the optical signal OS by modulating the received light in response to the electrical signal. The optical signal OS output from each electrical-to-optical converting unit 2132, 2134, 2136 and 2138 may be provided to the memory controller through an optical transmission line.

As described above, in the optical memory system 2100 according to example embodiments, one of the first light LT1 and the second light LT2 may be provided to the current active memory module, and the other one of the first light LT1 and the second light LT2 may be provided to the next active memory module. Accordingly, even if the switching speed of the light distributing unit is slow, the light may be provided to the active memory module in time.

Figure 21:
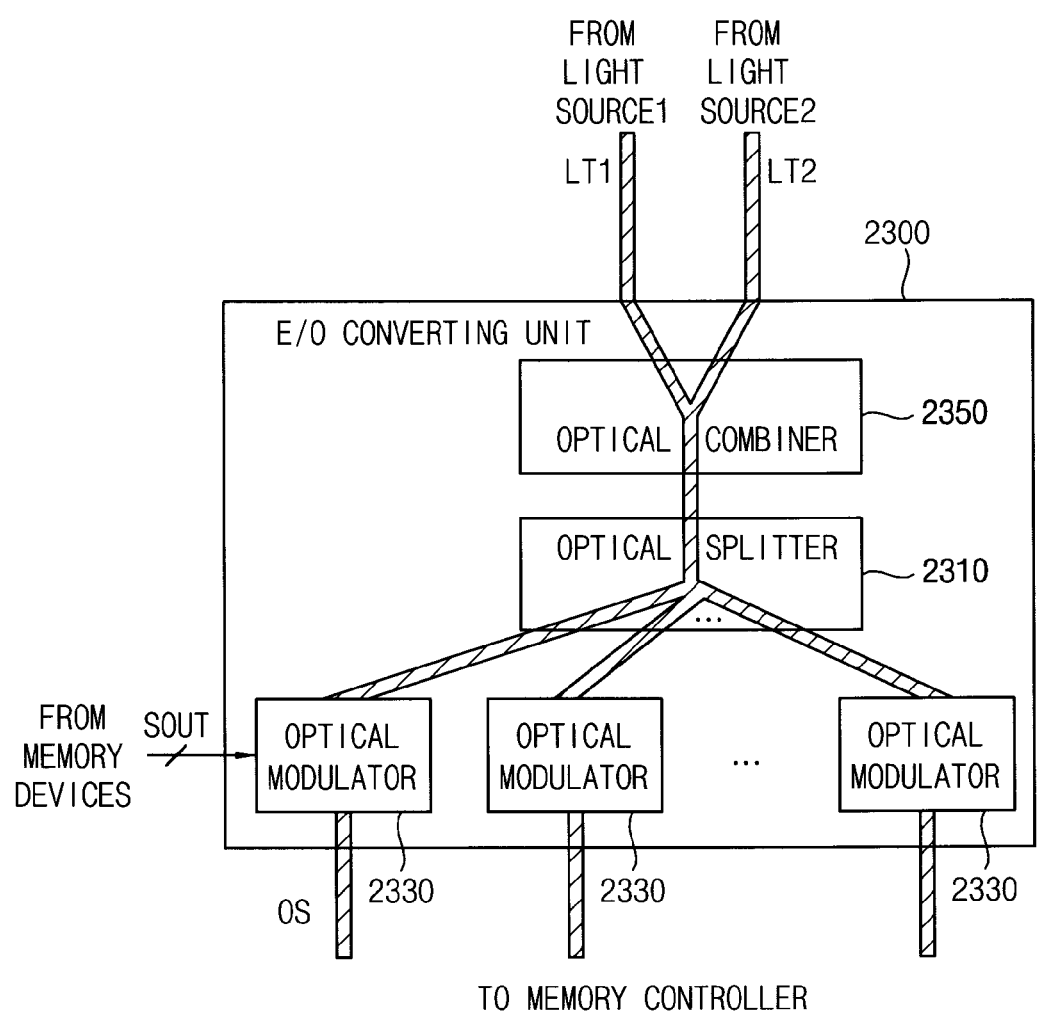
FIG. 21 is a block diagram illustrating an example of an electrical-to-optical converting unit included in a memory module according to example embodiments.

FIG. 21 is a block diagram illustrating an example of an electrical-to-optical converting unit included in a memory module according to example embodiments.

Referring to FIG. 21, an electrical-to-optical converting unit 2300 includes an optical combiner 2350, an optical splitter 2310 and a plurality of optical modulators 2330. In some example embodiments, an electrical-to-optical converting unit 2132, 2134, 2136 and 2138 included in each memory module 2131, 2133, 2135 and 2137 illustrated in FIG. 20 may be implemented as the electrical-to-optical converting unit 2300 of FIG. 21.

The optical combiner 2350 may receive a first light LT1 from a first light source via a first light distributing unit, and may receive a second light LT2 from a second light source via a second light distributing unit. The optical combiner 2350 may generate a combined light by combining the first light LT1 generated by the first light source and the second light LT2 generated by the second light source, and may provide the combined light to the optical splitter 2310. Accordingly, since the optical combiner 2350 provides the optical splitter 2310 with the combined light where the first light LT1 and the second light LT2 are combined, the combined light provided to the optical splitter 2310 may have a desired optical power although only one of the first light LT1 and the second light LT2 is provided to the optical combiner 2350.

The optical splitter 2310 may divide the combined light received from the optical combiner 2350 into a plurality of lights, and may provide the plurality of lights to the plurality of optical modulators 2330, respectively. The plurality of optical modulators 2330 may receive electrical signals SOUT output from a plurality of memory devices included in a memory module where the electrical-to-optical converting unit 2300 is located, and may generate a plurality of optical signals OS by modulating the plurality of lights based on the electrical signals SOUT.

Figure 22:
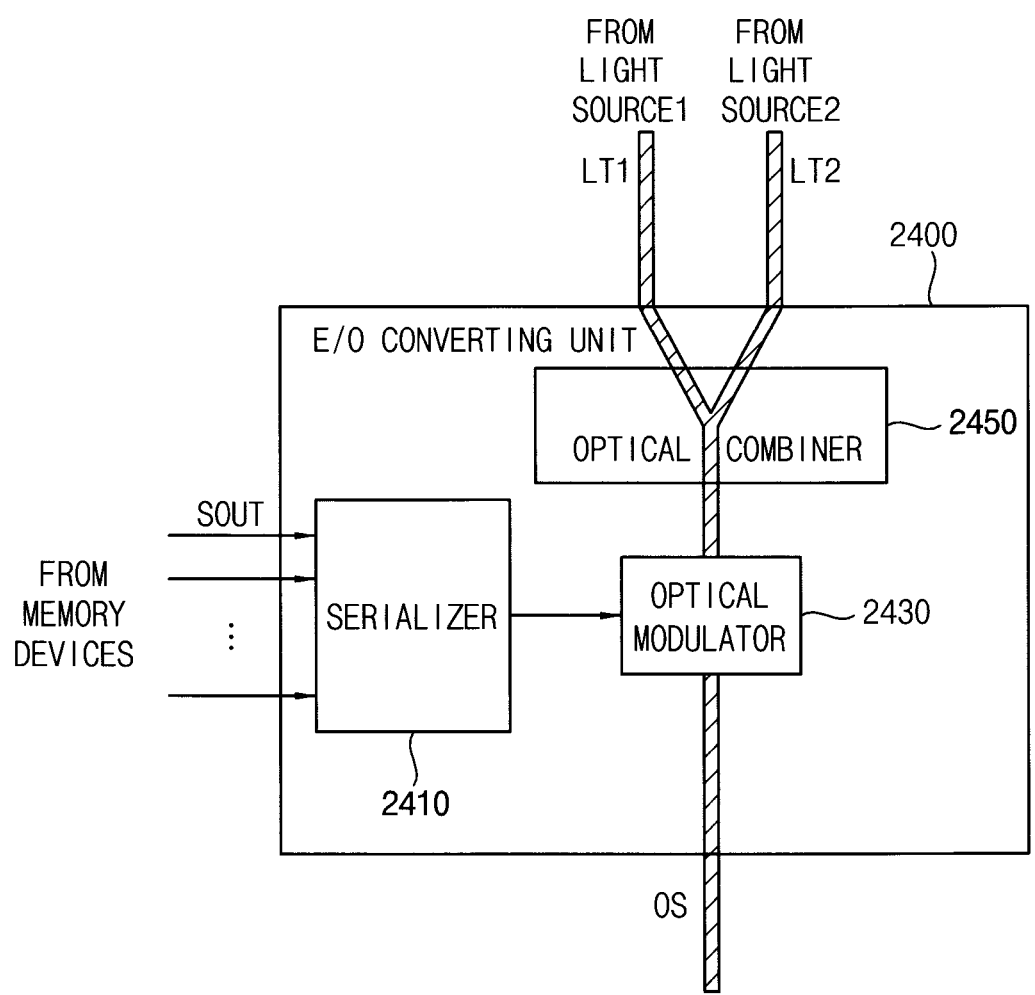
FIG. 22 is a block diagram illustrating another example of an electrical-to-optical converting unit included in a memory module according to example embodiments.

FIG. 22 is a block diagram illustrating another example of an electrical-to-optical converting unit included in a memory module according to example embodiments.

Referring to FIG. 22, an electrical-to-optical converting unit 2400 includes an optical combiner 2450, a serializer 2410 and an optical modulator 2430. In some example embodiments, an electrical-to-optical converting unit 2132, 2134, 2136 and 2138 included in each memory module 2131, 2133, 2135 and 2137 illustrated in FIG. 20 may be implemented as the electrical-to-optical converting unit 2400 of FIG. 22.

The optical combiner 2450 may receive a first light LT1 from a first light source via a first light distributing unit, and may receive a second light LT2 from a second light source via a second light distributing unit. The optical combiner 2450 may generate a combined light by combing the first light LT1 generated by the first light source and the second light LT2 generated by the second light source, and may provide the combined light to the optical modulator 2430. Accordingly, since the optical combiner 2450 provides the optical modulator 2430 with the combined light where the first light LT1 and the second light LT2 are combined, the combined light provided to the optical modulator 2430 may have a desired optical power although only one of the first light LT1 and the second light LT2 is provided to the optical combiner 2450.

The serializer 2410 may generate a serial signal by serializing electrical signals SOUT output from a plurality of memory devices included in a memory module where the electrical-to-optical converting unit 2400 is located. The optical modulator 2430 may receive the serial signal from the serializer 2410, and may receive the combined light from the optical combiner 2450. The optical modulator 2430 may generate an optical signal OS by modulating the combined light based on the serial signal.

Figure 23:
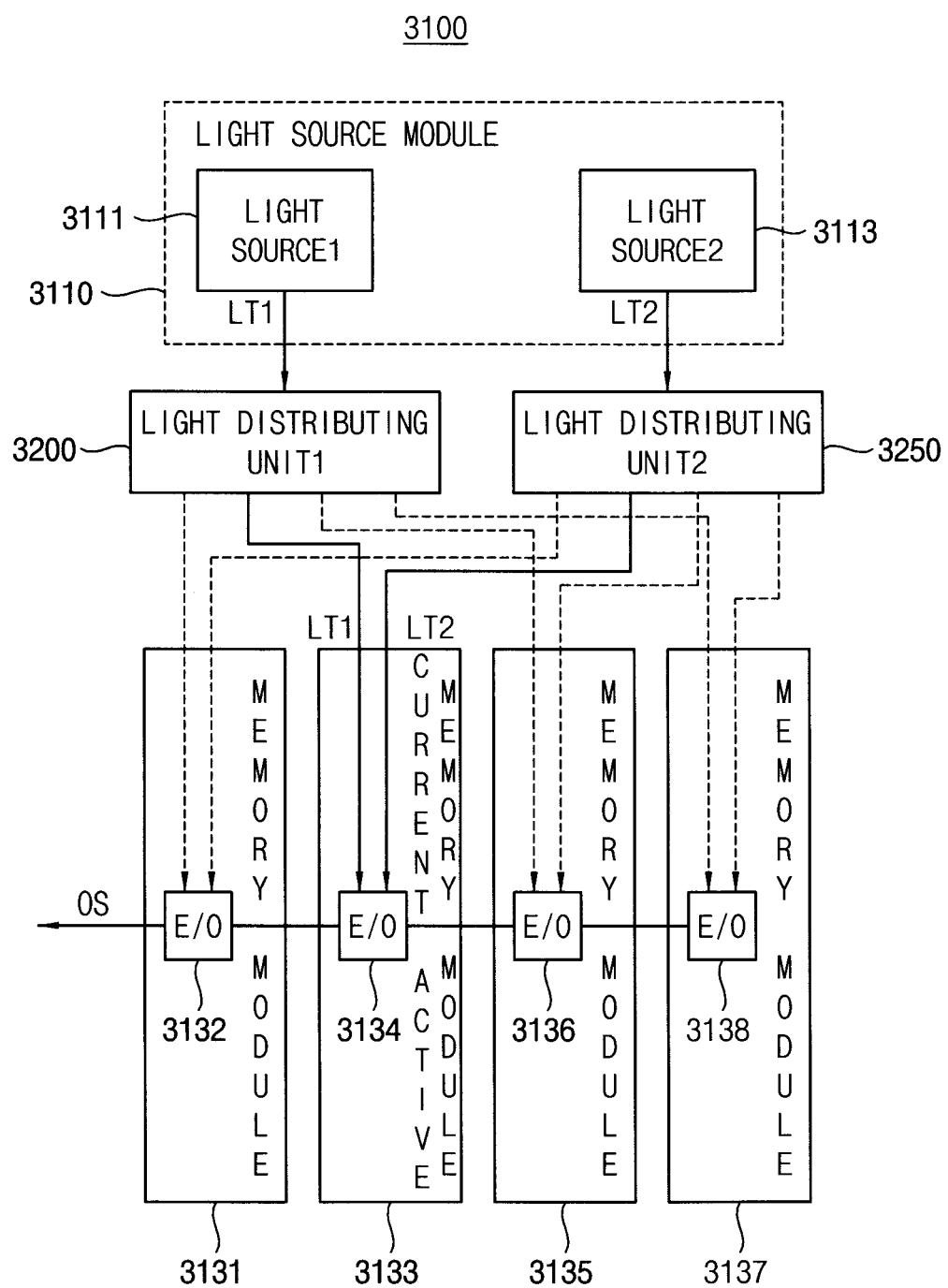
FIG. 23 is a block diagram illustrating an optical memory system according to example embodiments.

FIG. 23 is a block diagram illustrating an optical memory system according to example embodiments.

Referring to FIG. 23, an optical memory system 3100 includes a light source module 3110, a plurality of memory modules 3131, 3133, 3135 and 3137 and a plurality of light distributing units 3200 and 3250.

The light source module 3110 may include a plurality of light sources 3111 and 3113. The plurality of light sources 3111 and 3113 may generate a plurality of lights LT1 and LT2, respectively. Each light distributing unit 3200 and 3250 may be coupled between a corresponding one of the plurality of light sources 3111 and 3113 and the plurality of memory modules 3131, 3133, 3135 and 3137, and may distribute a light generated by the corresponding one of the plurality of light sources 3111 and 3113 to the plurality of memory modules 3131, 3133, 3135 and 3137. According to example embodiments, each of the plurality of light distributing units 3200 and 3250 may be implemented as a light distributing unit 200*d* illustrated in FIG. 5, a light distributing unit 200*e* illustrated in FIG. 6 or a light distributing unit 200*e* illustrated in FIG. 7 that provides a light only to a selected one of the plurality of memory modules 3131, 3133, 3135 and 3137.

For example, the light source module 3110 may include a first light source 3111 and a second light source 3113, the plurality of light distributing units 3200 and 3250 may include a first light distributing unit 3200 and a second light distributing unit 3250. The light source module 3110 may be, for example, an array of light sources arranged adjacent to each other. Each light source of the light source module 3110 may be arranged to connect to an optical transmission line that is part of a bundle of lines that includes a bundled plurality of optical transmission lines. The first light distributing unit 3200 may be coupled between the first light source 3111 and the plurality of memory modules 3131, 3133, 3135 and 3137, and may distribute a first light LT1 generated by the first light source 3111 to the plurality of memory modules 3131, 3133, 3135 and 3137. The second light distributing unit 3250 may be coupled between the second light source 3113 and the plurality of memory modules 3131, 3133, 3135 and 3137, and may distribute a second light LT2 generated by the second light source 3113 to the plurality of memory modules 3131, 3133, 3135 and 3137.

Each memory module 3131, 3133, 3135 and 3137 may include a plurality of memory devices, may convert an electrical signal output from the plurality of memory devices into an optical signal OS by using the plurality of lights LT1 and LT2 generated by the plurality of light sources 3111 and 3113, and may output the optical signal OS to a memory controller. Each memory module 3131, 3133, 3135 and 3137 may include an electrical-to-optical converting unit 3132, 3134, 3136 and 3138. Each electrical-to-optical converting unit 3132, 3134, 3136 and 3138 may receive the plurality of lights LT1 and LT2 from the plurality of light sources 3111 and 3113 via the plurality of light distributing units 3200 and 3250, and may generate the optical signal OS by modulating the plurality of lights LT1 and LT2 based on the electrical signal output from the plurality of memory devices. The optical signal OS output from each electrical-to-optical converting unit 3132, 3134, 3136 and 3138 may be provided to the memory controller through an optical transmission line.

In some embodiments, the plurality of memory devices included in each memory module 3131, 3133, 3135 and 3137 may be grouped into a plurality of memory device groups, and the plurality of lights LT1 and LT2 generated by the plurality of light sources 3111 and 3113 may be used to perform electrical-to-optical conversions for the plurality of memory device groups, respectively.

For example, each memory module 3131, 3133, 3135 and 3137 may include a first memory device group including a portion (e.g., half) of the plurality of memory devices and a second memory device group including another portion (e.g., half) of the plurality of memory devices. The first light LT1 generated by the first light source 3111 may be used to convert a first electrical signal output from the first memory device group into a first optical signal, and the second light LT2 generated by the second light source 3113 may be used to convert a second electrical signal output from the second memory device group into a second optical signal. The optical memory system 3100 according to example embodiments may include, for each module, as many light sources as the number of memory device groups included in one memory module, and each light source 3111 and 3113 may be shared by corresponding memory device groups respectively included across a plurality of memory modules 3131, 3133, 3135 and 3137. Thus, each light source may be shared by a plurality of memory modules 3131, 3133, 3135, and 3137. For example, each light source may be shared by a first memory device group in a first memory module, a second memory device group in a second memory module, a third memory device in a third memory module, etc.

Each memory module 3131, 3133, 3135 and 3137 may include at least one rank, the rank may be divided into a plurality of sub-ranks of which each includes at least one memory device, and the plurality of memory device groups may correspond to the plurality of sub-ranks. For example, the optical memory system 3100 may include as many light sources as the number of sub-ranks included in one rank, and each light source may be shared by corresponding sub-ranks respectively included across a plurality of memory modules 3131, 3133, 3135 and 3137.

As described above, in the optical memory system 3100 according to example embodiments, the plurality of lights LT1 and LT2 generated by the plurality of light sources 3111 and 3113 may be distributed to the plurality of memory modules 3131, 3133, 3135 and 3137 by the plurality of light distributing units 3200 and 3250, and thus the plurality of memory modules 3131, 3133, 3135 and 3137 may share the plurality of light sources 3111 and 3113. Accordingly, compared to a conventional optical memory system including one light source per memory module, the optical memory system 3100 according to example embodiments may have the reduced number of light sources, thereby reducing a cost and power consumption of the optical memory system 3100.

Figure 24:
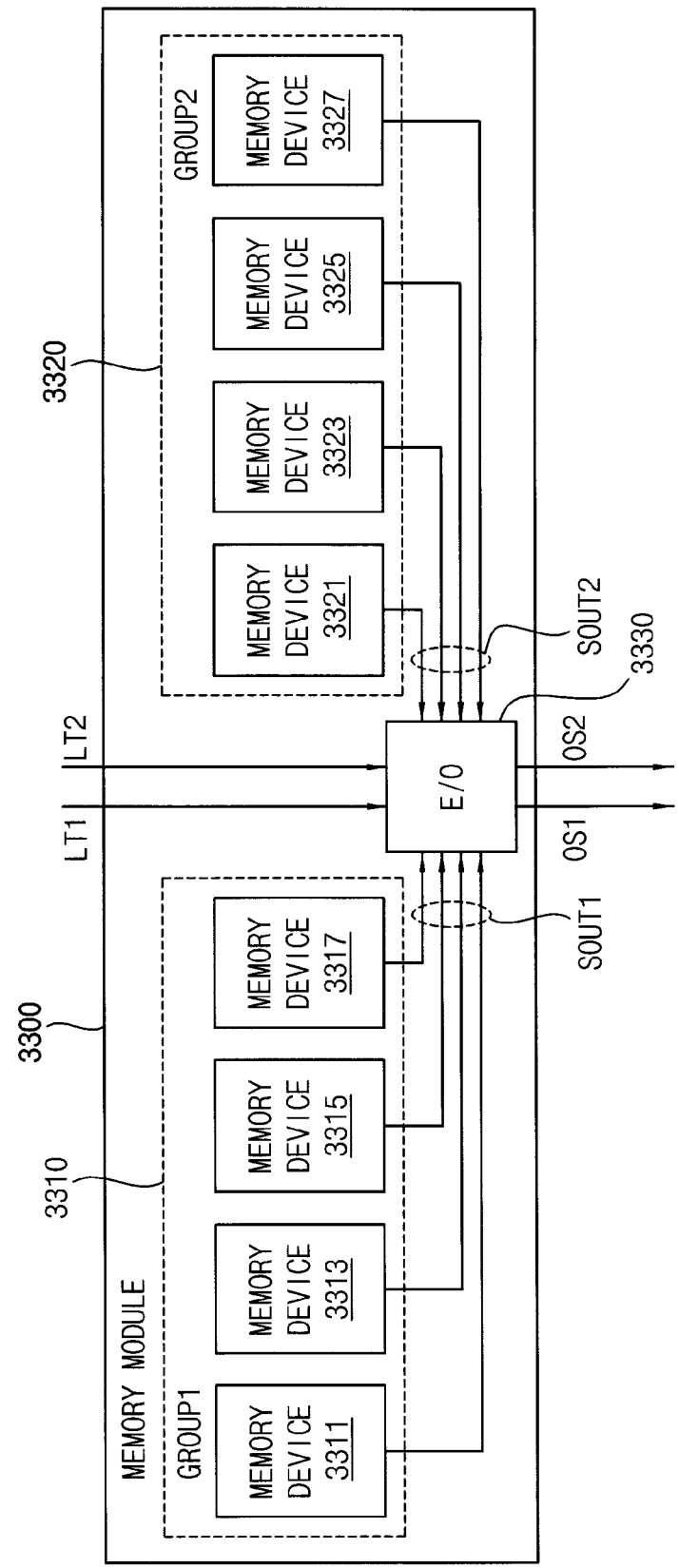
FIG. 24 is a block diagram illustrating an example of a memory module included in an optical memory system of FIG. 23.

FIG. 24 is a block diagram illustrating an example of a memory module included in an optical memory system of FIG. 23.

Referring to FIGS. 23 and 24, a memory module 3300 may include a first memory device group 3310 including first through fourth memory devices 3311, 3313, 3315 and 3317, a second memory device group 3320 including fifth through eighth memory devices 3321, 3323, 3325 and 3327 and an electrical-to-optical converting unit 3330. In some example embodiments, each memory module 3131, 3133, 3335 and 3137 may be implemented as the memory module 3300 of FIG. 24.

The electrical-to-optical converting unit 3330 may receive a first electrical signal from the first memory device group 3310, may receive a second electrical signal from the second memory device group 3320, may receive a first light LT1 derived from a first light source 3111 via a first light distributing unit 3200, and may receive a second light LT2 derived from a second light source 3113 via a second light distributing unit 3250. For example, each of the first light LT1 and the second light LT2 may be a split light created by a splitter, a light created by a switch being closed, or other means within a light distributing unit that receives a light from a light source. As discussed herein, a light LT derived from a light source can be a light directly obtained from the light source, or a light obtained from the light source through, for example, one or more optical switches, optical splitters, wave division demultiplexers, or other light distributing units. The electrical-to-optical converting unit 3330 may generate a first optical signal OS1 by modulating the first light LT1 based on a first electrical signal SOUT1 output from the first memory device group 3310, and may generate a second optical signal OS2 by modulating the second light LT2 based on a second electrical signal SOUT2 output from the second memory device group 3320. As such, the first light LT1 derived from the first light source 3111 may be used to convert the first electrical signal SOUT1 output from the first memory device group 3310 into the first optical signal OS1, and the second light LT2 derived from the second light source 3113 may be used to convert the second electrical signal SOUT2 output from the second memory device group 3320 into the second optical signal OS2. The plurality of memory device groups 3310 and 3320 may correspond to a plurality of sub-ranks included in one rank, an optical memory system may include as many light sources as the number of sub-ranks included in one rank, and each light source may be shared by corresponding sub-ranks respectively included in a plurality of memory modules.

Although FIG. 24 illustrates an example where each memory module 3300 includes two memory device groups 3310 and 3320, in some example embodiments, each memory module 3300 may include three or more memory device groups. In this case, a light source module 3110 may include three or more light sources.

Figure 25A:
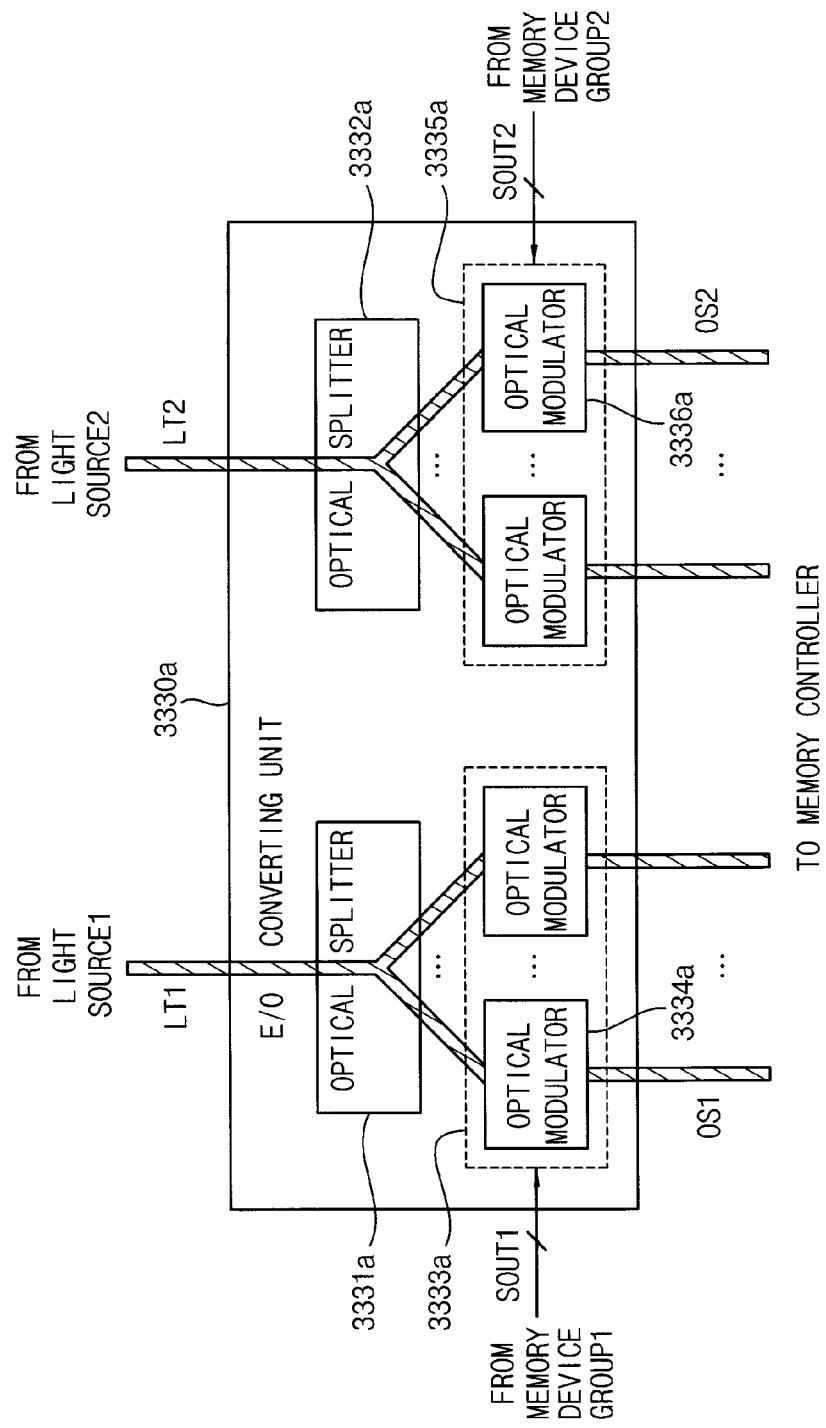
FIG. 25A is a block diagram illustrating an example of an electrical-to-optical converting unit included in a memory module according to example embodiments.

FIG. 25A is a block diagram illustrating an example of an electrical-to-optical converting unit included in a memory module according to example embodiments.

Referring to FIGS. 23 through 25, in one embodiment, an electrical-to-optical converting unit 3330a includes a first optical splitter 3331a, a first optical modulating unit 3333a, a second optical splitter 3332a, and a second optical modulating unit 3335a. The first optical modulating unit 3333a may include a plurality of first optical modulators 3334a, and the second optical modulating unit 3335a may include a plurality of second optical modulators 3336a. In some example embodiments, an electrical-to-optical converting unit 3132, 3134, 3136, 3138 and 3330 included in each memory module 3131, 3133, 3135, 3137 and 3300 illustrated in FIGS. 23 and 24 may be implemented as the electrical-to-optical converting unit 3330a of FIG. 25.

The first optical splitter 3331a may split a first light LT1 derived from a first light source 3111 via a first light distributing unit 3200 into a plurality of third lights, and may provide the plurality of third lights to a plurality of first optical modulators 3334*a* included in the first optical modulating unit 3333*a*, respectively. The plurality of first optical modulators 3334*a* may receive first electrical signals SOUT1 from a first memory device group 3310, and may generate a plurality of first optical signals OS1 by modulating the plurality of third lights based on the first electrical signals SOUT1. The plurality of first optical modulators 3334*a* may provide the plurality of first optical signals OS1 to a memory controller.

The second optical splitter 3332*a* may split a second light LT2 derived from a second light source 3113 via a second light distributing unit 3250 into a plurality of fourth lights, and may provide the plurality of fourth lights to a plurality of second optical modulators 3336*a* included in the second optical modulating unit 3335*a*, respectively. The plurality of second optical modulators 3336*a* may receive second electrical signals SOUT2 from a second memory device group 3320, and may generate a plurality of second optical signals OS2 by modulating the plurality of fourth lights based on the second electrical signals SOUT2. The plurality of second optical modulators 3336*a* may provide the plurality of second optical signals OS2 to the memory controller.

Figure 25B:
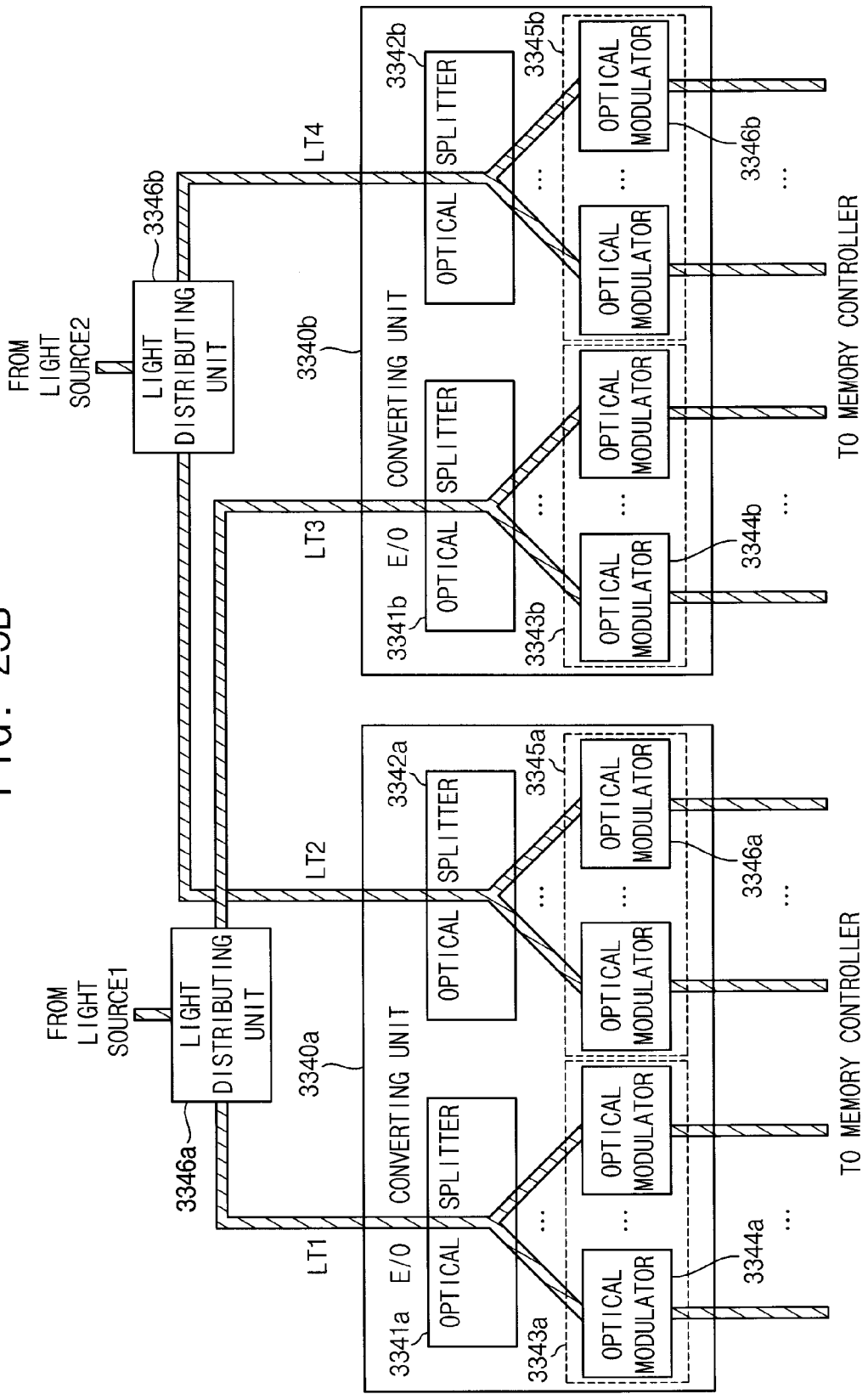
FIG. 25B is a block diagram illustrating an example of two electrical-to-optical converting units connected to common light sources according to example embodiments.

FIG. 25B is a block diagram illustrating an example of two electrical-to-optical converting units connected to common light sources according to example embodiments. In the example shown in FIG. 25B, each of the electrical-to-optical converting units 3340*a* and 3340*b* have the same configuration as the electrical-to-optical converting unit 3330*a* of FIG. 25A. Other configurations may be implemented as well. As shown in FIG. 25B, certain optical modulators (e.g., 3344*a* and 3344*b*) across both electrical-to-optical converting units 3340*a* and 3340*b* share a first common light source (light source 1), and other optical modulators (e.g., 3345*a* and 3345*b*) across both electrical-to-optical converting units 3340*a* and 3340*b* share a second common light source (light source 2). Each of the common light sources may connect to the respective converting units 3340*a* and 3340*b* through a respective light distributing unit 3346*a* and 3346*b*, such as described above in connection with FIGS. 2-7.

Figure 26:
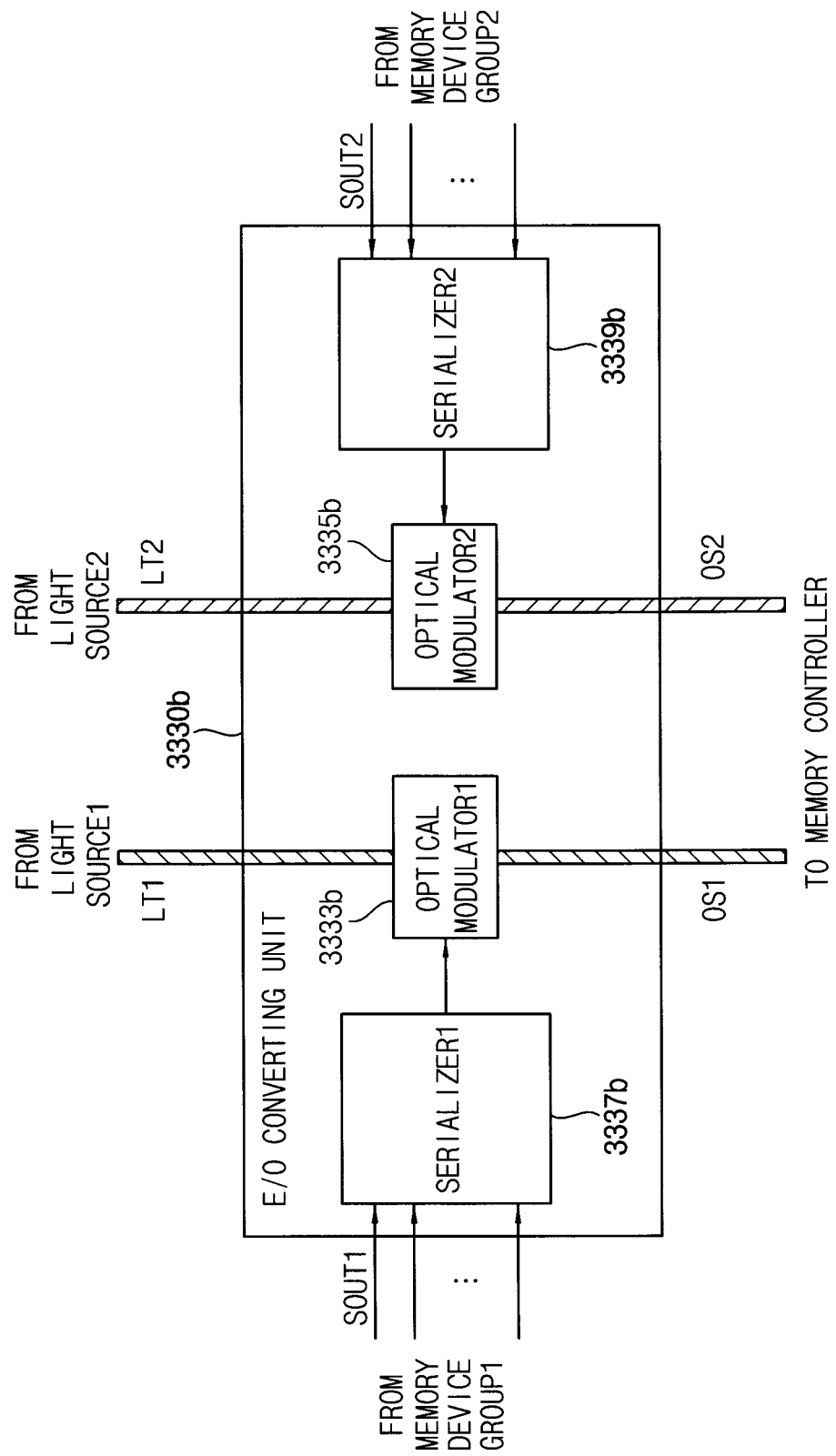
FIG. 26 is a block diagram illustrating another example of an electrical-to-optical converting unit included in a memory module according to example embodiments.

FIG. 26 is a block diagram illustrating another example of an electrical-to-optical converting unit included in a memory module according to example embodiments.

Referring to FIGS. 23, 24 and 26, an electrical-to-optical converting unit 3330*b* includes a first serializer 3337*b*, a first optical modulator 3333*b*, a second serializer 3339*b* and a second optical modulator 3335*b*. In some example embodiments, an electrical-to-optical converting unit 3132, 3134, 3136, 3138 and 3330 included in each memory module 3131, 3133, 3135, 3137 and 3300 illustrated in FIGS. 23 and 24 may be implemented as the electrical-to-optical converting unit 3330*b* of FIG. 26.

The first serializer 3337*b* may generate a first serial signal by serializing first electrical signals SOUT1 output from a first memory device group 3310, and may provide the first serial signal to the first optical modulator 3333*b*. The first optical modulator 3333*b* may receive the first serial signal from the first serializer 3337*b*, and may receive a first light LT1 derived from a first light source 3111 via a first light distributing unit 3200. The first optical modulator 3333*b* may generate a first optical signal OS1 by modulating the first light LT1 based on the first serial signal, and may provide the first optical signal OS1 to a memory controller.

The second serializer 3339*b* may generate a second serial signal by serializing second electrical signals SOUT2 output from a second memory device group 3320, and may provide the second serial signal to the second optical modulator 3335*b*. The second optical modulator 3335*b* may receive the second serial signal from the second serializer 3339*b*, and may receive a second light LT2 derived from a second light source 3113 via a second light distributing unit 3200. The second optical modulator 3335*b* may generate a second optical signal OS2 by modulating the second light LT2 based on the second serial signal, and may provide the second optical signal OS2 to the memory controller.

Figure 27:
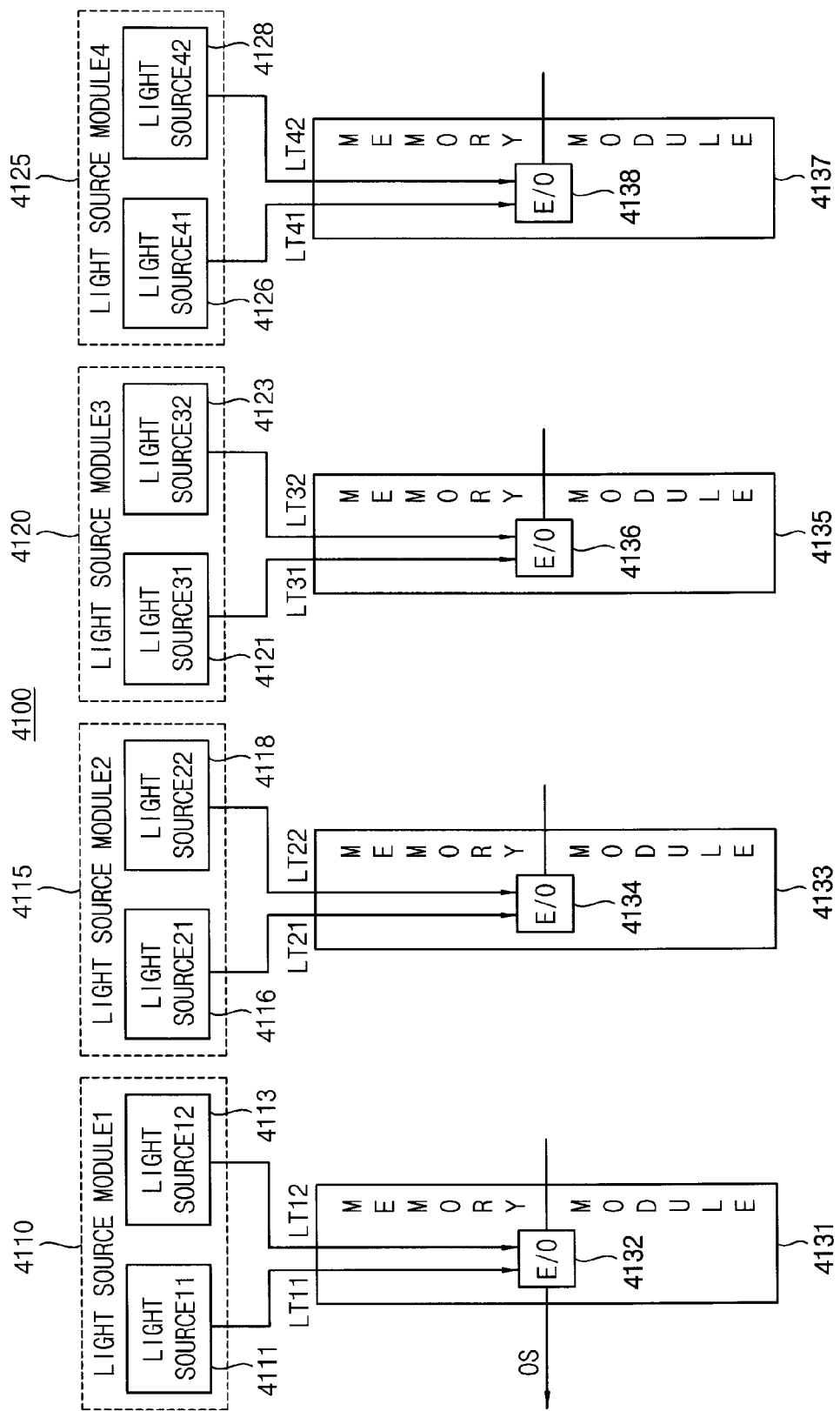
FIG. 27 is a block diagram illustrating an optical memory system according to example embodiments.

FIG. 27 is a block diagram illustrating an optical memory system according to example embodiments.

Referring to FIG. 27, an optical memory system 4100 may include a plurality of light source modules 4110, 4115, 4120 and 4125 and a plurality of memory modules 4131, 4133, 4135 and 4137.

The plurality of light source modules 4110, 4115, 4120 and 4125 may be coupled to the plurality of memory modules 4131, 4133, 4135 and 4137, respectively. Each light source module 4110, 4115, 4120 and 4125 may provide a plurality of lights LT11, LT12, LT21, LT22, LT31, LT32, LT41 and LT42 to a memory module coupled to the light source module 4110, 4115, 4120 and 4125. Each light source module 4110, 4115, 4120 and 4125 may include as many light sources 4111, 4113, 4116, 4118, 4121, 4123, 4126 and 4128 as memory device groups included in one memory module. For example, each memory module 4131, 4133, 4135 and 4137 may include two memory device groups, and each light source module 4110, 4115, 4120 and 4125 may include two light sources 4111, 4113, 4116, 4118, 4121, 4123, 4126 and 4128 generating two lights LT11, LT12, LT21, LT22, LT31, LT32, LT41 and LT42, respectively.

For example, a first memory module 4131 may include a first memory device group and a second memory device group, and a first light source module 4110 may include a first light source 4111 and a second light source 4113. The first light source module 4110 may provide a first electrical-to-optical converting unit 4132 included in the first memory module 4131 with a first light LT11 generated by the first light source 4111 and a second light LT12 generated by the second light source 4113. The first electrical-to-optical converting unit 4132 may convert a first electrical signal output from the first memory group into a first optical signal by using the first light LT11, and may convert a second electrical signal output from the second memory group into a second optical signal by using the second light LT12. Similarly, a second electrical-to-optical converting unit 4134 included in a second memory module 4133 may convert a third electrical signal output from a third memory group into a third optical signal by using a third light LT21 received from a third light source 4116 included in the second light source module 4115, and may convert a fourth electrical signal output from a fourth memory group into a fourth optical signal by using a fourth light LT22 received from a fourth light source 4118 included in the second light source module 4115. A third electrical-to-optical converting unit 4136 included in a third memory module 4135 may convert a fifth electrical signal output from a fifth memory group into a fifth optical signal by using a fifth light LT31 received from a fifth light source 4121 included in the third light source module 4120, and may convert a sixth electrical signal output from a sixth memory group into a sixth optical signal by using a sixth light LT32 received from a sixth light source 4123 included in the third light source module 4120. A fourth electrical-to-optical converting unit 4138 included in a fourth memory module 4137 may convert a seventh electrical signal output from a seventh memory group into a seventh optical signal by using a seventh light LT41 received from a seventh light source 4126 included in the fourth light source module 4125, and may convert an eighth electrical signal output from an eighth memory group into an eighth optical signal by using an eighth light LT42 received from an eighth light source 4128 included in the fourth light source module 4125. As described above, the optical memory system 4100 may include one light source module including a plurality of light sources per memory module. Accordingly, since each memory module receives a light from a plurality of light sources, a light having a sufficient optical power may be provided to each memory module.

According to example embodiments, each electrical-to-optical converting unit 4132, 4134, 4136 and 4138 may be implemented as an electrical-to-optical converting unit 3300a as shown in FIG. 25A or 25B, or an electrical-to-optical converting unit 3300b as shown in FIG. 26. According to example embodiments, each light source module 4110, 4115, 4120 and 4125 may be located inside a corresponding memory module, may be mounted on a board of a computing system, and may be located outside the board of the computing system. The plurality of light sources in each light source module may be physically grouped together, for example, so that individual optical transmission lines, such as single fibers, connected to light sources of a particular light source module each contact at least one other individual optical transmission line connected to at least one other light source of the particular light source module.

Figure 28:
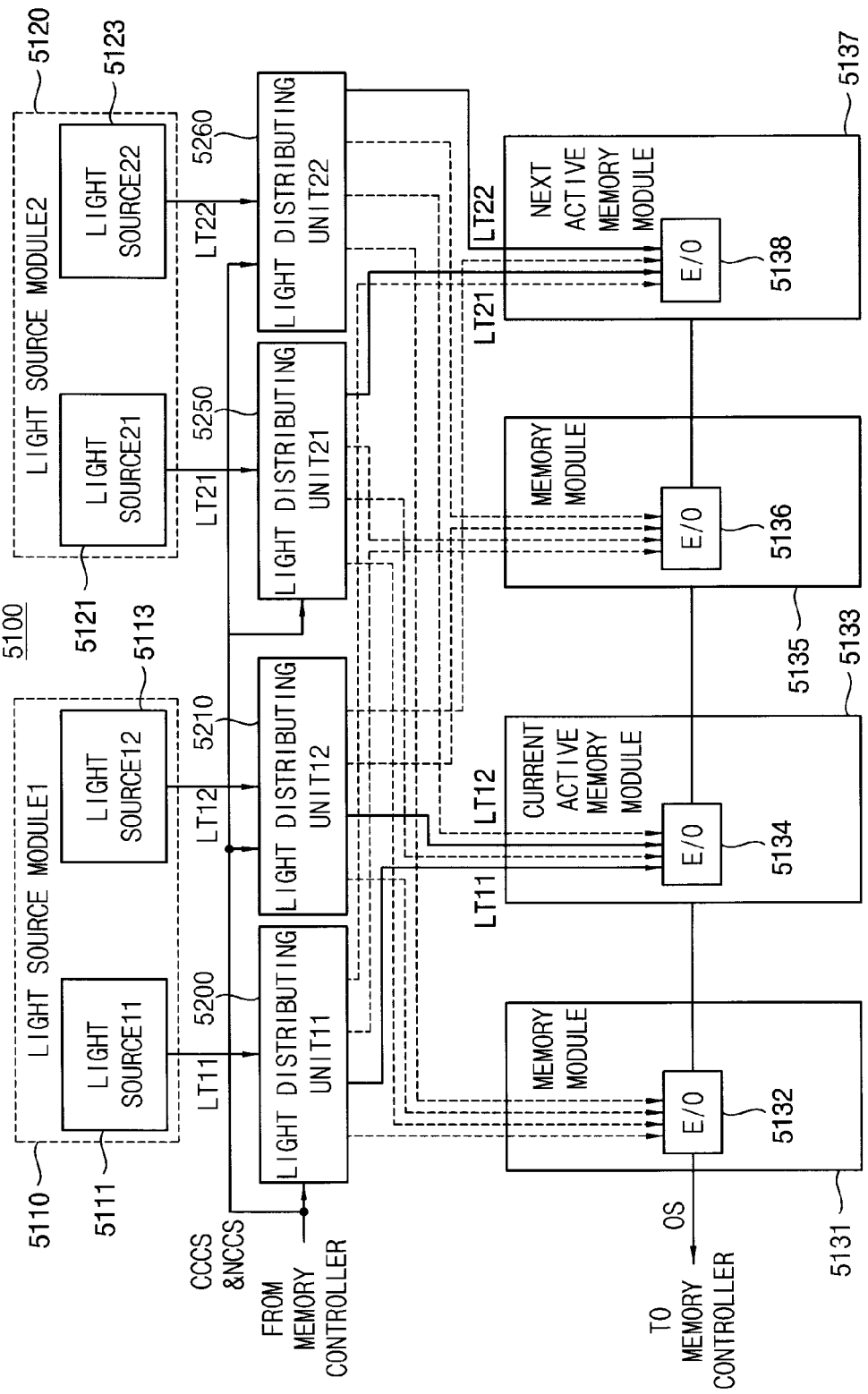
FIG. 28 is a block diagram illustrating an optical memory system according to example embodiments.

FIG. 28 is a block diagram illustrating an optical memory system according to example embodiments.

Referring to FIG. 28, an optical memory system 5100 may include a first light source module 5110, a second light source module 5120, a plurality of memory modules 5131, 5133, 5135 and 5137, a plurality of first light distributing units 5200 and 5210 and a plurality of second light distributing units 5250 and 5260.

The first light source module 5110 may include a plurality of first light sources 5111 and 5113 generating a plurality of first lights LT11 and LT12, and the second light source module 5120 may include a plurality of second light sources 5121 and 5123 generating a plurality of second lights LT21 and LT22. In some example embodiments, each light source module 5110 and 5120 may include as many light sources as memory device groups included in one memory module. The plurality of first light distributing units 5200 and 5210 may be coupled between the first light source module 5110 and the plurality of memory modules 5131, 5133, 5135 and 5137, and may distribute the plurality of first lights LT11 and LT12 generated by the first light source module 5110 to the plurality of memory modules 5131, 5133, 5135 and 5137. The plurality of second light distributing units 5250 and 5260 may be coupled between the second light source module 5120 and the plurality of memory modules 5131, 5133, 5135 and 5137, and may distribute the plurality of second lights LT21 and LT22 generated by the second light source module 5120 to the plurality of memory modules 5131, 5133, 5135 and 5137. According to example embodiments, each light distributing unit 5200, 5210, 5250 and 5260 may be implemented as a light distributing unit 200d illustrated in FIG. 5, a light distributing unit 200e illustrated in FIG. 6 or a light distributing unit 200e illustrated in FIG. 7 that provides a light only to a selected one of the plurality of memory modules 5131, 5133, 5135 and 5137.

In response to a control signal from a memory controller, the plurality of first light distributing units 5200 and 5210 and the plurality of second light distributing units 5250 and 5260 may provide the plurality of first lights LT11 and LT12 or the plurality of second lights LT21 and LT22 to a current active memory module among the plurality of memory modules 5131, 5133, 5135 and 5137, and may provide the plurality of first lights LT11 and LT12 or the plurality of second lights LT21 and LT22 to a next active memory module among the plurality of memory modules 5131, 5133, 5135 and 5137. That is, the plurality of first lights LT11 and LT12 and the plurality of second lights LT21 and LT22 may be provided to the current active memory module and the next active memory module. Accordingly, even if a switching speed of a light distributing unit is slower than a selection speed of a memory module (or even if a switching latency of a light distributing unit is longer than a selection latency of a memory module), a plurality of lights may be provided to the active memory module in time.

For example, if a second memory module 5133 is currently in an active state (or the second memory module 5133 currently performs a read operation), and a fourth memory module 5137 will be in an active state next time (or the fourth memory module 5137 will perform the read operation next time), the plurality of first light distributing units 5200 and 5210 and the plurality of second light distributing units 5250 and 5260 may receive a current chip select signal CCCS indicating that the second memory module 5133 is in an active state and a next chip select signal NCCS indicating that the fourth memory module 5137 will be in an active state next time from the memory controller. The plurality of first light distributing units 5200 and 5210 may provide the plurality of first lights LT11 and LT12 to the second memory module 5133 in response to the current chip select signal CCCS indicating the second memory module 5133. The second memory module 5133 may convert electrical signal output from a plurality of memory device groups into optical signals by respectively using the plurality of first lights LT11 and LT12. The plurality of second light distributing units 5250 and 5260 may start in advance to provide the plurality of second lights LT21 and LT22 to the fourth memory module 5137 in response to the next chip select signal NCCS indicating the fourth memory module 5137.

After the read operation of the second memory module 5133 is completed, if the fourth memory module 5137 is currently in an active state, and a first memory module 5131 will be in active state next time, the plurality of first light distributing units 5200 and 5210 and the plurality of second light distributing units 5250 and 5260 may receive the current chip select signal CCCS indicating that the fourth memory module 5137 is in an active state and the next chip select signal NCCS indicating that the first memory module 5131 will be in an active state next time from the memory controller. The plurality of second light distributing units 5250 and 5260 may continue to provide the plurality of second lights LT21 and LT22 to the fourth memory module 5137 in response to the current chip select signal CCCS indicating the fourth memory module 5137, and the plurality of first light distributing units 5200 and 5210 may start to provide the plurality of first lights LT11 and LT12 to the first memory module 5131 in response to the next chip select signal NCCS indicating the first memory module 5131.

Each memory module 5131, 5133, 5135 and 5137 may include a plurality of memory device groups, may convert electrical signals output from the plurality of memory device groups into optical signals OS by using either the plurality of first lights LT11 and LT12 or the plurality of second lights LT21 and LT22, and may output the optical signals OS to the memory controller. Each memory module 5131, 5133, 5135 and 5137 may include an electrical-to-optical converting unit 5132, 5134, 5136 and 5138. Each electrical-to-optical converting unit 5132, 5134, 5136 and 5138 may receive either the plurality of first lights LT11 and LT12 or the plurality of second lights LT21 and LT22, and may generate the optical signals OS by modulating the received lights in response to the electrical signals output from the plurality of memory device groups. The optical signals OS output from each electrical-to-optical converting unit 5132, 5134, 5136 and 5138 may be provided to the memory controller through an optical transmission line.

As described above, in the optical memory system 5100 according to example embodiments, the plurality of first lights LT11 and LT12 and the plurality of second lights LT21 and LT22 may be provided to the current active memory module and the next active memory module. Accordingly, even if the switching speed of the light distributing unit is slow, the light may be provided to the active memory module in time.

Although FIG. 28 illustrates an example where each light source module 5110 and 5120 include two light sources, in some example embodiments, each memory module 5132, 5134, 5136 and 5138 may include three or more memory device groups, and each light source module 5110 and 5120 may include three or more light sources.

Figure 29:
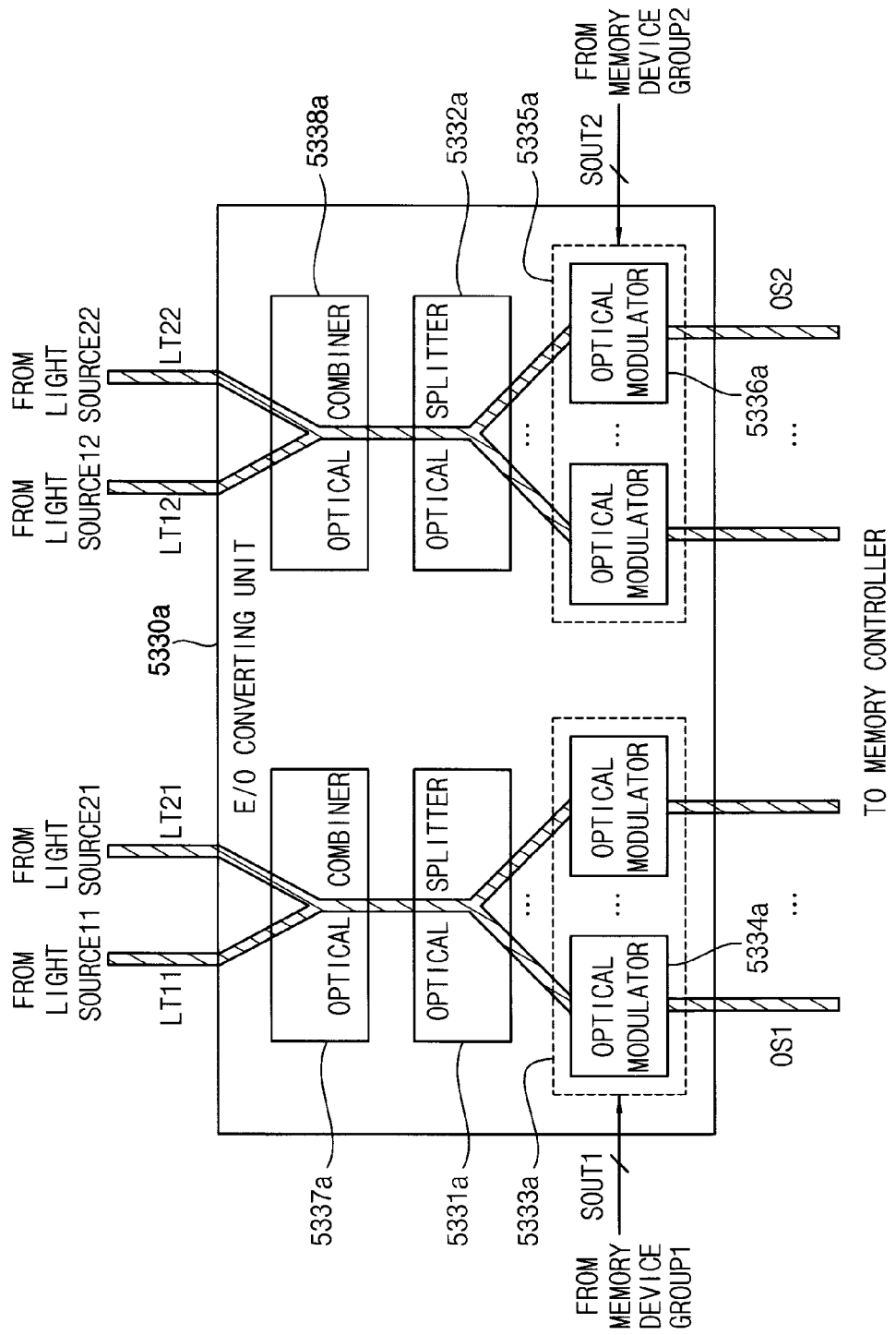
FIG. 29 is a block diagram illustrating an example of an electrical-to-optical converting unit included in a memory module according to example embodiments.

FIG. 29 is a block diagram illustrating an example of an electrical-to-optical converting unit included in a memory module according to example embodiments.

Referring to FIGS. 28 and 29, an electrical-to-optical converting unit 5330a includes a first optical combiner 5337a, a first optical splitter 5331a, a first optical modulating unit 5333a, a second optical combiner 5338a, a second optical splitter 5332a, and a second optical modulating unit 5335a. In some example embodiments, an electrical-to-optical converting unit 5132, 5134, 5136 and 5138 included in each memory module 5131, 5133, 5135 and 5137 illustrated in FIG. 28 may be implemented as the electrical-to-optical converting unit 5330a of FIG. 29.

The first optical combiner 5337a may receive a first light LT11 generated by a first light source 5111 included in a first light source module 5110 via a first light distributing unit 5200, and may receive a third light LT21 generate by a third light source 5121 included in a second light source module 5120 via a third light distributing unit 5250. The first optical combiner 5337a may generate a first combined light by combining the first light LT11 and the third light LT21, and may provide the first combined light to the first optical splitter 5331a. Accordingly, since the first optical combiner 5337a provides the first optical splitter 5331a with the combined light where the first light LT11 and the third light LT21 are combined, the combined light provided to the first optical splitter 5331a may have a desired optical power although only one of the first light LT11 and the third light LT21 is provided to the first optical combiner 5337a.

The first optical splitter 5331a may split the first combined light received from the first optical combiner 5337a into a plurality of third lights, and may provide the plurality of third lights to a plurality of first optical modulators 5334a included in the first optical modulating unit 5333a, respectively. The plurality of first optical modulators 5334a may receive first electrical signals SOUT1 from a first memory device group, and may generate a plurality of first optical signals OS1 by modulating the plurality of third lights based on the first electrical signals SOUT1. The plurality of first optical modulators 5334a may provide the plurality of first optical signals OS1 to a memory controller.

The second optical combiner 5338a may receive a second light LT12 generate by a second light source 5113 included in the first light source module 5110 via a second light distributing unit 5210, and may receive a fourth light LT22 generate by a fourth light source 5123 included in the second light source module 5120 via a fourth light distributing unit 5260. The second optical combiner 5338a may generate a second combined light by combining the second light LT12 and the fourth light LT22, and may provide the second combined light to the second optical splitter 5332a. Accordingly, since the second optical combiner 5338a provides the second optical splitter 5332a with the combined light where the second light LT12 and the fourth light LT22 are combined, the combined light provided to the second optical splitter 5332a may have a desired optical power although only one of the second light LT12 and the fourth light LT22 is provided to the second optical combiner 5338a.

The first optical splitter 5332a may split the second combined light received from the second optical combiner 5338a into a plurality of fourth lights, and may provide the plurality of fourth lights to a plurality of second optical modulators 5336a included in the second optical modulating unit 5335a, respectively. The plurality of second optical modulators 5336a may receive second electrical signals SOUT2 from a second memory device group, and may generate a plurality of second optical signals OS2 by modulating the plurality of fourth lights based on the second electrical signals SOUT2. The plurality of second optical modulators 5336a may provide the plurality of second optical signals OS2 to the memory controller.

As described above, the electrical-to-optical converting unit 5330a may convert the first and second electrical signals SOUT1 and SOUT2 output from the first and second memory device groups into the first and second optical signals OS1 and SO2 by using the first and second lights LT11 and LT12 generated by the first light source module 5110, respectively, or may convert the first and second electrical signals SOUT1 and SOUT2 output from the first and second memory device groups into the first and second optical signals OS1 and SO2 by using the third and fourth lights LT21 and LT22 generated by the second light source module 5120, respectively.

Figure 30:
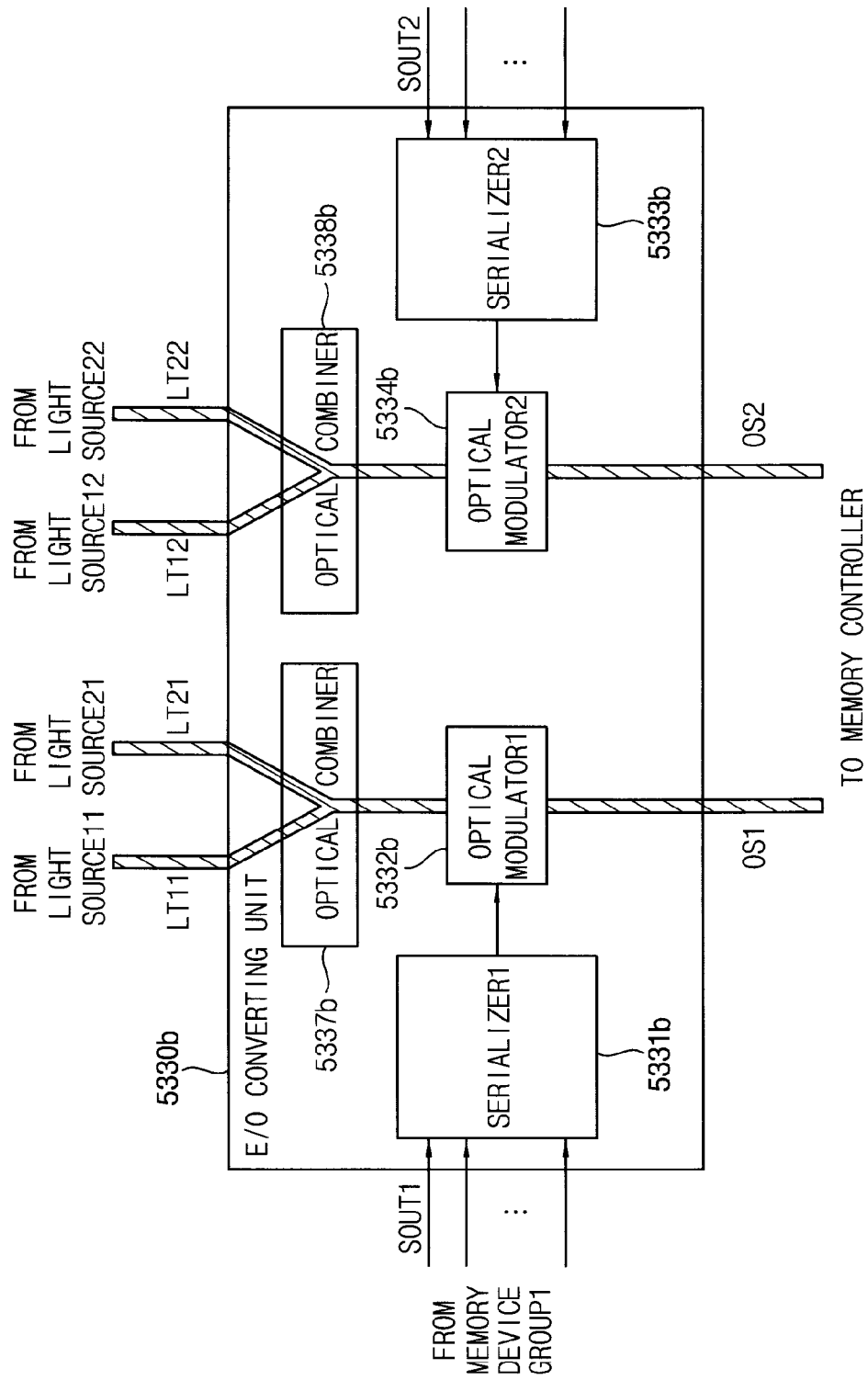
FIG. 30 is a block diagram illustrating another example of an electrical-to-optical converting unit included in a memory module according to example embodiments.

FIG. 30 is a block diagram illustrating another example of an electrical-to-optical converting unit included in a memory module according to example embodiments.

Referring to FIGS. 28 and 30, an electrical-to-optical converting unit 5330b includes a first optical combiner 5337b, a first serializer 5331b, a first optical modulator 5332b, a second optical combiner 5338b, a second serializer 5333b, and a second optical modulator 5334b. In some example embodiments, an electrical-to-optical converting unit 5132, 5134, 5136 and 5138 included in each memory module 5131, 5133, 5135 and 5137 illustrated in FIG. 28 may be implemented as the electrical-to-optical converting unit 5330b of FIG. 30.

The first optical combiner 5337b may receive a first light LT11 generate by a first light source 5111 included in a first light source module 5110 via a first light distributing unit 5200, and may receive a third light LT21 generate by a third light source 5121 included in a second light source module 5120 via a third light distributing unit 5250. The first optical combiner 5337b may generate a first combined light by combining the first light LT11 and the third light LT21, and may provide the first combined light to the first optical modulator 5332b. Accordingly, since the first optical combiner 5337b provides the first optical modulator 5332b with the combined light where the first light LT11 and the third light LT21 are combined, the combined light provided to the first optical modulator 5332b may have a desired optical power although only one of the first light LT11 and the third light LT21 is provided to the first optical combiner 5337b.

The first serializer 5331b may generate a first serial signal by serializing first electrical signals SOUT1 output from a first memory device group, and may provide the first serial signal to the first optical modulator 5332b. The first optical modulator 5332b may receive the first serial signal from the first serializer 5331b, and may receive the first combined light from the first optical combiner 5337b. The first optical modulator 5332b may generate a first optical signal OS1 by modulating the first combined light based on the first serial signal, and may provide the first optical signal OS1 to a memory controller.

The second optical combiner 5338b may receive a second light LT12 generate by a second light source 5113 included in the first light source module 5110 via a second light distributing unit 5210, and may receive a fourth light LT22 generate by a fourth light source 5123 included in the second light source module 5120 via a fourth light distributing unit 5260. The second optical combiner 5338b may generate a second combined light by combining the second light LT12 and the fourth light LT22, and may provide the second combined light to the second optical modulator 5334b. Accordingly, since the second optical combiner 5338b provides the second optical modulator 5334b with the combined light where the second light LT12 and the fourth light LT22 are combined, the combined light provided to the second optical modulator 5334b may have a desired optical power although only one of the second light LT12 and the fourth light LT22 is provided to the second optical combiner 5338b.

The first serializer 5333b may generate a second serial signal by serializing second electrical signals SOUT2 output from a second memory device group, and may provide the second serial signal to the second optical modulator 5334b. The second optical modulator 5334b may receive the second serial signal from the second serializer 5333b, and may receive the second combined light from the second optical combiner 5338b. The second optical modulator 5334b may generate a second optical signal OS2 by modulating the second combined light based on the second serial signal, and may provide the second optical signal OS2 to the memory controller.

As described above, the electrical-to-optical converting unit 5330b may convert the first and second electrical signals SOUT1 and SOUT2 output from the first and second memory device groups into the first and second optical signals OS1 and SO2 by using the first and second lights LT11 and LT12 generated by the first light source module 5110, respectively, or may convert the first and second electrical signals SOUT1 and SOUT2 output from the first and second memory device groups into the first and second optical signals OS1 and SO2 by using the third and fourth lights LT21 and LT22 generated by the second light source module 5120, respectively.

Figure 31:
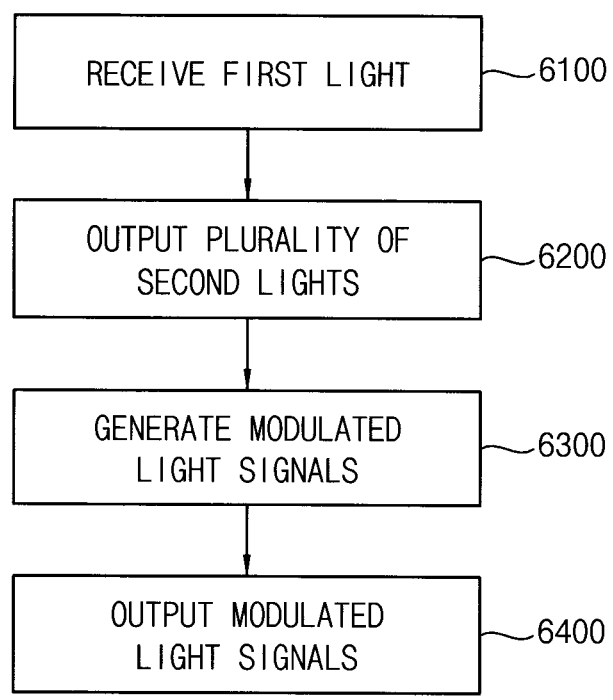
FIG. 31 depicts a method of distributing light between a light source and plurality of memory modules.

FIG. 31 depicts a method 6000 of distributing light between a light source and plurality of memory modules. For example, the light may be distributed using any of the above-described embodiments. The method includes receiving a first light (step 6100). The light may be received, for example, from a single light source having a light emitting diode, laser diode, or the like, and may be received at a light distributing unit via an optical transmission medium such as an optical fiber for transmitting light. The method further includes outputting a plurality of second lights, each derived from the first light (step 6200). For example, the plurality of second lights may be output from a light distributing unit such as a splitter, switch, or wavelength division demultiplexer that receives the first light and outputs the plurality of second lights. The method additionally includes generating a plurality of optical signals, such as modulated light signals, using the plurality of second lights and the plurality of electrical data signals (step 6300), and outputting the plurality of modulated light signals from the plurality of memory modules (step 6400). The modulated light signals may be generated based on the first light and the plurality of electrical data signals, for example, using an optical modulator.

The first light may be a light having a constant amplitude and frequency. The plurality of second lights may be input to a plurality of memory modules. The plurality of modulated light signals may represent read data. The method may additionally include transmitting the plurality of modulated light signals over a plurality of output transmission lines to a controller.

The disclosed embodiments may be applied to any optically-connected memory module and any computing system including the optically-connected memory module. For example, the disclosed embodiments may be applied to various computing systems, such as a personal computer (PC), a server computer, a workstation, a tablet computer, a laptop computer, a mobile phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An optical memory system, comprising:
    a plurality of memory modules, each memory module including a plurality of memory devices;
    a first light source;
    a first light distribution unit connected to the first light source through a first optical transmission line;
    a plurality of second optical transmission lines connected between the first light distribution unit and the plurality of memory modules;
    a second light source;
    a second light distribution unit connected to the second light source through a third optical transmission line;
    a plurality of fourth optical transmission lines connected between the second light distribution unit and the plurality of memory modules;
    a plurality of electrical to optical converters, each connected to at least one of the second optical transmission lines and at least one of the fourth optical transmission lines; and
    a plurality of output optical transmission lines connected to the plurality of electrical to optical converters, each output optical transmission line for outputting an electrical to optical converted signal.

2. The optical memory system of claim 1, wherein:
    each of the first light source and the second light source is configured to output an unmodulated light signal.

3. The optical memory system of claim 1, wherein:
    each converter of the plurality of electrical to optical converters is configured to receive an unmodulated light signal and output a modulated light signal.

4. The optical memory system of claim 1, wherein:
    the first light distribution unit is directly connected to the light source through the first optical transmission line.

5. The optical memory system of claim 1, wherein:
    the first light distribution unit is connected to the first light source through at least one additional light distribution unit.

6. The optical memory system of claim 1, wherein the first light source and second light source that are part of a light source module, and
   wherein at least a first electrical to optical converter includes at least two optical modulators configured to receive light from the first light source and at least two other optical modulators configured to receive light from the second light source.

7. The optical memory system of claim 1, wherein:
the first light distribution unit includes one or more optical splitters.

8. The optical memory system of claim 7, wherein:
the first light distribution unit includes an optical amplifier.

9. The optical memory system of claim 1, wherein:
the first light distribution unit includes one or more optical switches.

10. The optical memory system of claim 9, wherein:
each of the one or more optical switches is configured to receive a control signal from a controller to select a memory module of the plurality of memory modules.

11. The optical memory system of claim 1, wherein:
the first light distribution unit includes a wave division multiplexing demultiplexer.

12. The optical memory system of claim 11, wherein:
the first light source is a tunable light source.

13. The optical memory system of claim 1, wherein:
the first light distribution unit is an active light distribution unit that is configured to change its configuration in order to transmit light received from the first optical transmission line to the plurality of second optical transmission lines.

14. The optical memory system of claim 1, wherein:
the first light distribution unit is a passive light distribution unit that is configured to transmit light received from the first optical transmission line to the plurality of second optical transmission lines without changing its configuration.

15. The optical memory system of claim 1, wherein:
the first light source is a single light source connected to a single fiber that comprises the first optical transmission line.

16. The optical memory system of claim 15, wherein:
the first light source is a laser diode, a light emitting diode, or an amplified spontaneous emission of an optical amplifier.

17. The optical memory system of claim 1, wherein:
the plurality of memory modules include 1st through nth memory modules; and
the plurality of second optical transmission lines include 1st through nth second optical transmission lines,
wherein each of the 1st through nth memory modules is connected to a respective one of the 1st through nth second optical transmission lines.

18. The optical memory system of claim 1, wherein:
the plurality of memory modules include 1st through nth memory modules;
each electrical to optical converter is disposed on a respective one of the 1st through nth memory modules; and
each electrical to optical converter is configured to receive electrical signals from one or more memory devices, convert the electrical signals to optical signals using light from the first or second light source, and output the optical signals.

19. The optical memory system of claim 18, wherein:
each electrical to optical converter includes one or more optical modulators configured to convert the electrical signals to the optical signals.

20. The optical memory system of claim 1, further comprising:
a memory controller connected to the plurality of memory modules through the plurality of output optical transmission lines.

21. An optical memory system comprising:
a plurality of memory modules, each memory module including a plurality of memory devices;
a light source;
a light distribution unit connected to the light source through a first optical transmission line;
a plurality of second optical transmission lines connected between the light distribution unit and the plurality of memory module;
a plurality of electrical to optical converters, each connected to at least one of the second optical transmission lines;
a plurality of output optical transmission lines connected to the plurality of electrical to optical converters, each output optical transmission line for outputting an electrical to optical converted signal; and
a memory controller connected to the plurality of memory modules through the plurality of output optical transmission lines, wherein:
the plurality of memory modules comprise a first group of memory modules;
the light source comprises a first light source; and
the light distribution unit comprises a first light distribution unit; and further comprising:
a second group of memory modules comprising a plurality of memory modules, each memory module including a plurality of memory devices;
a second light distribution unit,
wherein the second group of memory modules is connected to the controller through a plurality of output transmission lines; and
a second light source connected to the second light distribution unit through an optical transmission line.

22. The optical memory system of claim 20, wherein:
the controller is configured to transmit read commands to the plurality of memory modules; and
the plurality of memory modules are configured to transmit data through the plurality of output transmission lines to the controller.

23. The optical memory system of claim 1, wherein:
the first optical transmission line is configured to pass a first light through it; and
each of the second optical transmission lines is configured to pass a second light through the respective second optical transmission line, wherein the second light is derived from the first light.

24. The optical memory system of claim 1, wherein:
the first optical transmission line is one of an optical fiber or an optical waveguide.

25. An optical memory system, comprising:
a plurality of memory modules, each memory module including a first memory device group and a second memory device group, each of the first memory device group and the second memory device group including at least one memory device;
at least two light sources including a first light source and a second light source;
at least two light distribution units including a first light distribution unit and a second light distribution unit, the first light distribution unit connected to the first light source through a first optical transmission line, and the second light distribution unit connected to the second light source through a second optical transmission line;
a plurality of third optical transmission lines, each line connected between the first light distribution unit and the first memory device group included in one of the memory modules;
a plurality of fourth optical transmission lines, each line connected between the second light distribution unit and the second memory device group included in one of the memory modules; and
a plurality of electrical to optical converters, each connected to at least one of the plurality of third optical transmission lines and at least one of the plurality of fourth optical transmission lines.

26. The optical memory system of claim 25, wherein:
the plurality of memory modules include 1st through nth memory modules;
each electrical to optical converter is disposed on a respective one of the 1st through nth memory modules; and
each electrical to optical converter is configured to receive first electrical signals from the first memory device group, receive second electrical signals from the second memory device group, convert the first electrical signals to first optical signals using first light from the first light source, convert the second electrical signals to second optical signals using second light from the second light source, and output the first optical signals and second optical signals.

27. The optical memory system of claim 26, wherein:
each electrical to optical converter includes one or more first optical modulators configured to convert the first electrical signals to the first optical signals, and one or more second optical modulators configured to convert the second electrical signals to the second optical signals.

28. An optical memory system, comprising:
a plurality of memory modules, each memory module including a plurality of memory devices;
at least two light sources including a first light source and a second light source;
at least two light distribution units including a first light distribution unit and a second light distribution unit, the first light distribution unit connected to the first light source through a first optical transmission line, and the second light distribution unit connected to the second light source through a second optical transmission line;
a plurality of third optical transmission lines connected between the first light distribution unit and the plurality of memory modules;
a plurality of fourth optical transmission lines connected between the second light distribution unit and the plurality of memory modules;
a plurality of electrical to optical converters, each connected to at least one of the third optical transmission lines and at least one of the fourth optical transmission lines; and
a plurality of output optical transmission lines connected to the plurality of electrical to optical converters, each output optical transmission line for outputting an electrical to optical converted signal,
wherein the first and second light distribution units are configured to receive a control signal indicating a current active memory module and a next active memory module among the plurality of memory modules, one of the first and second light distribution units provides one of first light from the first light source and second light from the second light source to the current active memory module in response to the control signal, and the other one of the first and second light distribution units provides the other one of the first light from the first light source and the second light from the second light source to the next active memory module in response to the control signal.

29. The optical memory system of claim 28, wherein:
each electrical to optical converter includes an optical combiner connected to the at least one of the third optical transmission lines and the at least one of the fourth optical transmission lines.

30. An optical memory system, comprising:
a first light distribution unit, comprising:
 a first input terminal for receiving a first continuous light signal; and
 a plurality of first output terminals, each for outputting a second continuous light signal;
a second light distribution unit, comprising:
 a second input terminal for receiving a third continuous light signal from a different source than the first continuous light signal; and
 a plurality of second output terminals, each for outputting a fourth continuous light signal;
wherein the second continuous light signal for each of the first output terminals is derived from the first continuous light signal, and the fourth continuous light signal for each of the second output terminals is derived from the third continuous light signal, and
wherein each of the first output terminals is connected to one of a plurality of memory modules, and each of the second output terminals is connected to one of the plurality of memory modules, such that each of the memory modules is connected to receive the second continuous light signal from one of the first output terminals and to receive the fourth continuous light signal from one of the second output terminals.

31. The optical memory system of claim 30, further comprising:
at least a first electrical to optical converter included in each memory module; and
an optical transmission medium connected between each of the first output terminals and each of the plurality of memory modules.

32. The optical memory system of claim 31, wherein:
each first electrical to optical converter is configured to receive one of the second continuous light signals, modulate the second continuous light signal to form a first modulated light signal, and output the first modulated light signal, and is configured to receive one of the fourth continuous light signals, modulate the fourth continuous light signal to form a second modulated light signal, and output the second modulated light signal.

33. The optical memory system of claim 32, wherein the first continuous light signal, second continuous light signals, third continuous light signal, and fourth continuous light signals do not represent data, and the modulated light signals represent data.

* * * * *